United States Patent
Or-Bach et al.

(10) Patent No.: US 11,043,523 B1
(45) Date of Patent: Jun. 22, 2021

(54) MULTILEVEL SEMICONDUCTOR DEVICE AND STRUCTURE WITH IMAGE SENSORS

(71) Applicant: Monolithic 3D Inc., Klamath Falls, OR (US)

(72) Inventors: Zvi Or-Bach, Haifa (IL); Deepak C. Sekar, Sunnyvale, CA (US); Brian Cronquist, Klamath Falls, OR (US)

(73) Assignee: Monolithic 3D Inc., Klamath Falls, OR (US)

( * ) Notice: Subject to any disclaimer, the term of this patent is extended or adjusted under 35 U.S.C. 154(b) by 0 days.

(21) Appl. No.: 17/143,956

(22) Filed: Jan. 7, 2021

Related U.S. Application Data

(63) Continuation-in-part of application No. 17/121,726, filed on Dec. 14, 2020, now Pat. No. 10,978,501, (Continued)

(51) Int. Cl.
*H01L 27/146* (2006.01)
*H01L 27/148* (2006.01)
(Continued)

(52) U.S. Cl.
CPC ...... *H01L 27/14634* (2013.01); *H01L 23/544* (2013.01); *H01L 27/1469* (2013.01); (Continued)

(58) Field of Classification Search
CPC ....... H01L 23/544; H01L 24/26; H01L 24/31; H01L 24/32; H01L 24/33; H01L 25/043; (Continued)

(56) References Cited

U.S. PATENT DOCUMENTS 3,007,090 A 10/1961 Rutz
3,819,959 A 6/1974 Chang et al.
(Continued)

FOREIGN PATENT DOCUMENTS

EP 1267594 A2 12/2002
WO PCT/US2008/063483 5/2008

OTHER PUBLICATIONS

Topol, A.W., et al., "Enabling SOI-Based Assembly Technology for Three-Dimensional (3D) Integrated Circuits (ICs)," IEDM Tech. Digest, Dec. 5, 2005, pp. 363-366.
(Continued)

*Primary Examiner* — Cheung Lee
(74) *Attorney, Agent, or Firm* — Patent Law Office; Bao Tran

(57) ABSTRACT

An integrated device, the device including: a first level including a first mono-crystal layer, the first mono-crystal layer including a plurality of single crystal transistors and alignment marks; an overlaying oxide on top of the first level; a second level including a second mono-crystal layer, the second level overlaying the oxide, where the second mono-crystal layer includes a plurality of first image sensors; and a third level overlaying the second level, where the third level includes a plurality of second image sensors, where the second level is aligned to the alignment marks, where the second level is bonded to the first level, and where the bonded includes an oxide to oxide bond.

20 Claims, 54 Drawing Sheets

Related U.S. Application Data which is a continuation-in-part of application No. 17/027,217, filed on Sep. 21, 2020, now Pat. No. 10,943,934, which is a continuation-in-part of application No. 16/860,027, filed on Apr. 27, 2020, now Pat. No. 10,833,108, which is a continuation-in-part of application No. 15/920,499, filed on Mar. 14, 2018, now Pat. No. 10,679,977, which is a continuation-in-part of application No. 14/936,657, filed on Nov. 9, 2015, now Pat. No. 9,941,319, which is a continuation-in-part of application No. 13/274,161, filed on Oct. 14, 2011, now Pat. No. 9,197,804, which is a continuation-in-part of application No. 12/904,103, filed on Oct. 13, 2010, now Pat. No. 8,163,581.

(51) Int. Cl.
  *H01L 23/544* (2006.01)
  *H01L 21/762* (2006.01)

(52) U.S. Cl.
  CPC .. *H01L 27/14647* (2013.01); *H01L 27/14843* (2013.01); *H01L 21/76254* (2013.01); *H01L 27/14636* (2013.01); *H01L 2223/54426* (2013.01)

(58) Field of Classification Search
  CPC ............... H01L 25/0657; H01L 27/146; H01L 27/14601; H01L 27/14603; H01L 27/14605; H01L 27/14634; H01L 27/14636; H01L 27/1464; H01L 27/14643; H01L 27/14647; H01L 27/14683; H01L 27/1469; H01L 27/30; H01L 27/307; H01L 27/32; H01L 27/322; H01L 31/0232; H01L 31/0248; H01L 31/0352; H01L 31/18; H01L 2223/54426
  See application file for complete search history.

(56) References Cited

U.S. PATENT DOCUMENTS

| | | |
|---|---|---|
| 4,009,483 A | 2/1977 | Clark |
| 4,197,555 A | 4/1980 | Uehara et al. |
| 4,213,139 A | 7/1980 | Rao et al. |
| 4,400,715 A | 8/1983 | Barbee et al. |
| 4,487,635 A | 12/1984 | Kugimiya et al. |
| 4,510,670 A | 4/1985 | Schwabe |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,189,500 A | 2/1993 | Kusunoki |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,586,291 A | 12/1996 | Lasker |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,659,194 A | 8/1997 | Iwamatsu |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetfing |
| 5,748,161 A | 5/1998 | Lebby et al. |
| 5,757,026 A | 5/1998 | Forrest et al. |
| 5,770,483 A | 6/1998 | Kadosh |
| 5,770,881 A | 6/1998 | Pelella et al. |
| 5,781,031 A | 7/1998 | Bertin et al. |
| 5,817,574 A | 10/1998 | Gardner |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,034 A | 3/1999 | Ramm |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,920,788 A | 7/1999 | Reinberg |
| 5,937,312 A | 8/1999 | Iyer et al. |
| 5,943,574 A | 8/1999 | Tehrani et al. |
| 5,952,680 A | 9/1999 | Strife |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,994,746 A | 11/1999 | Reisinger |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |

(56) References Cited

U.S. PATENT DOCUMENTS

| | | |
|---|---|---|
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,200,878 B1 | 3/2001 | Yamagata |
| 6,222,203 B1 | 4/2001 | Ishibashi et al. |
| 6,226,197 B1 | 5/2001 | Nishimura |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,252,465 B1 | 6/2001 | Katoh |
| 6,259,623 B1 | 7/2001 | Takahashi |
| 6,261,935 B1 | 7/2001 | See et al. |
| 6,264,805 B1 | 7/2001 | Forrest et al. |
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,331,943 B1 | 12/2001 | Naji et al. |
| 6,353,492 B2 | 3/2002 | McClelland et al. |
| 6,355,501 B1 | 3/2002 | Fung et al. |
| 6,355,976 B1 | 3/2002 | Faris |
| 6,358,631 B1 | 3/2002 | Forrest et al. |
| 6,365,270 B2 | 4/2002 | Forrest et al. |
| 6,376,337 B1 | 4/2002 | Wang et al. |
| 6,377,504 B1 | 4/2002 | Hilbert |
| 6,380,046 B1 | 4/2002 | Yamazaki |
| 6,392,253 B1 | 5/2002 | Saxena |
| 6,404,043 B1 | 6/2002 | Iseak |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,448,615 B1 | 9/2002 | Forbes |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,483,707 B1 | 11/2002 | Freuler et al. |
| 6,507,115 B1 | 1/2003 | Hofstee |
| 6,515,334 B2 | 2/2003 | Yamazaki et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,124 B1 | 6/2003 | Cleeves |
| 6,580,289 B2 | 6/2003 | Cox |
| 6,600,173 B2 | 7/2003 | Tiwari |
| 6,617,694 B2 | 9/2003 | Kodaira et al. |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,627,985 B2 | 9/2003 | Huppenthal et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,653,712 B2 | 11/2003 | Knall et al. |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,689,660 B1 | 2/2004 | Noble |
| 6,701,071 B2 | 3/2004 | Wada et al. |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,112,815 B2 | 9/2006 | Prall |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,183,611 B2 | 2/2007 | Bhattacharyya |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,274,207 B2 | 9/2007 | Sugawara et al. |
| 7,282,951 B2 | 10/2007 | Huppenthal et al. |
| 7,284,226 B1 | 10/2007 | Kondapalli |
| 7,296,201 B2 | 11/2007 | Abramovici |

(56) References Cited

U.S. PATENT DOCUMENTS

| | | |
|---|---|---|
| 7,304,355 B2 | 12/2007 | Zhang |
| 7,312,109 B2 | 12/2007 | Madurawe |
| 7,312,487 B2 | 12/2007 | Alam et al. |
| 7,314,788 B2 | 1/2008 | Shaw |
| 7,335,573 B2 | 2/2008 | Takayama et al. |
| 7,337,425 B2 | 2/2008 | Kirk |
| 7,338,884 B2 | 3/2008 | Shimoto et al. |
| 7,342,415 B2 | 3/2008 | Teig et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,381,989 B2 | 6/2008 | Kim |
| 7,385,283 B2 | 6/2008 | Wu |
| 7,393,722 B1 | 7/2008 | Issaq et al. |
| 7,402,483 B2 | 7/2008 | Yu E et al. |
| 7,402,897 B2 | 7/2008 | Leedy |
| 7,419,844 B2 | 9/2008 | Lee et al. |
| 7,432,185 B2 | 10/2008 | Kim |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,463,502 B2 | 12/2008 | Stipe |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,521,806 B2 | 4/2009 | Trezza |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,553,745 B2 | 6/2009 | Lim |
| 7,557,367 B2 | 7/2009 | Rogers et al. |
| 7,558,141 B2 | 7/2009 | Katsumata et al. |
| 7,563,659 B2 | 7/2009 | Kwon et al. |
| 7,566,855 B2 | 7/2009 | Olsen et al. |
| 7,566,974 B2 | 7/2009 | Konevecki |
| 7,586,778 B2 | 9/2009 | Ho et al. |
| 7,589,375 B2 | 9/2009 | Jang et al. |
| 7,608,848 B2 | 10/2009 | Ho et al. |
| 7,612,411 B2 | 11/2009 | Walker |
| 7,615,462 B2 | 11/2009 | Kim et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,670,912 B2 | 3/2010 | Yeo |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,687,872 B2 | 3/2010 | Cazaux |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,719,876 B2 | 5/2010 | Chevallier |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,755,622 B2 | 7/2010 | Yvon |
| 7,759,043 B2 | 7/2010 | Tanabe et al. |
| 7,768,115 B2 | 8/2010 | Lee et al. |
| 7,772,039 B2 | 8/2010 | Kerber |
| 7,772,096 B2 | 8/2010 | DeSouza et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,163 B2 | 9/2010 | Izumi et al. |
| 7,800,199 B2 | 9/2010 | Oh et al. |
| 7,816,721 B2 | 10/2010 | Yamazaki |
| 7,843,718 B2 | 11/2010 | Koh et al. |
| 7,846,814 B2 | 12/2010 | Lee |
| 7,863,095 B2 | 1/2011 | Sasaki et al. |
| 7,864,568 B2 | 1/2011 | Fujisaki et al. |
| 7,867,822 B2 | 1/2011 | Lee |
| 7,888,764 B2 | 2/2011 | Lee |
| 7,910,432 B2 | 3/2011 | Tanaka et al. |
| 7,915,164 B2 | 3/2011 | Konevecki et al. |
| 7,919,845 B2 | 4/2011 | Karp |
| 7,965,102 B1 | 6/2011 | Bauer et al. |
| 7,968,965 B2 | 6/2011 | Kim |
| 7,969,193 B1 | 6/2011 | Wu et al. |
| 7,973,314 B2 | 7/2011 | Yang |
| 7,982,250 B2 | 7/2011 | Yamazaki et al. |
| 7,983,065 B2 | 7/2011 | Samachisa |
| 8,008,732 B2 | 8/2011 | Kiyotoshi |
| 8,013,399 B2 | 9/2011 | Thomas et al. |
| 8,014,166 B2 | 9/2011 | Yazdani |
| 8,014,195 B2 | 9/2011 | Okhonin et al. |
| 8,022,493 B2 | 9/2011 | Bang |
| 8,030,780 B2 | 10/2011 | Kirby et al. |
| 8,031,544 B2 | 10/2011 | Kim et al. |
| 8,032,857 B2 | 10/2011 | McIlrath |
| 8,044,448 B2 | 10/2011 | Kamigaichi et al. |
| 8,044,464 B2 | 10/2011 | Yamazaki et al. |
| 8,068,364 B2 | 11/2011 | Maejima |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,129,258 B2 | 3/2012 | Hosier et al. |
| 8,130,547 B2 | 3/2012 | Wdjaja et al. |
| 8,136,071 B2 | 3/2012 | Solomon |
| 8,138,502 B2 | 3/2012 | Nakamura et al. |
| 8,153,520 B1 | 4/2012 | Chandrashekar |
| 8,158,515 B2 | 4/2012 | Farooq et al. |
| 8,178,919 B2 | 5/2012 | Fujiwara et al. |
| 8,183,630 B2 | 5/2012 | Batude et al. |
| 8,184,463 B2 | 5/2012 | Saen et al. |
| 8,185,685 B2 | 5/2012 | Selinger |
| 8,203,187 B2 | 6/2012 | Lung et al. |
| 8,208,279 B2 | 6/2012 | Lue |
| 8,209,649 B2 | 6/2012 | McIlrath |
| 8,228,684 B2 | 7/2012 | Losavio et al. |
| 8,264,065 B2 | 9/2012 | Su et al. |
| 8,266,560 B2 | 9/2012 | McIlrath |
| 8,288,816 B2 | 10/2012 | Komori et al. |
| 8,294,199 B2 | 10/2012 | Yahashi et al. |
| 8,324,680 B2 | 12/2012 | Izumi et al. |
| 8,338,882 B2 | 12/2012 | Tanaka et al. |
| 8,343,851 B2 | 1/2013 | Kim et al. |
| 8,354,308 B2 | 1/2013 | Kang et al. |

(56) References Cited

U.S. PATENT DOCUMENTS

| | | |
|---|---|---|
| 8,355,273 B2 | 1/2013 | Liu |
| 8,374,033 B2 | 2/2013 | Kito et al. |
| 8,426,294 B2 | 4/2013 | Lung et al. |
| 8,432,719 B2 | 4/2013 | Lue |
| 8,432,751 B2 | 4/2013 | Hafez |
| 8,455,941 B2 | 6/2013 | Ishihara et al. |
| 8,470,689 B2 | 6/2013 | Desplobain et al. |
| 8,497,512 B2 | 7/2013 | Nakamura et al. |
| 8,501,564 B2 | 8/2013 | Suzawa |
| 8,507,972 B2 | 8/2013 | Oota et al. |
| 8,508,994 B2 | 8/2013 | Okhonin |
| 8,513,725 B2 | 8/2013 | Sakuma et al. |
| 8,514,623 B2 | 8/2013 | Widjaja et al. |
| 8,516,408 B2 | 8/2013 | Dell |
| 8,525,342 B2 | 10/2013 | Chandrasekaran |
| 8,546,956 B2 | 10/2013 | Nguyen |
| 8,566,762 B2 | 10/2013 | Morimoto et al. |
| 8,603,888 B2 | 12/2013 | Liu |
| 8,611,388 B2 | 12/2013 | Krasulick et al. |
| 8,619,490 B2 | 12/2013 | Yu |
| 8,630,326 B2 | 1/2014 | Krasulick et al. |
| 8,643,162 B2 | 2/2014 | Madurawe |
| 8,650,516 B2 | 2/2014 | McIlrath |
| 8,654,584 B2 | 2/2014 | Kim et al. |
| 8,679,861 B2 | 3/2014 | Bose |
| 8,736,068 B2 | 5/2014 | Bartley et al. |
| 8,773,562 B1 | 7/2014 | Fan |
| 8,775,998 B2 | 7/2014 | Morimoto |
| 8,824,183 B2 | 9/2014 | Samachisa et al. |
| 8,841,777 B2 | 9/2014 | Farooq |
| 8,853,785 B2 | 10/2014 | Augendre |
| 8,896,054 B2 | 11/2014 | Sakuma et al. |
| 8,928,119 B2 | 1/2015 | Leedy |
| 8,971,114 B2 | 3/2015 | Kang |
| 9,105,689 B1 | 8/2015 | Fanelli |
| 9,172,008 B2 | 10/2015 | Hwang |
| 9,227,456 B2 | 1/2016 | Chien |
| 9,230,973 B2 | 1/2016 | Pachamuthu et al. |
| 9,269,608 B2 | 2/2016 | Fanelli |
| 9,334,582 B2 | 5/2016 | See |
| 9,391,090 B2 | 7/2016 | Manorotkul et al. |
| 9,472,568 B2 | 10/2016 | Shin et al. |
| 9,564,450 B2 | 2/2017 | Sakuma et al. |
| 9,570,683 B1 | 2/2017 | Jo |
| 9,589,982 B1 | 3/2017 | Cheng et al. |
| 9,595,530 B1 | 3/2017 | Zhou |
| 9,627,287 B2 | 4/2017 | Engelhardt et al. |
| 9,673,257 B1 | 6/2017 | Takaki |
| 9,997,530 B2 | 6/2018 | Yon et al. |
| 10,199,354 B2 | 2/2019 | Modi et al. |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0140091 A1 | 10/2002 | Callahan |
| 2002/0141233 A1 | 10/2002 | Hosotani et al. |
| 2002/0153243 A1 | 10/2002 | Forrest et al. |
| 2002/0153569 A1 | 10/2002 | Katayama |
| 2002/0175401 A1 | 11/2002 | Huang et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0076706 A1 | 4/2003 | Andoh |
| 2003/0102079 A1 | 6/2003 | Kalvesten et al. |
| 2003/0107117 A1 | 6/2003 | Antonell et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0153163 A1 | 8/2003 | Letertre |
| 2003/0157748 A1 | 8/2003 | Kim et al. |
| 2003/0160888 A1 | 8/2003 | Yoshikawa |
| 2003/0173631 A1 | 9/2003 | Murakami |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0143797 A1 | 7/2004 | Nguyen |
| 2004/0150068 A1 | 8/2004 | Leedy |
| 2004/0150070 A1 | 8/2004 | Okada |
| 2004/0152272 A1 | 8/2004 | Fladre et al. |
| 2004/0155301 A1 | 8/2004 | Zhang |
| 2004/0156172 A1 | 8/2004 | Lin et al. |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0174732 A1 | 9/2004 | Morimoto |
| 2004/0175902 A1 | 9/2004 | Rayssac et al. |
| 2004/0178819 A1 | 9/2004 | New |
| 2004/0195572 A1 | 10/2004 | Kato et al. |
| 2004/0219765 A1 | 11/2004 | Reif et al. |
| 2004/0229444 A1 | 11/2004 | Couillard |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0029643 A1* | 2/2005 | Koyanagi ......... H01L 27/14685 257/680 |
| 2005/0045919 A1 | 3/2005 | Kaeriyama et al. |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 2/2006 | Chang et al. |
| 2006/0049449 A1 | 3/2006 | Iino |
| 2006/0065953 A1 | 3/2006 | Kim et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0108613 A1 | 5/2006 | Song |

(56) References Cited

U.S. PATENT DOCUMENTS

| | | |
|---|---|---|
| 2006/0108627 A1 | 5/2006 | Choi et al. |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0150137 A1 | 7/2006 | Madurawe |
| 2006/0158511 A1 | 7/2006 | Harrold |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0224814 A1 | 10/2006 | Kim et al. |
| 2006/0237777 A1 | 10/2006 | Choi |
| 2006/0249859 A1 | 11/2006 | Eiles et al. |
| 2006/0275962 A1 | 12/2006 | Lee |
| 2007/0004150 A1 | 1/2007 | Huang |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0103191 A1 | 5/2007 | Sugawara et al. |
| 2007/0108523 A1 | 5/2007 | Ogawa et al. |
| 2007/0109831 A1 | 5/2007 | RaghuRam |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0141781 A1 | 6/2007 | Park |
| 2007/0158659 A1 | 7/2007 | Bensce |
| 2007/0158831 A1 | 7/2007 | Cha et al. |
| 2007/0176214 A1 | 8/2007 | Kwon et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0206408 A1 | 9/2007 | Schwerin |
| 2007/0210336 A1 | 9/2007 | Madurawe |
| 2007/0211535 A1 | 9/2007 | Kim |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252201 A1 | 11/2007 | Kito et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2007/0296073 A1 | 12/2007 | Wu |
| 2007/0297232 A1 | 12/2007 | Iwata |
| 2008/0001204 A1 | 1/2008 | Lee |
| 2008/0003818 A1 | 1/2008 | Seidel et al. |
| 2008/0030228 A1 | 2/2008 | Amarilio |
| 2008/0032463 A1 | 2/2008 | Lee |
| 2008/0038902 A1 | 2/2008 | Lee |
| 2008/0048239 A1 | 2/2008 | Huo |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0099819 A1 | 5/2008 | Kito et al. |
| 2008/0108171 A1 | 5/2008 | Rogers et al. |
| 2008/0123418 A1 | 5/2008 | Widjaja |
| 2008/0124845 A1 | 5/2008 | Yu et al. |
| 2008/0128745 A1 | 6/2008 | Mastro et al. |
| 2008/0128780 A1 | 6/2008 | Nishihara |
| 2008/0135949 A1 | 6/2008 | Lo et al. |
| 2008/0136455 A1 | 6/2008 | Diamant et al. |
| 2008/0142937 A1 | 6/2008 | Chen et al. |
| 2008/0142959 A1 | 6/2008 | DeMulder et al. |
| 2008/0143379 A1 | 6/2008 | Norman |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0165521 A1 | 7/2008 | Bernstein et al. |
| 2008/0175032 A1 | 7/2008 | Tanaka et al. |
| 2008/0179678 A1 | 7/2008 | Dyer et al. |
| 2008/0180132 A1 | 7/2008 | Ishikawa |
| 2008/0185648 A1 | 8/2008 | Jeong |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0239818 A1 | 10/2008 | Mokhlesi |
| 2008/0242028 A1 | 10/2008 | Mokhlesi |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0254623 A1 | 10/2008 | Chan |
| 2008/0261378 A1 | 10/2008 | Yao et al. |
| 2008/0266960 A1 | 10/2008 | Kuo |
| 2008/0272492 A1 | 11/2008 | Tsang |
| 2008/0277778 A1 | 11/2008 | Furman et al. |
| 2008/0283873 A1 | 11/2008 | Yang |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315253 A1 | 12/2008 | Yuan |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0026541 A1 | 1/2009 | Chung |
| 2009/0026618 A1 | 1/2009 | Kim |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0065827 A1 | 3/2009 | Hwang |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0078970 A1 | 3/2009 | Yamazaki |
| 2009/0079000 A1 | 3/2009 | Yamazaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0108318 A1 | 4/2009 | Yoon et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0162993 A1 | 6/2009 | Yui et al. |
| 2009/0166627 A1 | 7/2009 | Han |
| 2009/0174018 A1 | 7/2009 | Dungan |
| 2009/0179268 A1 | 7/2009 | Abou-Khalil et al. |
| 2009/0185407 A1 | 7/2009 | Park |
| 2009/0194152 A1 | 8/2009 | Liu et al. |

(56) References Cited

U.S. PATENT DOCUMENTS

| | | |
|---|---|---|
| 2009/0194768 A1 | 8/2009 | Leedy |
| 2009/0194829 A1 | 8/2009 | Chung |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224330 A1 | 9/2009 | Hong |
| 2009/0224364 A1 | 9/2009 | Oh et al. |
| 2009/0230462 A1 | 9/2009 | Tanaka et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262572 A1 | 10/2009 | Krusin-Elbaum |
| 2009/0262583 A1 | 10/2009 | Lue |
| 2009/0263942 A1 | 10/2009 | Ohnuma et al. |
| 2009/0267233 A1 | 10/2009 | Lee |
| 2009/0268983 A1 | 10/2009 | Stone et al. |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294836 A1 | 12/2009 | Kiyotoshi |
| 2009/0294861 A1 | 12/2009 | Thomas et al. |
| 2009/0294990 A1 | 12/2009 | Ishino et al. |
| 2009/0302294 A1 | 12/2009 | Kim |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0315095 A1 | 12/2009 | Kim |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0013049 A1 | 1/2010 | Tanaka |
| 2010/0025766 A1 | 2/2010 | Nuttinck et al. |
| 2010/0025825 A1 | 2/2010 | DeGraw et al. |
| 2010/0031217 A1 | 2/2010 | Sinha et al. |
| 2010/0032635 A1 | 2/2010 | Schwerin U |
| 2010/0038699 A1 | 2/2010 | Katsumata et al. |
| 2010/0038743 A1 | 2/2010 | Lee |
| 2010/0045849 A1 | 2/2010 | Yamasaki |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0059864 A1 | 3/2010 | Mahler et al. |
| 2010/0078770 A1 | 4/2010 | Purushothaman et al. |
| 2010/0081232 A1 | 4/2010 | Furman et al. |
| 2010/0089627 A1 | 4/2010 | Huang et al. |
| 2010/0090188 A1 | 4/2010 | Fatasuyama |
| 2010/0112753 A1 | 5/2010 | Lee |
| 2010/0112810 A1 | 5/2010 | Lee et al. |
| 2010/0117048 A1 | 5/2010 | Lung et al. |
| 2010/0123202 A1 | 5/2010 | Hofmann |
| 2010/0123480 A1 | 5/2010 | Kitada et al. |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0155932 A1 | 6/2010 | Gambino |
| 2010/0157117 A1 | 6/2010 | Wang |
| 2010/0159650 A1 | 6/2010 | Song |
| 2010/0181600 A1 | 7/2010 | Law |
| 2010/0190334 A1 | 7/2010 | Lee |
| 2010/0193884 A1 | 8/2010 | Park et al. |
| 2010/0193964 A1 | 8/2010 | Farooq et al. |
| 2010/0219392 A1 | 9/2010 | Awaya |
| 2010/0221867 A1 | 9/2010 | Bedell et al. |
| 2010/0224876 A1 | 9/2010 | Zhu |
| 2010/0224915 A1 | 9/2010 | Kawashima et al. |
| 2010/0225002 A1 | 9/2010 | Law et al. |
| 2010/0232200 A1 | 9/2010 | Shepard |
| 2010/0252934 A1 | 10/2010 | Law |
| 2010/0264551 A1 | 10/2010 | Farooq |
| 2010/0276662 A1 | 11/2010 | Colinge |
| 2010/0289144 A1 | 11/2010 | Farooq |
| 2010/0297844 A1 | 11/2010 | Yelehanka |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2010/0320514 A1 | 12/2010 | Tredwell |
| 2010/0320526 A1 | 12/2010 | Kidoh et al. |
| 2010/0330728 A1 | 12/2010 | McCarten |
| 2010/0330752 A1 | 12/2010 | Jeong |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0027967 A1 | 2/2011 | Beyne |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0111560 A1 | 5/2011 | Purushothaman |
| 2011/0115023 A1 | 5/2011 | Cheng |
| 2011/0128777 A1 | 6/2011 | Yamazaki |
| 2011/0134683 A1 | 6/2011 | Yamazaki |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0159635 A1 | 6/2011 | Doan et al. |
| 2011/0170331 A1 | 7/2011 | Oh |
| 2011/0204917 A1 | 8/2011 | O'Neill |
| 2011/0221022 A1 | 9/2011 | Toda |
| 2011/0222356 A1 | 9/2011 | Banna |
| 2011/0227158 A1 | 9/2011 | Zhu |
| 2011/0241082 A1 | 10/2011 | Bernstein et al. |
| 2011/0284946 A1 | 11/2011 | Kiyotoshi |
| 2011/0284992 A1 | 11/2011 | Zhu |
| 2011/0286283 A1 | 11/2011 | Lung et al. |
| 2011/0304765 A1 | 12/2011 | Yogo et al. |
| 2011/0309432 A1 | 12/2011 | Ishihara et al. |
| 2011/0314437 A1 | 12/2011 | McIlrath |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0032250 A1 | 2/2012 | Son et al. |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0086100 A1 | 4/2012 | Andry |
| 2012/0126197 A1 | 5/2012 | Chung |
| 2012/0146193 A1 | 6/2012 | Stuber et al. |
| 2012/0161310 A1 | 6/2012 | Brindle et al. |
| 2012/0169319 A1 | 7/2012 | Dennard |
| 2012/0181654 A1 | 7/2012 | Lue |
| 2012/0182801 A1 | 7/2012 | Lue |
| 2012/0187444 A1 | 7/2012 | Oh |
| 2012/1017821 | 7/2012 | Hebert |
| 2012/0193785 A1 | 8/2012 | Lin |
| 2012/0241919 A1 | 9/2012 | Mitani |
| 2012/0286822 A1 | 11/2012 | Madurawe |
| 2012/0304142 A1 | 11/2012 | Morimoto |
| 2012/0317528 A1 | 12/2012 | McIlrath |
| 2012/0319728 A1 | 12/2012 | Madurawe |
| 2013/0026663 A1 | 1/2013 | Radu et al. |
| 2013/0037802 A1 | 2/2013 | England |
| 2013/0049796 A1 | 2/2013 | Pang |
| 2013/0070506 A1 | 3/2013 | Kajigaya |
| 2013/0082235 A1 | 4/2013 | Gu et al. |
| 2013/0097574 A1 | 4/2013 | Balabanov et al. |
| 2013/0100743 A1 | 4/2013 | Lue |
| 2013/0128666 A1 | 5/2013 | Avila |
| 2013/0187720 A1 | 7/2013 | Ishii |
| 2013/0193550 A1 | 8/2013 | Sklenard et al. |
| 2013/0196500 A1 | 8/2013 | Batude et al. |

(56) References Cited

U.S. PATENT DOCUMENTS

| | | |
|---|---|---|
| 2013/0203248 A1 | 8/2013 | Ernst et al. |
| 2013/0207243 A1 | 8/2013 | Fuergut et al. |
| 2013/0263393 A1 | 10/2013 | Mazumder |
| 2013/0337601 A1 | 12/2013 | Kapur |
| 2014/0015136 A1 | 1/2014 | Gan et al. |
| 2014/0030871 A1 | 1/2014 | Arriagada et al. |
| 2014/0035616 A1 | 2/2014 | Oda et al. |
| 2014/0048867 A1 | 2/2014 | Toh |
| 2014/0099761 A1 | 4/2014 | Kim et al. |
| 2014/0103959 A1 | 4/2014 | Andreev |
| 2014/0117413 A1 | 5/2014 | Madurawe |
| 2014/0120695 A1 | 5/2014 | Ohtsuki |
| 2014/0131885 A1 | 5/2014 | Samadi et al. |
| 2014/0137061 A1 | 5/2014 | McIlrath |
| 2014/0145347 A1 | 5/2014 | Samadi et al. |
| 2014/0146630 A1 | 5/2014 | Xie et al. |
| 2014/0149958 A1 | 5/2014 | Samadi et al. |
| 2014/0151774 A1 | 6/2014 | Rhie |
| 2014/0191357 A1 | 7/2014 | Lee |
| 2014/0225218 A1 | 8/2014 | Du |
| 2014/0225235 A1 | 8/2014 | Du |
| 2014/0252306 A1 | 9/2014 | Du |
| 2014/0253196 A1 | 9/2014 | Du et al. |
| 2014/0264228 A1 | 9/2014 | Toh |
| 2014/0357054 A1 | 12/2014 | Son et al. |
| 2015/0021785 A1 | 1/2015 | Lin |
| 2015/0034898 A1 | 2/2015 | Wang |
| 2015/0243887 A1 | 8/2015 | Saitoh |
| 2015/0255418 A1 | 9/2015 | Gowda |
| 2015/0279829 A1 | 10/2015 | Kuo |
| 2015/0340369 A1 | 11/2015 | Lue |
| 2016/0049201 A1 | 2/2016 | Lue |
| 2016/0104780 A1 | 4/2016 | Mauder |
| 2016/0133603 A1 | 5/2016 | Ahn |
| 2016/0141299 A1 | 5/2016 | Hong |
| 2016/0141334 A1 | 5/2016 | Takaki |
| 2016/0307952 A1 | 10/2016 | Huang |
| 2016/0343687 A1 | 11/2016 | Vadhavkar |
| 2017/0069601 A1 | 3/2017 | Park |
| 2017/0092371 A1 | 3/2017 | Harari |
| 2017/0098596 A1 | 4/2017 | Lin |
| 2017/0148517 A1 | 5/2017 | Harari |
| 2017/0179146 A1 | 6/2017 | Park |
| 2017/0221900 A1 | 8/2017 | Widjaja |
| 2017/0278526 A1 | 9/2017 | Walker et al. |
| 2018/0090219 A1 | 3/2018 | Harari |
| 2018/0090368 A1 | 3/2018 | Kim |
| 2018/0108416 A1 | 4/2018 | Harari |
| 2018/0294284 A1 | 10/2018 | Tarakji |
| 2019/0006009 A1 | 1/2019 | Harari |
| 2019/0043836 A1 | 2/2019 | Fastow et al. |
| 2019/0067327 A1 | 2/2019 | Herner |
| 2019/0157296 A1 | 5/2019 | Harari et al. |
| 2020/0020408 A1 | 1/2020 | Norman |
| 2020/0020718 A1 | 1/2020 | Harari et al. |
| 2020/0051990 A1 | 2/2020 | Harari et al. |
| 2020/0105773 A1 | 4/2020 | Morris et al. |
| 2020/0227123 A1 | 7/2020 | Salahuddin et al. |
| 2020/0243486 A1 | 7/2020 | Quader et al. |

OTHER PUBLICATIONS

Demeester, P. et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.

Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Kim, W., et al., "Multi-layered Vertical Gate NAND Flash overcoming stacking limit for terabit density storage", Symposium on VLSI Technology Digest of Technical Papers, 2009, pp. 188-189.

Dicioccio, L., et al., "Direct bonding for wafer level 3D integration", ICICDT 2010, pp. 110-113.

Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.

Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.

Celler, G.K. et al., "Frontiers of silicon-on-insulator," J. App. Phys., May 1, 2003, pp. 4955-4978, vol. 93, No. 9.

Rajendran, B., et al., "Electrical Integrity of MOS Devices in Laser Annealed 3D IC Structures", proceedings VLSI Multi Level Interconnect Conference 2004, pp. 73-74.

Rajendran, B., "Sequential 3D IC Fabrication: Challenges and Prospects", Proceedings of VLSI Multi Level Interconnect Conference 2006, pp. 57-64.

Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228- 229, Jun. 15-17, 2004.

Hui, K. N., et al., "Design of vertically-stacked polychromatic light-emitting diodes," Optics Express, Jun. 8, 2009, pp. 9873-9878, vol. 17, No. 12.

Chuai, D. X., et al., "A Trichromatic Phosphor-Free White Light-Emitting Diode by Using Adhesive Bonding Scheme," Proc. SPIE, 2009, vol. 7635.

Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.

Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.

Flamand, G. et al., "Towards Highly Efficient 4-Terrninal Mechanical Photovoltaic Stacks," III-Vs Review, Sep.-Oct. 2006, pp. 24-27, vol. 19, Issue 7.

Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.

Sekar, D. C., et al., "A 3D-IC Technology with Integrated Microchannel Cooling", Proc. Intl. Interconnect Technology Conference, 2008, pp. 13-15.

Brunschweiler, T., et al., "Forced Convective Interlayer Cooling in Vertically Integrated Packages," Proc. Intersoc. Conference on Thermal Management (ITHERM), 2008, pp. 1114-1125.

Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.

Motoyoshi, M., "3D-IC Integration," 3rd Stanford and Tohoku University Joint Open Workshop, Dec. 4, 2009, pp. 1-52.

Wong, S., et al., "Monolithic 3D Integrated Circuits," VLSI Technology, Systems and Applications, 2007, International Symposium on VLSI-TSA 2007, pp. 1-4.

Batude, P., et al., "Advances in 3D CMOS Sequential Integration," 2009 IEEE International Electron Devices Meeting (Baltimore, Maryland), Dec. 7-9, 2009, pp. 345-348.

(56) References Cited

OTHER PUBLICATIONS

Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.
Franzon, P.D. et al., "Design and CAD for 3D Integrated Circuits," 45th ACM/IEEE Design, Automation Conference (DAC), Jun. 8-13, 2008, pp. 668-673.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Dong, C. et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," Chptr. 13.4, pp. 407-410, in "Integrated Interconnect Technologies for 3D Nano Electronic Systems", 2009, Artech House.
Weis, M. et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S. et al., "*CELONCEL: Effective Design Technique for 3-D Monolithic Integration targeting High Performance integrated Circuits*", Asia pacific DAC 2011, paper 4A-4.
Choudhury, D., "3D Integration Technologies for Emerging Microsystems", IEEE Proceedings of the IMS 2010, pp. 1-4.
Lee, Y.-J., et al., "3D 65nm CMOS with 320° C. Microwave Dopant Activation", IEDM 2010, pp. 1-4.
Crnogorac, F., et al., "Semiconductor crystal islands for three-dimensional integration", J. Vac. Sci. Technol. B 28(6), Nov./Dec. 2010, pp. C6P53-C6P58.
Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.

Jung, S.-M., et al., "Highly Area Efficient and Cost Effective Double Stacked S3( Stacked Single-crystal Si) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Radu, I., et al., "Recent Developments of Cu—Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., ""Three Dimensionally Stacked NAND Flash Memory Technology Using Stacking Single Crystal Si Layers on ILD and TANOS Structure for Beyond 30nm Node"", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-µm Ultra-Thinning Technology using Device Wafers for 3D Manufacturing of Terabit Memory", 2010 Symposium on VLSI Technology Digest of Technical Papers, pp. 105-106.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multi-level Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From the Future Si Technology Perspective: Challenges and Opportunities", IEDM 2010, pp. 1.1.1-1.1.9.

(56) References Cited

OTHER PUBLICATIONS

Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.

Ramaswami, S., "3D TSV IC Processing", 3DIC Technology Forum Semicon Taiwan 2010, Sep. 9, 2010.

Davis, W.R., et al., "Demystifying 3D Ics: Pros and Cons of Going Vertical", IEEE Design and Test of Computers, Nov.-Dec. 2005, pp. 498-510.

Lin, M., et al., "Performance Benefits of Monolithically Stacked 3DFPGA", FPGA06, Feb. 22-24, 2006, Monterey, California, pp. 113-122.

Dong, C., et al., "Performance and Power Evaluation of a 3D CMOS/Nanomaterial Reconfigurable Architecture", ICCAD 2007, pp. 758-764.

Gojman, B., et al., "3D Nanowire-Based Programmable Logic", International Conference on Nano-Networks (Nanonets 2006), Sep. 14-16, 2006.

Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.

Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.

Rajendran, B., et al., "Thermal Simulation of laser Annealing for 3D Integration", Proceedings VMIC 2003.

Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.

Sadaka, M., et al., "Building Blocks for wafer level 3D integration",www.electroiq.com, Aug. 18, 2010, last accessed Aug. 18, 2010.

Madan, N., et al., "Leveraging 3D Technology for Improved Reliability," Proceedings of the 40th Annual IEEE/ACM International Symposium on Microarchitecture (MICRO 2007), IEEE Computer Society.

Hayashi, Y., et al., "Fabrication of Three Dimensional IC Using "Cumulatively Bonded IC" (CUBIC) Technology", 1990 Symposium on VLSI Technology, pp. 95-96.

Akasaka, Y., "Three Dimensional IC Trends," Proceedings of the IEEE, vol. 24, No. 12, Dec. 1986.

Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.

Kunio, T., et al., "Three Dimensional Ics, Having Four Stacked Active Device Layers," IEDM 1989, paper 34.6, pp. 837-840.

Gaillardon, P.-E., et al., "Can We Go Towards True 3-D Architectures?," DAC 2011, paper 58, pp. 282-283.

Yun, J-G., et al., "Single-Crystalline Si Stacked Array (STAR) NAND Flash Memory," IEEE Transactions on Electron Devices, vol. 58, No. 4, Apr. 2011, pp. 1006-1014.

Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.

Goplen, B., et al., "Thermal Via Placement in 3DICs," Proceedings of the International Symposium on Physical Design, Apr. 3-6, 2005, San Francisco.

Bobba, S., et al., "Performance Analysis of 3-D Monolithic Integrated Circuits," 2010 IEEE International 3D Systems Integration Conference (3DIC), Nov. 2010, Munich, pp. 1-4.

Batude, P., et al., "Demonstration of low temperature 3D sequential FDSOI integration down to 50nm gate length," 2011 Symposium on VLSI Technology Digest of Technical Papers, pp. 158-159.

Batude, P., et al., "Advances, Challenges and Opportunties in 3D CMOS Sequential Integration," 2011 IEEE International Electron Devices Meeting, paper 7.3, Dec. 2011, pp. 151-154.

Yun, C. H., et al., "Transfer of patterned ion-cut silicon layers", Applied Physics Letters, vol. 73, No. 19, Nov. 1998, pp. 2772-2774.

Ishihara, R., et al., "Monolithic 3D-ICs with single grain Si thin film transistors," Solid-State Electronics 71 (2012) pp. 80-87.

Lee, S. Y., et al., "Architecture of 3D Memory Cell Array on 3D IC," IEEE International Memory Workshop, May 20, 2012, Monterey, CA.

Lee, S. Y., et al., "3D IC Architecture for High Density Memories," IEEE International Memory Workshop, p. 1-6, May 2010.

Rajendran, B., et al., "CMOS transistor processing compatible with monolithic 3-D Integration," Proceedings VMIC 2005.

Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.

Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.

Kim, J., et al., "A Stacked Memory Device on Logic 3D Technology for Ultra-high-density Data Storage," Nanotechnology, vol. 22, 254006 (2011).

Lee, K. W., et al., "Three-dimensional shared memory fabricated using wafer stacking technology," IEDM Tech. Dig., 2000, pp. 165-168.

Chen, H. Y., et al., "HfOx Based Vertical Resistive Random Access Memory for Cost Effective 3D Cross-Point Architecture without Cell Selector," Proceedings IEDM 2012, pp. 497-499.

Huet, K., et al., "Ultra Low Thermal Budget Anneals for 30 Memories: Access Device Formation," Ion Implantation Technology 2012, AIP Conf Proceedings 1496, 135-138 (2012).

Batude, P., et al., "3D Monolithic Integration," ISCAS 2011 pp. 2233-2236.

Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.

Vinet, M., et.al., "Germanium on Insulator and new 3D architectures opportunities for integration", International Journal of Nanotechnology, vol. 7, No. 4, (Aug. 2010) pp. 304-319.

Bernstein, K., et al., "Interconnects in the Third Dimension: Design Challenges for 3DICs," Design Automation Conference, 2007, DAC'07, 44th ACM/IEEE, vol., No., pp. 562-567, Jun. 4-8, 2007.

Kuroda, T., "ThruChip Interface for Heterogeneous Chip Stacking," ElectroChemicalSociety Transactions, 50(14) 63-68 (2012).

Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).

Kuroda, T., "Wireless Proximity Communications for 3D System Integration," Future Directions in IC and Package Design Workshop, Oct. 29, 2007.

Qiang, J-Q, "3-D Hyperintegration and Packaging Technologies for Micro-Nano Systems," Proceedings of the IEEE, 97.1 (2009) pp. 18-30.

Lee, B.H., et al., "A Novel Pattern Transfer Process for Bonded SOI Giga-bit DRAMs," Proceedings 1996 IEEE International SOI Conference, Oct. 1996, pp. 114-115.

Inu, B., et al., "Extreme ultraviolet lithography and three dimensional circuits," Applied Phyisics Reviews, 1, 011104 (2014).

Delhougne, R., et al., "First Demonstration of Monocrystalline Silicon Macaroni Channel for 3-D NAND Memory Devices" IEEE VLSI Tech Digest, 2018, pp. 203-204.

Kim, J., et al.; "A stacked memory device on logic 3D technology for ultra-high-density data storage"; Nanotechnology 22 (2011) 254006 (7pp).

Hsieh, P-Y, et al.,"Monolithic 3D BEOL FinFET switch arrays using location-controlled-grain technique in voltage regulator with better FOM than 2D regulators", IEDM paper 3.1, pp. IEDM19-46 to -49.

(56) References Cited

OTHER PUBLICATIONS

Then, Han Wui, et al., "3D heterogeneous integration of high performance high-K metal gate GaN NMOS and Si PMOS transistors on 300mm high resistivity Si substrate for energy-efficient and compact power delivery, RF (5G and beyond) and SoC applications", IEDM 2019, paper 17.3, pp. IEDM19-402 to 405.

Rachmady, W., et al.,"300mm Heterogeneous 3D Integration of Record Performance Layer Transfer Germanium PMOS with Silicon NMOS for Low Power High Performance Logic Applications", IEDM 2019, paper 29.7, pp. IEDM19-697 to 700.

Colinge, J. P., et al., "Nanowire transistors without Junctions", Nature Nanotechnology, Feb. 21, 2010, pp. 1-5.

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.

Abramovici, Breuer and Friedman, Digital Systems Testing and Testable Design, Computer Science Press, 1990, pp. 432-447.

Yonehara, T., et al., "ELTRAN: SOI-Epi Wafer by Epitaxial Layer transfer from porous Silicon", the 198th Electrochemical Society Meeting, abstract No. 438 (2000).

Yonehara, T. et al., "Eltran®, Novel SOI Wafer Technology," JSAP International, Jul. 2001, pp. 10-16, No. 4.

Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.

Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.

Burr, G. W., et al., "Overview of candidate device technologies for storage-class memory," IBM Journal of Research and Development , vol. 52, No. 4.5, pp. 449-464, Jul. 2008.

Bez, R., et al., "Introduction to Flash memory," Proceedings IEEE, 91(4), 489-502 (2003).

Auth, C., et al., "45nm High-k + Metal Gate Strain-Enchanced Transistors," Symposium on VLSI Technology Digest of Technical Papers, 2008, pp. 128-129.

Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.

Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.

Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.

Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.

Iwai, H., et.al., "NiSi Salicide Technology for Scaled CMOS," Microelectronic Engineering, 60 (2002), pp. 157-169.

Froment, B., et.al., "Nickel vs. Cobalt Silicide integration for sub-50nm CMOS", IMEC ESS Circuits, 2003. pp. 215-219.

James, D., "65 and 45-nm Devices—an Overview", Semicon West, Jul. 2008, paper No. ctr_024377.

Davis, J.A., et.al., "Interconnect Limits on Gigascale Integration(GSI) in the 21st Century", Proc. IEEE, vol. 89, No. 3, pp. 305-324, Mar. 2001.

Shino, T., et al., "Floating Body RAM Technology and its Scalability to 32nm Node and Beyond," Electron Devices Meeting, 2006, IEDM '06, International, pp. 1-4, Dec. 11-13, 2006.

Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.

Okhonin, S., et al., "New Generation of Z-RAM", Electron Devices Meeting, 2007. IEDM 2007. IEEE International, pp. 925-928, Dec. 10-12, 2007.

Henttinen, K. et al., "Mechanically Induced Si Layer Transfer in Hydrogen-Implanted Si Wafers," Applied Physics Letters, Apr. 24, 2000, p. 2370-2372, vol. 76, No. 17.

Lee, C.-W., et al., "Junctionless multigate field-effect transistor," Applied Physics Letters, vol. 94, pp. 053511-1 to -2, 2009.

Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.

Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.

Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.

Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.

Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.

Henttinen, K. et al., "Cold ion-cutting of hydrogen implanted Si," J. Nucl. Instr. and Meth. in Phys. Res. B, 2002, pp. 761-766, vol. 190.

Brumfiel, G., "Solar cells sliced and diced", May 19, 2010, Nature News.

Dragoi, et al., "Plasma-activated wafer bonding: the new low-temperature tool for MEMS fabrication", Proc. SPIE, vol. 6589, 65890T (2007).

Vengurlekar, A., et al., "Mechanism of Dopant Activation Enhancement in Shallow Junctions by Hydrogen", Proceedings of the Materials Research Society, vol. 864, Spring 2005, E9.28.1-6.

Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.

Guo, X. et al., "Cascade single-chip phosphor-free white light emitting diodes," Applied Physics Letters, 2008, pp. 013507-1-013507-3, vol. 92.

Takafuji, Y. et al., "Integration of Single Crystal Si TFTs and Circuits on a Large Glass Substrate," IEEE International Electron Devices Meeting (IEDM), Dec. 7-9, 2009, pp. 1-4.

Wierer, J.J. et al., "High-power AlGaInN flip-chip light-emitting diodes," Applied Physics Letters, May 28, 2001, pp. 3379-3381, vol. 78, No. 22.

El-Gamal, A., "Trends in CMOS Image Sensor Technology and Design," International Electron Devices Meeting Digest of Technical Papers, Dec. 2002.

Ahn, S.W., "Fabrication of a 50 nm half-pitch wire grid polarizer using nanoimprint lithography," Nanotechnology, 2005, pp. 1874-1877, vol. 16, No. 9.

Johnson, R.C., "Switching LEDs on and off to enlighten wireless communications," EE Times, Jun. 2010, last accessed Oct. 11, 2010, <http://www.embeddedinternetdesign.com/design/225402094>.

Ohsawa, et al., "Autonomous Refresh of Floating Body Cell (FBC)", International Electron Device Meeting, 2008, pp. 801-804.

(56) References Cited

OTHER PUBLICATIONS

Chen, P., et al., "Effects of Hydrogen Implantation Damage on the Performance of InP/InGaAs/InP p-i-n. Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings Date, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.

(56) References Cited

OTHER PUBLICATIONS

Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.
Sellathamby, C.V., et al., "Non-contact wafer probe using wireless probe cards", (2005) Proceedings—International Test Conference, 2005, pp. 447-452.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Meindl, J. D., "Beyond Moore's Law: The Interconnect Era", IEEE Computing in Science & Engineering, Jan./Feb. 2003, pp. 20-24.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Buller Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NISI Schottky Barrier Process-Strained SI (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).

(56) References Cited

OTHER PUBLICATIONS

Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Agarwal, A., et al., "Efficient production of silicon-on-insulator films by co-implantation of He+ with H+" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1626.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Miller, D.A.B., "Optical interconnects to electronic chips," Applied Optics, vol. 49, No. 25, Sep. 1, 2010, pp. F59-F70.
En, W. G., et al., "The Genesis Process: A New SOI wafer fabrication method", Proceedings 1998 IEEE International SOI Conference, Oct. 1998, pp. 163-164.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.
Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.
Ahn, J., et al., "High-quality MOSFET's with ultrathin LPCVD gate SiO2," IEEE Electron Device Lett., vol. 13, No. 4, pp. 186-188, Apr. 1992.
Yang, M., et al., "High Performance CMOS Fabricated on Hybrid Substrate with Different Crystal Orientation," Proceedings IEDM 2003.
Yin, H., et al., "Scalable 3-D finlike poly-Si TFT and its nonvolatile memory application," IEEE Trans. Electron Devices, vol. 55, No. 2, pp. 578-564, Feb. 2008.
Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.
Faynot, O. et al., "Planar Fully depleted SOI technology: A Powerful architecture for the 20nm node and beyond," Electron Devices Meeting (IEDM), 2010 IEEE International, vol., No., pp. 3.2.1, 3.2.4, Dec. 6-8, 2010.
Khakifirooz, A., "ETSOI Technology for 20nm and Beyond", SOI Consortium Workshop: Fully Depleted SOI, Apr. 28, 2011, Hsinchu Taiwan.
Kim, I.-K., et al.,"Advanced Integration Technology for a Highly Scalable SOI DRAM with SOC (Silicon-On-Capacitors)", IEDM 1996, pp. 96-605-608, 22.5.4.
Lee, B.H., et al., "A Novel CMP Method for cost-effective Bonded SOI Wafer Fabrication," Proceedings 1995 IEEE International SOI Conference, Oct. 1995, pp. 60-61.
Choi, Sung-Jin, et al., "Performance Breakthrough in NOR Flash Memory with Dopant-Segregated Schottky-Barrier (DSSB) SONOS Devices," paper 11B-3, 2009 Symposium on VLSI Technology, Digest of Technical Papers, pp. 222-223.
Chang, Wei, et al., "Drain-induced Schottky barrier source-side hot carriers and its application to program local bits of nanowire charge-trapping memories," Japanese Journal of Applied Physics 53, 094001 (2014) pp. 094001-1 to 094001-5.

* cited by examiner

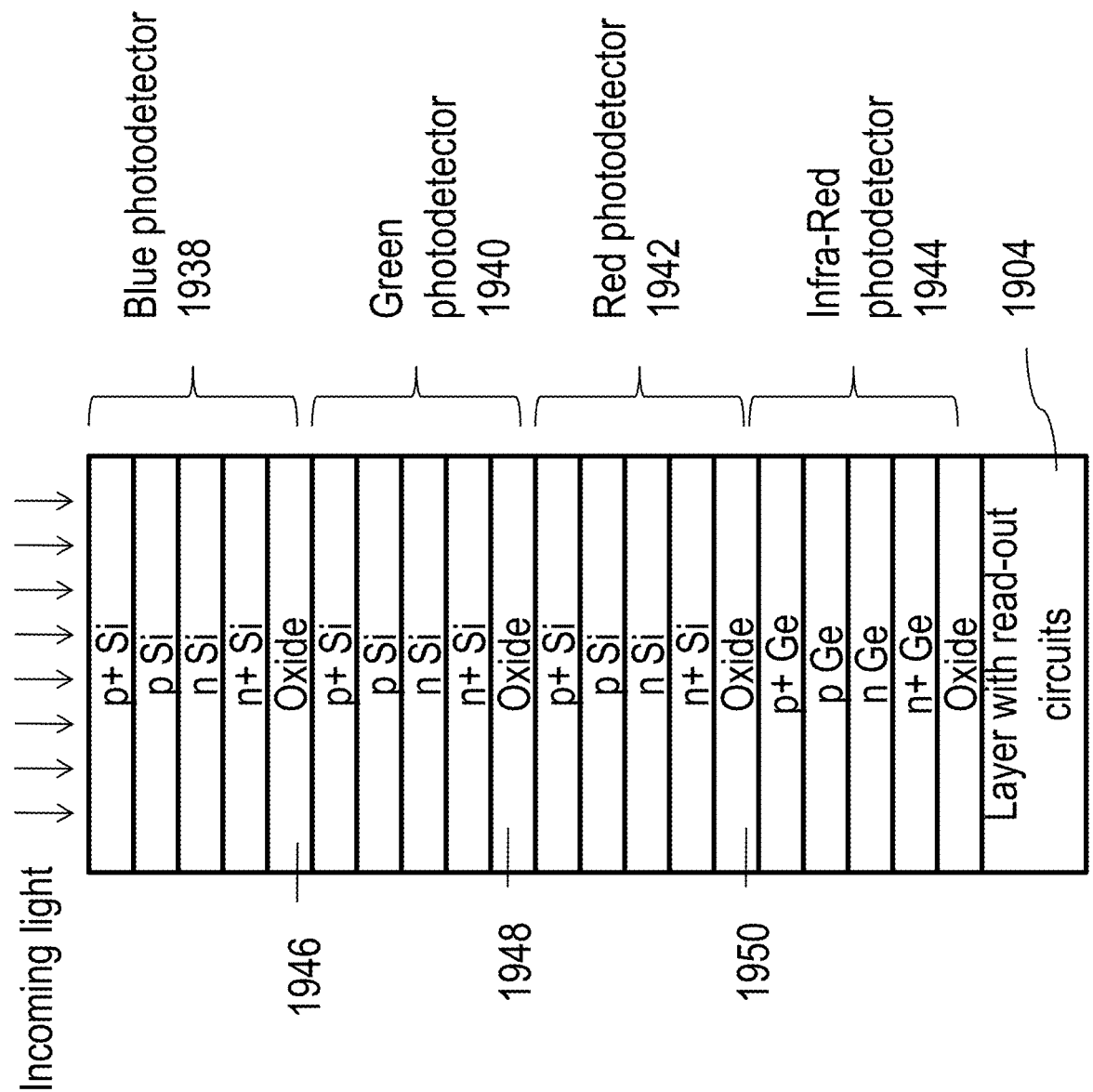

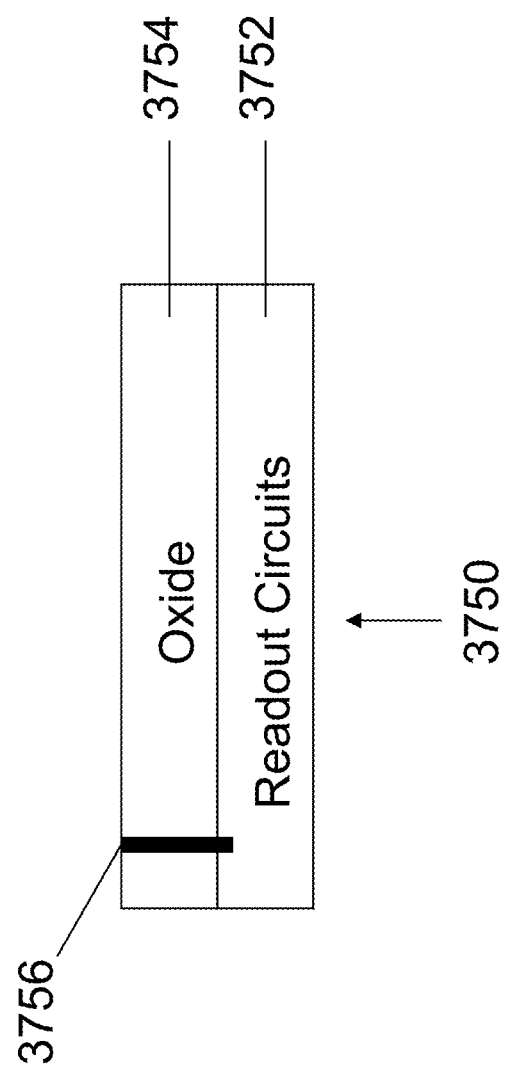

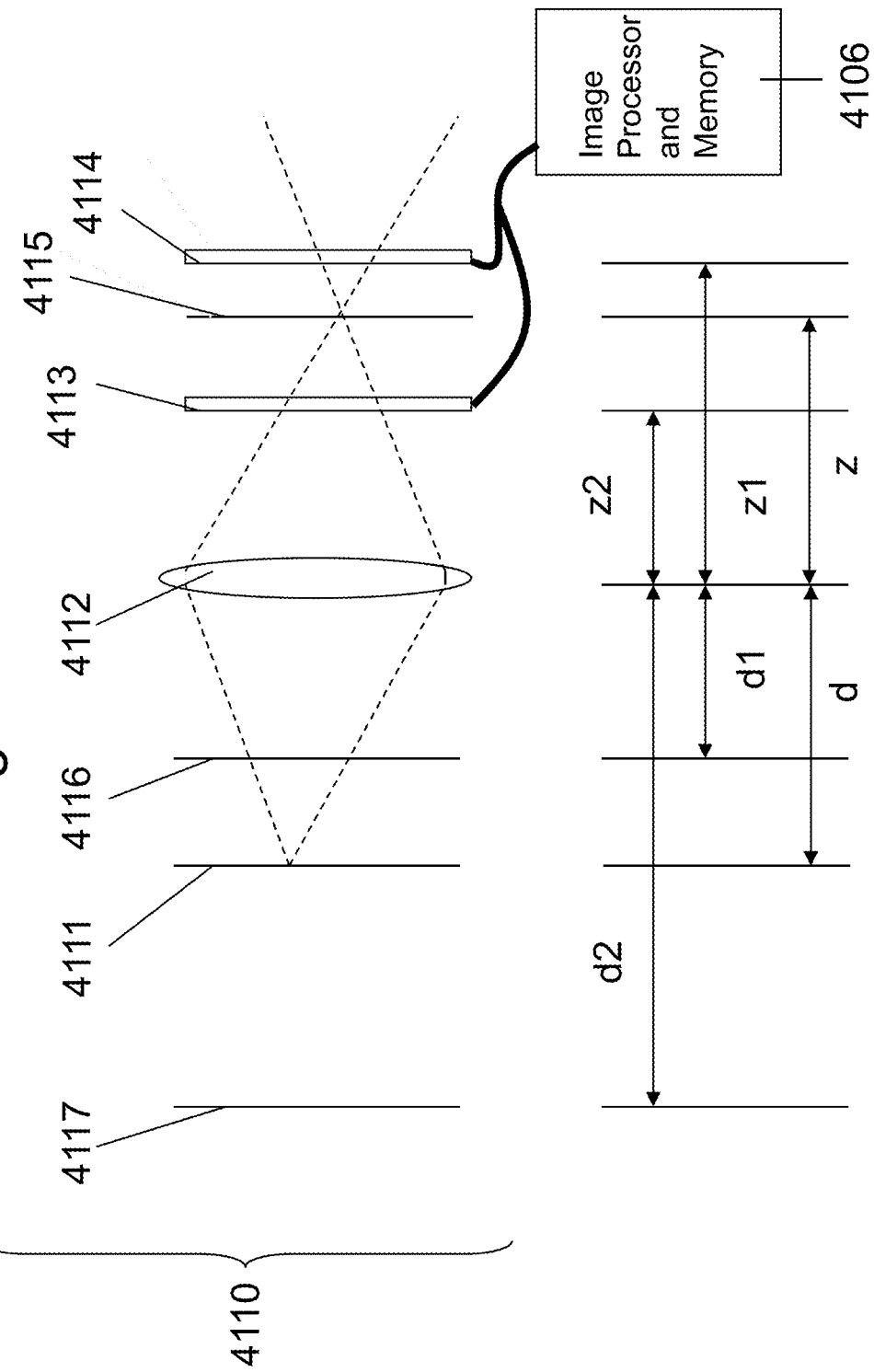

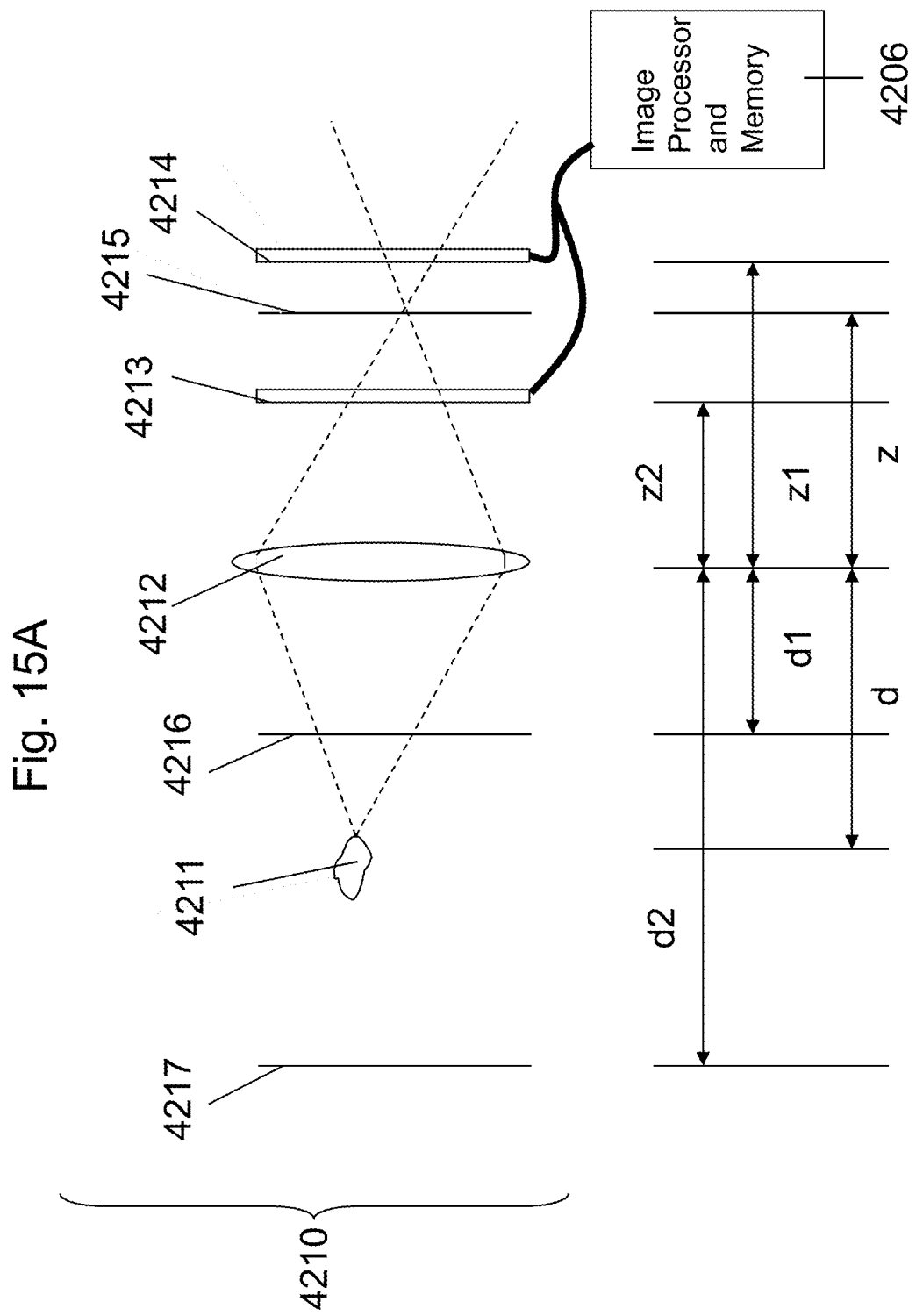

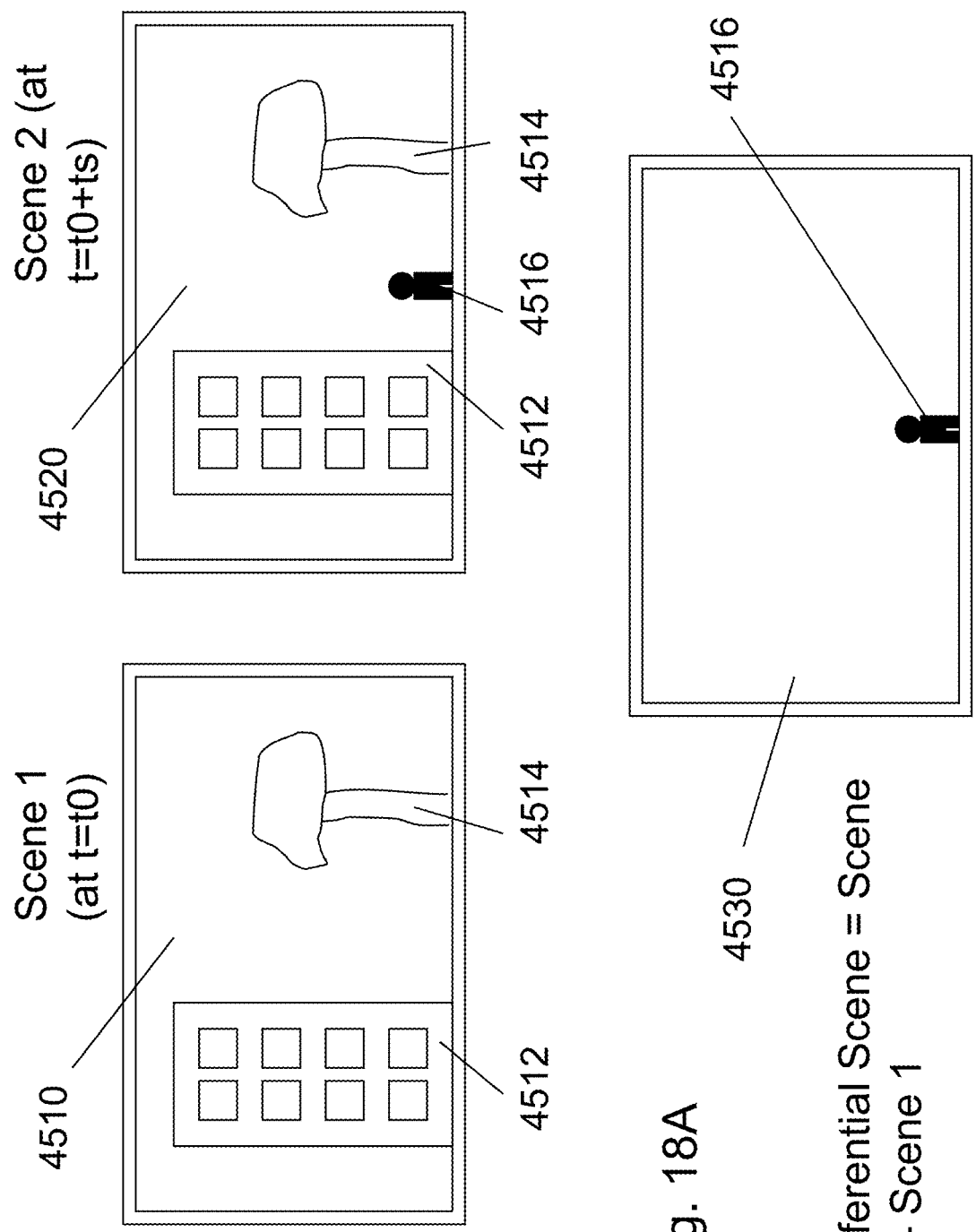

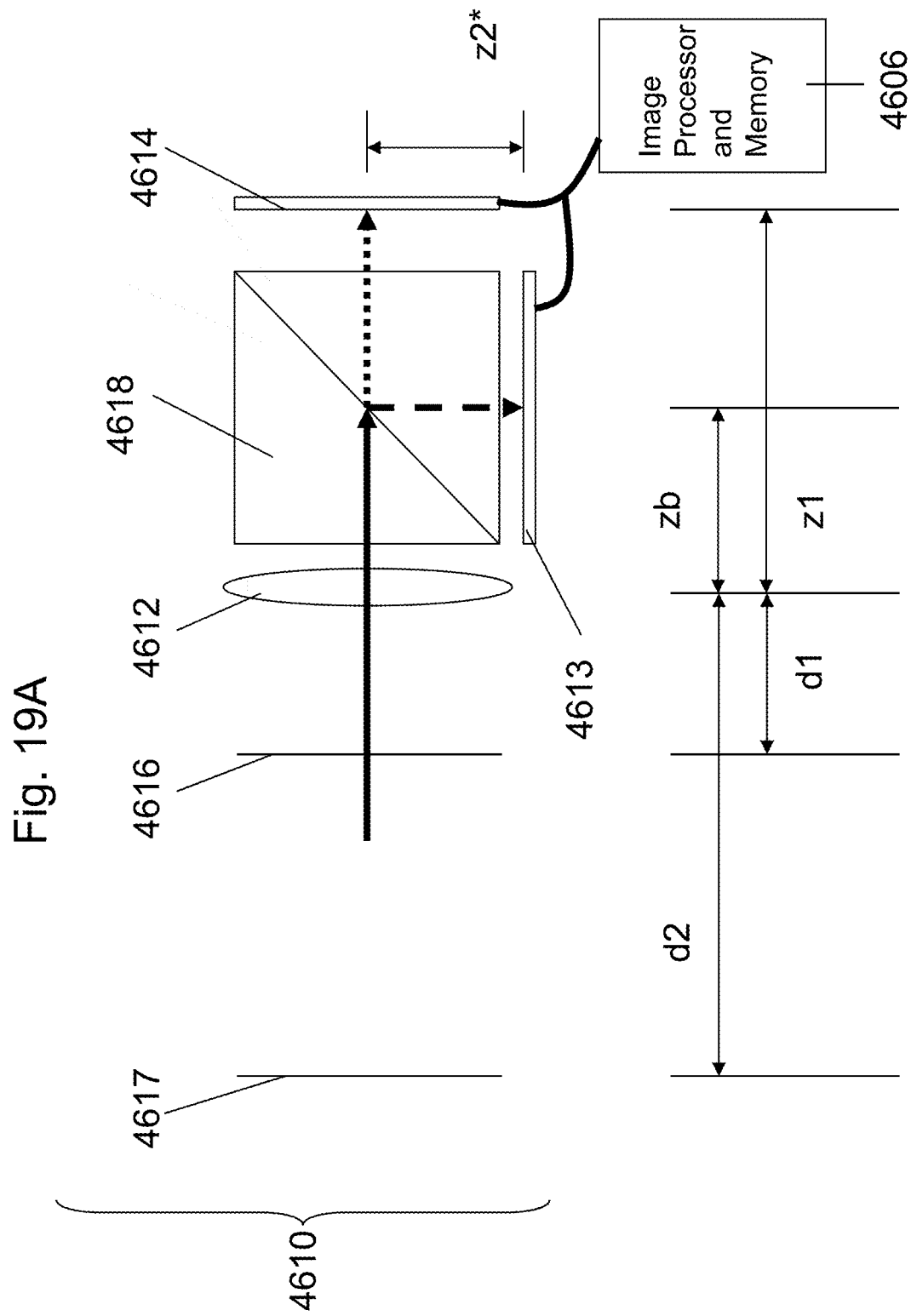

MULTILEVEL SEMICONDUCTOR DEVICE AND STRUCTURE WITH IMAGE SENSORS

CROSS-REFERENCE OF RELATED APPLICATION

This application is a continuation-in-part of U.S. patent application Ser. No. 17/121,726 filed on Dec. 14, 2020, which is a continuation-in-part of U.S. patent application Ser. No. 17/027,217 filed on Sep. 21, 2020; which is a continuation-in-part of U.S. patent application Ser. No. 16/860,027 filed on Apr. 27, 2020, now U.S. Pat. No. 10,833,108 issued on Nov. 11, 2020 which is a continuation-in-part of U.S. patent application Ser. No. 15/920,499 filed on Mar. 14, 2018, now U.S. Pat. No. 10,679,977 issued on Jun. 9, 2020 which is a continuation-in-part of U.S. patent application Ser. No. 14/936,657 filed on Nov. 9, 2015; now U.S. Pat. No. 9,941,319 issued on Apr. 10, 2018; which is a continuation-in-part of U.S. patent application Ser. No. 13/274,161 filed on Oct. 14, 2011, now U.S. Pat. No. 9,197,804 issued on Nov. 24, 2015; and this application is a continuation-in-part of U.S. patent application Ser. No. 12/904,103 filed on Oct. 13, 2010, now U.S. Pat. No. 8,163,581 issued on Apr. 24, 2012; the entire contents of all of the preceding are incorporated herein by reference.

BACKGROUND OF THE INVENTION

(A) Field of the Invention

This invention describes applications of monolithic 3D integration to various disciplines, including but not limited to, for example, light-emitting diodes, displays, image-sensors and solar cells.

(B) Discussion of Background Art

Semiconductor and optoelectronic devices often require thin monocrystalline (or single-crystal) films deposited on a certain wafer. To enable this deposition, many techniques, generally referred to as layer transfer technologies, have been developed. These include:
  (A) Ion-cut, variations of which are referred to as smart-cut, nano-cleave and smart-cleave: Further information on ion-cut technology is given in "Frontiers of silicon-on-insulator," J. Appl. Phys. 93, 4955-4978 (2003) by G. K. Celler and S. Cristolovean ("Celler") and also in "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen").
  (B) Porous silicon approaches such as ELTRAN: These are described in "Eltran, Novel SOI Wafer Technology", JSAP International, Number 4, July 2001 by T. Yonehara and K. Sakaguchi ("Yonehara").
  (C) Lift-off with a temporary substrate, also referred to as epitaxial lift-off: This is described in "Epitaxial lift-off and its applications", 1993 Semicond. Sci. Technol. 8 1124 by P. Demeester, et al. ("Demeester").
  (D) Bonding a substrate with single crystal layers followed by Polishing, Time-controlled etch-back or Etch-stop layer controlled etch-back to thin the bonded substrate: These are described in U.S. Pat. No. 6,806, 171 by A. Ulyashin and A. Usenko ("Ulyashin") and "Enabling SOI-Based Assembly Technology for Three-Dimensional (3D) Integrated Circuits (ICs)," IEDM Tech. Digest, p. 363 (2005) by A. W. Topol, D. C. La Tulipe, L. Shi, S. M. Alam, D. J. Frank, S. E. Steen, J. Vichiconti, D. Posillico, M. Cobb, S. Medd, J. Patel, S. Goma, D. DiMilia, M. T. Robson, E. Duch, M. Farinelli, C. Wang, R. A. Conti, D. M. Canaperi, L. Deligianni, A. Kumar, K. T. Kwietniak, C. D'Emic, J. Ott, A. M. Young, K. W. Guarini, and M. Ieong ("Topol").
  (E) Bonding a wafer with a Gallium Nitride film epitaxially grown on a sapphire substrate followed by laser lift-off for removing the transparent sapphire substrate: This method may be suitable for deposition of Gallium Nitride thin films, and is described in U.S. Pat. No. 6,071,795 by Nathan W. Cheung, Timothy D. Sands and William S. Wong ("Cheung").

Background on Image-Sensors:

Image sensors are used in applications such as cameras. Red, blue, and green components of the incident light are sensed and stored in digital format. CMOS image sensors typically contain a photodetector and sensing circuitry. Almost all image sensors today have both the photodetector and sensing circuitry on the same chip. Since the area consumed by the sensing circuits is high, the photodetector cannot see the entire incident light, and image capture is not as efficient.

To tackle this problem, several researchers have proposed building the photodetectors and the sensing circuitry on separate chips and stacking them on top of each other. A publication that describes this method is "Megapixel CMOS image sensor fabricated in three-dimensional integrated circuit technology", Intl. Solid State Circuits Conference 2005 by Suntharalingam, V., Berger, R., et al. ("Suntharalingam"). These proposals use through-silicon via (TSV) technology where alignment is done in conjunction with bonding. However, pixel size is reaching the 1 μm range, and successfully processing TSVs in the 1 μm range or below is very difficult. This is due to alignment issues while bonding. For example, the International Technology Roadmap for Semiconductors (ITRS) suggests that the 2-4 um TSV pitch will be the industry standard until 2012. A 2-4 μm pitch TSV will be too big for a sub-1 μm pixel. Therefore, novel techniques of stacking photodetectors and sensing circuitry are required.

A possible solution to this problem is given in "Setting up 3D Sequential Integration for Back-Illuminated CMOS Image Sensors with Highly Miniaturized Pixels with Low Temperature Fully-depleted SOI Transistors," IEDM, p. 1-4 (2008) by P. Coudrain et al. ("Coudrain"). In the publication, transistors are monolithically integrated on top of photodetectors. Unfortunately, transistor process temperatures reach 600° C. or more. This is not ideal for transistors (that require a higher thermal budget) and photodetectors (that may prefer a lower thermal budget).

Background on CCD Sensors:

Image sensors based on Charge-Coupled Device (CCD) technology has been around for several decades. The CCD technology relies on a collect and shift scheme, wherein charges are collected in individual cells according to the luminosity of the light falling on each of them, then the charges are sequentially shifted towards one edge of the sensor where readout circuits read the sequence of charges one at a time.

The advantage of CCD technology is it has better light sensitivity since almost the entire CCD cell area is dedicated to light collecting, and the control and readout circuits are all on one edge not blocking the light. On the other hand, in a CMOS sensor, the photodiodes in each cell have to share space with the control and readout circuits adjacent to them, and so their size and light sensitivity are therefore limited.

The main issue with CCD technology is this sequential shifting of image information from cell to cell is slow and limits the speed and cell density of CCD image sensors. A potential solution is to put the readout circuits directly under each CCD cell, so that the information is read in parallel rather than in time sequence, thus removing the shifting delay entirely.

Background on High Dynamic Range (HDR) Sensors:

Ever since the advent of commercial digital photography in the 1990s, achieving High Dynamic Range (HDR) imaging has been a goal for most camera manufacturers in their image sensors. The idea is to use various techniques to compensate for the lower dynamic range of image sensors relative to the human eye. The concept of HDR however, is not new. Combining multiple exposures of a single image to achieve a wide range of luminosity was actually pioneered in the 1850s by Gustave Le Gray to render seascapes showing both the bright sky and the dark sea. This was necessary to produce realistic photographic images as the film used at that time had exptremely low dynamic range compared to the human eye.

In digital cameras, the typical approach is to capture images using exposure bracketing, and then combining them into a single HDR image. The issue with this is that multiple exposures are performed over some period of time, and if there is movement of the camera or target during the time of the exposures, the final HDR image will reflect this by loss of sharpness. Moreover, multiple images may lead to large data in storage devices. Other methods use software algorithms to extract HDR information from a single exposure, but as they can only process information that is recordable by the sensor, there is a permanent loss of some details.

SUMMARY

In another aspect, a method using layer transfer for fabricating a CCD sensor with readout circuits underneath so as to collect image data from each cell in parallel, thus eliminating the shifting delay inherent in the traditional CCD charge transfer sequencing scheme.

In another aspect, a method using layer transfer for fabricating an image sensor consisting of one layer of photo-detectors with small light-sensitive areas, stacked on top of another layer of photo-detectors with larger light-sensitive areas.

In another aspect, a method using layer transfer for fabricating two image sensor arrays monolithically stacked on top of each other with an insulating layer between them and underlying control, readout, and memory circuits.

In another aspect, algorithms for reconstructing objects from images detected by a camera which includes a lens and two image sensor arrays of distinct distances from the lens.

In another aspect, a gesture remote control system using images detected by a camera which includes a lens and two image sensor arrays of distinct distances from the lens.

In another aspect, a surveillance camera system using images detected by a camera which includes a lens and two image sensor arrays of distinct distances from the lens.

In another aspect, a method of constructing a camera which includes a lens and two image sensor arrays of distinct effective distances from the lens, wherein images from the lens are split between the two image sensors by a beam-splitter.

In another aspect, a method of constructing a camera which includes a lens, an image sensor array, and a fast motor, wherein the fast motor actuates the image sensor's position relative to the lens so as to record images from the lens at distinct effective distances from the lens.

In another aspect, a camera system including, a first image sensor array and a second image sensor array wherein the first image sensor array is designed for a first focal plane in front of the camera, and the second image sensor array is designed for a second focal plane in front of the camera, wherein the distance to the first focal plane is substantially different than the distance to the second focal plane.

In another aspect, a camera system including, an image sensor sub system and a memory subsystem and a control subsystem wherein the camera is designed wherein the image sensor can provide the memory of at least a first image and a second image for the same scene in front of the camera, wherein the first image is for a first focal plane in front of the camera, and the second image is for a second focal plane in front of the camera, wherein the distance to the first focal plane is substantially different than the distance to the second focal plane.

In another aspect, a camera system including, a first image sensor array and a second image sensor array wherein the first image sensor array includes a first mono-crystallized silicon layer, and the second image sensor array includes a second mono-crystallized silicon layer, wherein between the first mono-crystallized silicon layer and second mono-crystallized silicon layer there is a thin isolation layer, wherein through the thin isolation layer there are a multiplicity conducting vias wherein the conducting vias radius is less than 400 nm.

In another aspect, a camera system including, a first image sensor array and a second image sensor array wherein the first image sensor array includes a first mono-crystallized silicon layer, and the second image sensor array includes a second mono-crystallized silicon layer, wherein between the first mono-crystallized silicon layer and second mono-crystallized silicon layer there is a thin isolation layer, wherein the second mono-crystallized silicon layer thickness is less than 400 nm.

In another aspect, an integrated device, the device comprising: a first level comprising a first mono-crystal layer, said first mono-crystal layer comprising a plurality of single crystal transistors and alignment marks; an overlaying oxide on top of said first level; a second level comprising a second mono-crystal layer, said second level overlaying said oxide, wherein said second mono-crystal layer comprises a plurality of first image sensors; and a third level overlaying said second level, wherein said third level comprises a plurality of second image sensors, wherein said second level is aligned to said alignment marks, wherein said second level is bonded to said first level, and wherein said bonded comprises an oxide to oxide bond.

In another aspect, an integrated device, the device comprising: a first level comprising a first mono-crystal layer, said first mono-crystal layer comprising a plurality of single crystal transistors and alignment marks; an overlaying oxide on top of said first level; a second level comprising a second mono-crystal layer, said second level overlaying said oxide, wherein said second mono-crystal layer comprises a plurality of first image sensors; and a third level overlaying said second level, wherein said third level comprises a plurality of second image sensors, and wherein said second level is bonded to said first level.

In another aspect, an integrated device, the device comprising: a first level comprising a first mono-crystal layer, said first mono-crystal layer comprising a plurality of single crystal transistors and alignment marks; an overlaying oxide on top of said first level; a second level comprising a second mono-crystal layer, said second level overlaying said oxide, wherein said second mono-crystal layer comprises a plurality of first image sensors; and a third level overlaying said second level, wherein said third level comprises a plurality of second image sensors, and wherein said second level is bonded to said first level.

BRIEF DESCRIPTION OF THE DRAWINGS

Various embodiments of the invention will be understood and appreciated more fully from the following detailed description, taken in conjunction with the drawings in which:

FIG. 7A-7B illustrate an embodiment of this invention, where an image sensor that can detect both visible and infra-red light without any loss of resolution is constructed;

FIG. 11C-11F illustrate an embodiment of this invention where a CCD sensor is monolithically stacked onto its control circuits using layer transfer, allowing for parallel readout of sensor data;

FIG. 14A-14D illustrate an embodiment of this invention, where algorithms are described to reconstruct an object at a given distance from the lens imaged by a camera system that includes a lens and two image sensor arrays parallel to each other and to the lens, wherein each sensor array is of distinct distance from the lens;

FIG. 15A-15C illustrate an embodiment of this invention, where algorithms are described to reconstruct an object of unknown distance from the lens imaged by a camera system that includes a lens and two image sensor arrays parallel to each other and to the lens, wherein each sensor array is of distinct distance from the lens;

FIG. 18A-18B illustrate an embodiment of this invention, where a surveillance system tracks dynamic objects which are reconstructed by a camera system that includes a lens and two image sensor arrays parallel to each other and to the lens, where each sensor array is of distinct distance from the lens. An algorithm is described to time-step through multiple images and subtract images of static objects;

FIG. 19A illustrates an embodiment of this invention, where a camera system includes a lens, a beam-splitter and two image sensor arrays wherein images in front of the lens are split by the beam-splitter to the two image sensors wherein each sensor array is of distinct effective distance from the lens.

DETAILED DESCRIPTION

Embodiments of the present invention are now described with reference to FIGS. 1-19, it being appreciated that the figures illustrate the subject matter not to scale or to measure.

NuImager Technology:

Layer transfer technology can also be advantageously utilized for constructing image sensors. Image sensors typically include photodetectors on each pixel to convert light energy to electrical signals. These electrical signals are sensed, amplified and stored as digital signals using transistor circuits.

Figure 1:
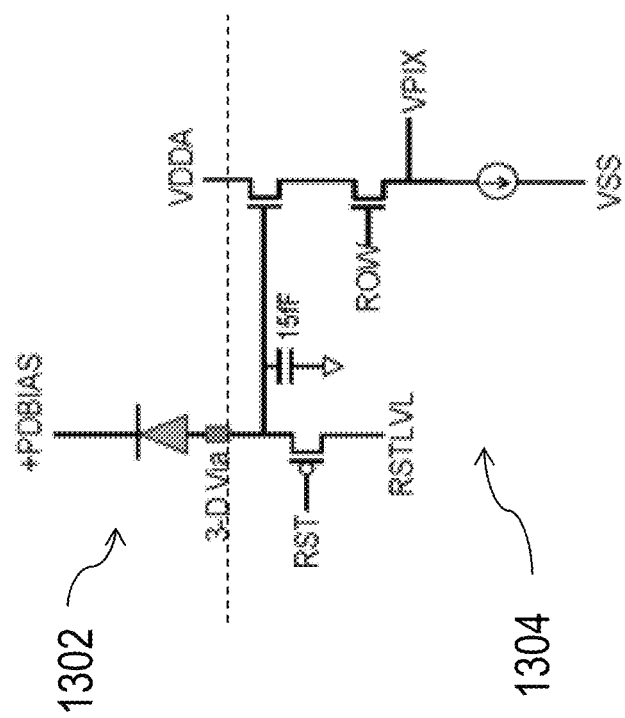
FIG. 1 illustrates a prior art image sensor stacking technology where connections between chips are aligned during bonding.

FIG. 1 shows prior art where through-silicon via (TSV) technology is utilized to connect photodetectors 1302 on one layer (tier) of silicon to transistor read-out circuits 1304 on another layer (tier) of silicon. Unfortunately, pixel sizes in today's image sensors are 1.1 µm or so. It is difficult to get through-silicon vias with size <1 µm due to alignment problems, leading to a diminished ability to utilize through-silicon via technology for future image sensors. In FIG. 1, essentially, transistors can be made for read-out circuits in one wafer, photodetectors can be made on another wafer, and then these wafers can be bonded together with connections made with through-silicon vias.

Figure 2:
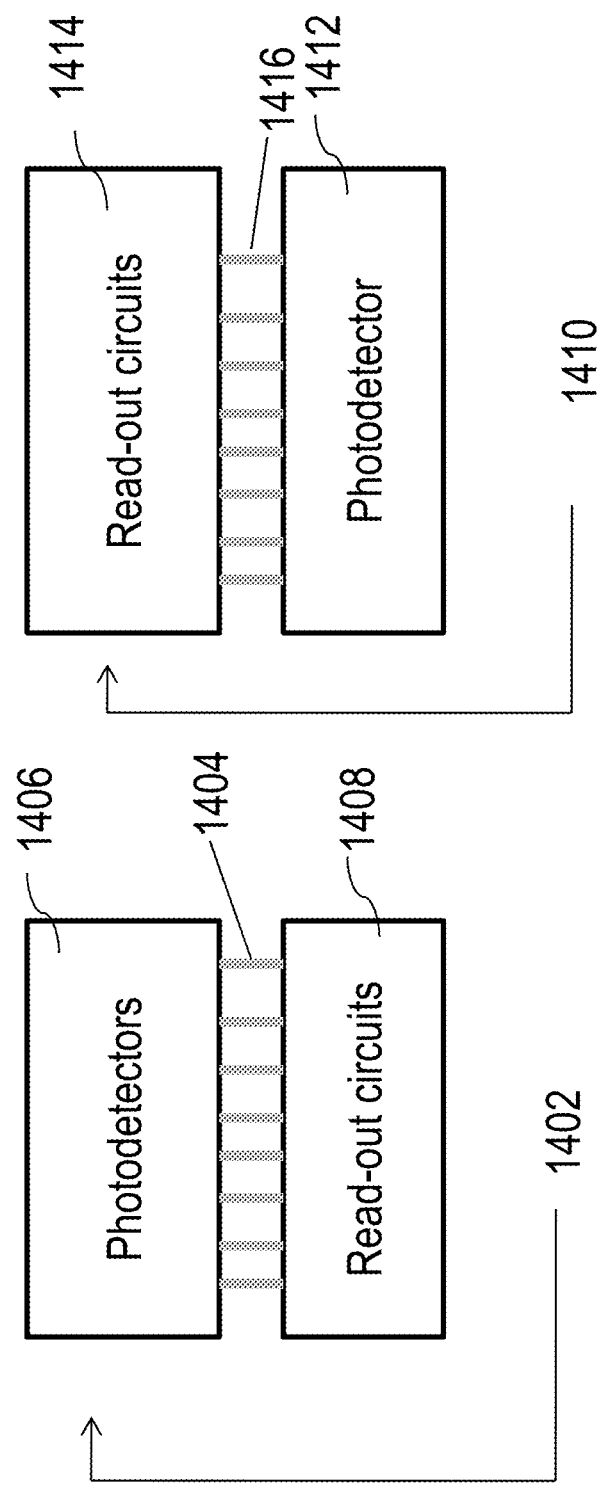
FIG. 2 describes two configurations for stacking photodetectors and read-out circuits.

FIG. 2-9 describe some embodiments of this invention, where photodetector and read-out circuits are stacked monolithically with layer transfer. FIG. 2 shows two configurations for stacking photodetectors and read-out circuits. In one configuration, denoted as 1402, a photodetector layer 1406 is formed above read-out circuit layer 1408 with connections 1404 between these two layers. In another configuration, denoted as 1410, photodetectors 1412 may have read-out circuits 1414 formed above them, with connecting 1416 between these two layers.

FIG. 3A-3H describe an embodiment of this invention, where an image sensor includes a photodetector layer formed atop a read-out circuit layer using layer transfer. In this document, the photodetector layer is denoted as a p-n junction layer. However, any type of photodetector layer, such as a pin layer or some other type of photodetector can be used. The thickness of the photodetector layer is typically less than 5 µm. The process of forming the image sensor could include several steps that occur in a sequence from Step (A) to Step (H). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 3A:
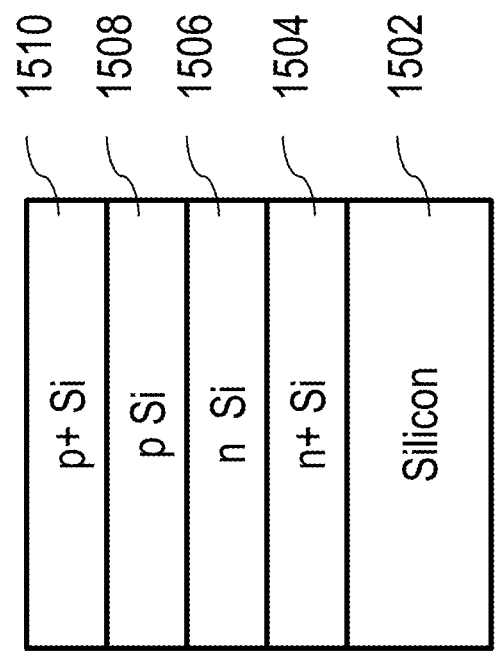
FIG. 3A-3H illustrate an embodiment of this invention, where a CMOS image sensor is formed by stacking a photodetector monolithically on top of read-out circuits using ion-cut technology.

Step (A) is illustrated in FIG. 3A. A silicon wafer 1502 is taken and a n+ Silicon layer 1504 is ion implanted. Following this, n layer 1506, p layer 1508 and p+ layer 1510 are formed epitaxially. It will be appreciated by one skilled in the art based on the present disclosure that there are various other procedures to form the structure shown in FIG. 3A. An anneal is then performed to activate dopants in various layers.

Figure 3B:
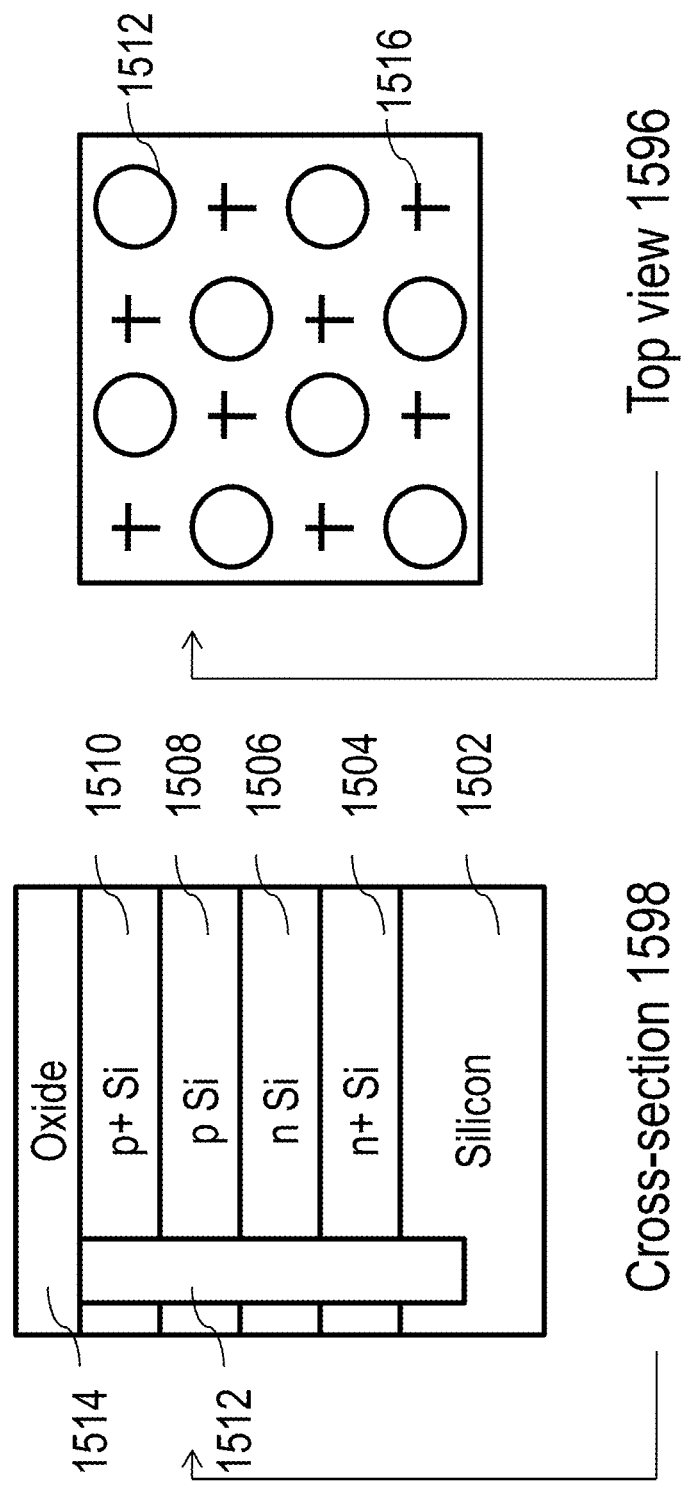

Step (B) is illustrated in FIG. 3B. Various elements in FIG. 3B such as 1502, 1504, 1506, 1508 and 1510 have been described previously. Using lithography and etch, a via is etched into the structure shown in FIG. 3A, filled with oxide and polished with CMP. The regions formed after this process are the oxide filled via 1512 and the oxide layer 1514. The oxide filled via 1512 may also be referred to as an oxide via or an oxide window region or oxide aperture. A cross-section of the structure is indicated by 1598 and a top view is indicated by 1596. 1516 indicates alignment marks and the oxide filled via 1512 is formed in place of some of the alignment marks printed on the wafer.

Figure 3C:
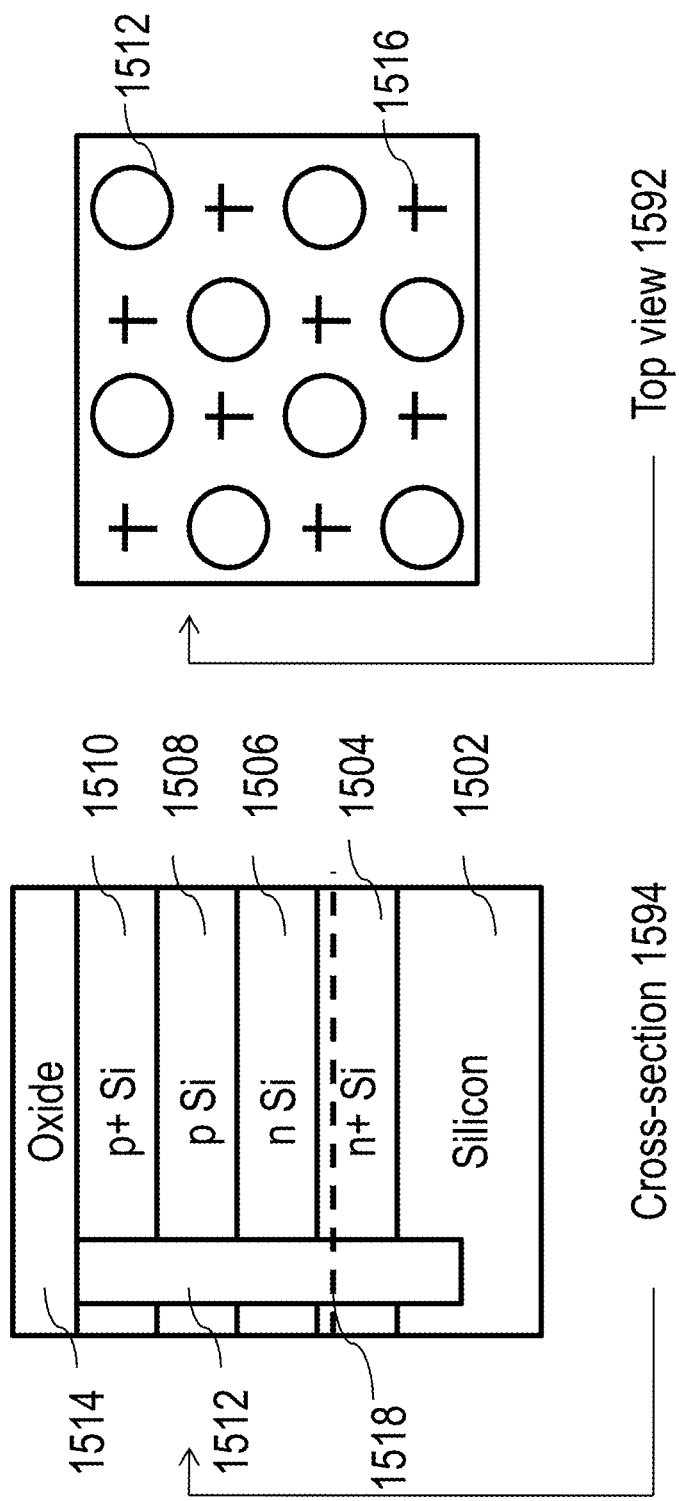

Step (C) is illustrated in FIG. 3C. Various elements in FIG. 3C such as 1502, 1504, 1506, 1508, 1510, 1512, 1514, and 1516 have been described previously. Hydrogen is implanted into the structure indicated in FIG. 3B at a certain depth indicated by dotted lines 1518 of FIG. 3C. Alternatively, Helium can be used as the implanted species. A cross-sectional view 1594 and a top view 1592 are shown.

Figure 3D:
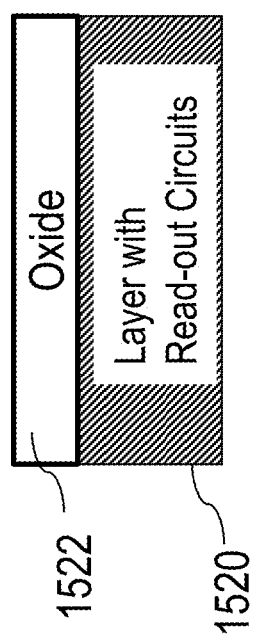

Step (D) is illustrated in FIG. 3D. A silicon wafer 1520 with read-out circuits (which includes wiring) processed on it is taken, and an oxide layer 1522 is deposited above it.

Figure 3E:
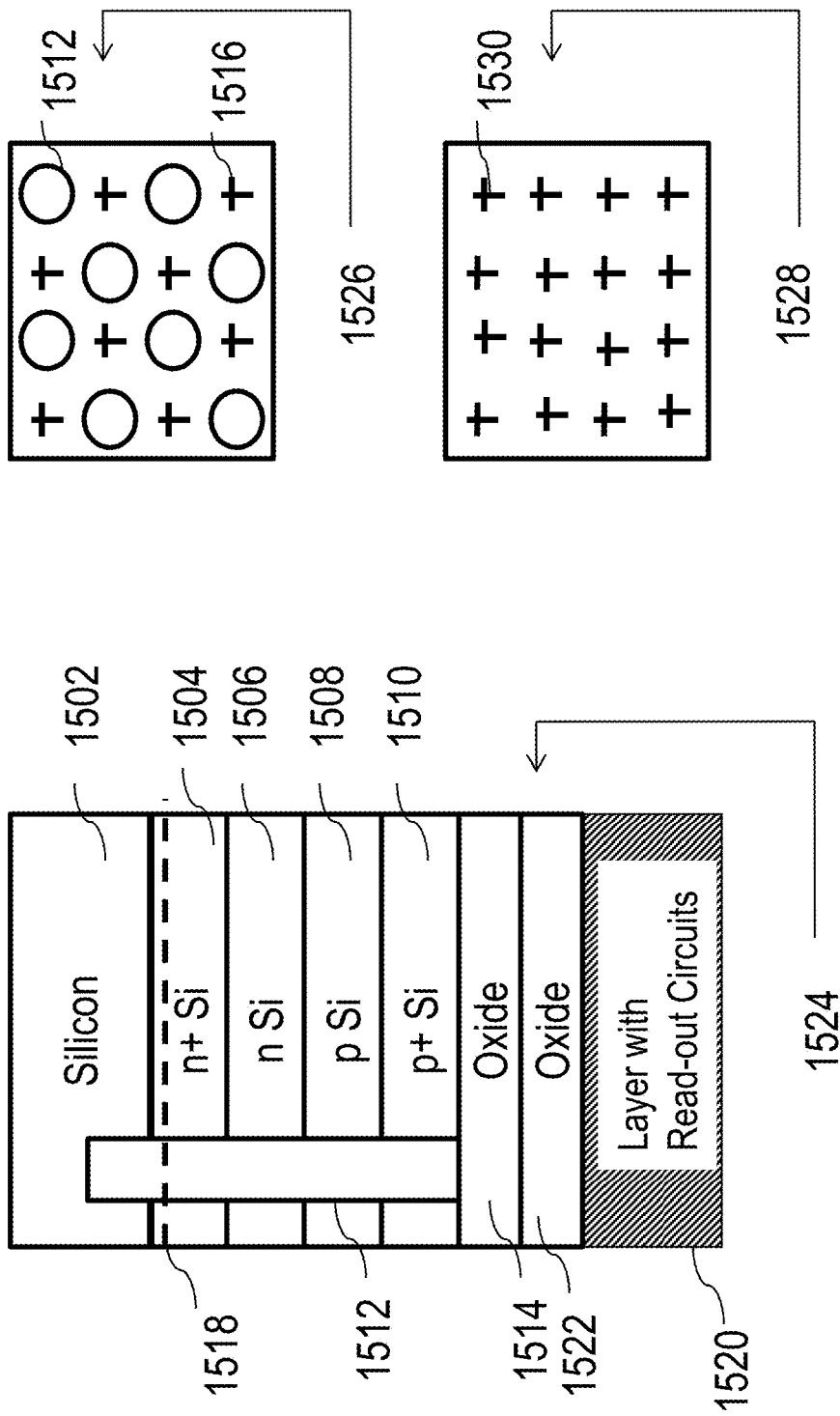

Step (E) is illustrated in FIG. 3E. The structure shown in FIG. 3C is flipped and bonded to the structure shown in FIG. 3D using oxide-to-oxide bonding of oxide layers 1514 and 1522. During this bonding procedure, alignment is done such that oxide vias 1512 (shown in the top view 1526 of the photodetector wafer) are above alignment marks (such as 1530) on the top view 1528 of the read-out circuit wafer. A cross-sectional view of the structure is shown with 1524. Various elements in FIG. 3E such as 1502, 1504, 1506, 1508, 1510, 1512, 1514, 1516, 1518, 1520, and 1522 have been described previously.

Figure 3F:
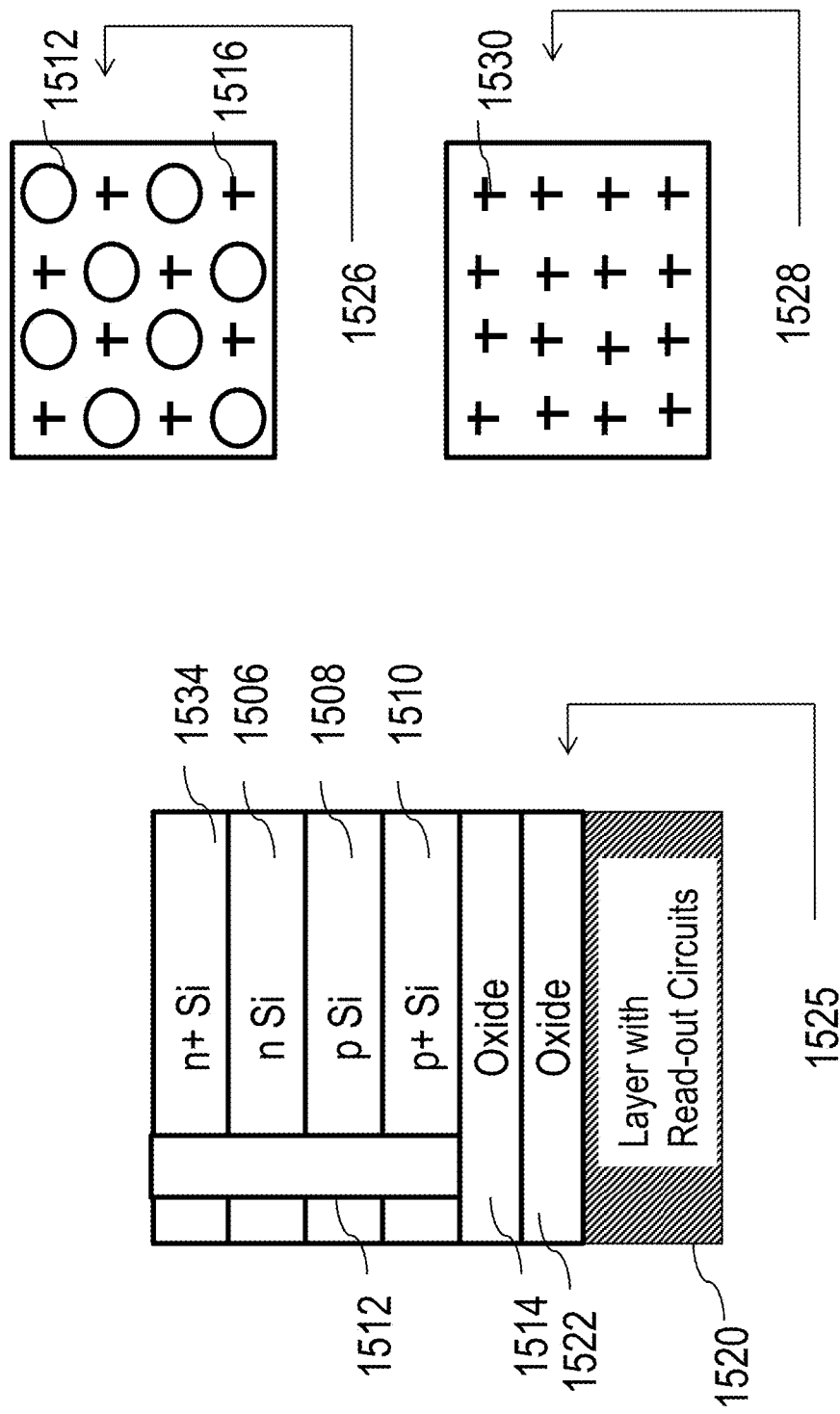

Step (F) is illustrated in FIG. 3F. The structure shown in FIG. 3E may be cleaved at its hydrogen plane 1518 preferably using a mechanical process. Alternatively, an anneal could be used for this purpose. A CMP process may be then done to planarize the surface resulting in a final n+ silicon layer indicated as 1534. 1525 depicts a cross-sectional view of the structure after the cleave and CMP process.

Various elements in FIG. 3F such as 1506, 1508, 1510, 1512, 1514, 1516, 1518, 1520, 1526, 1524, 1530, 1528, 1534 and 1522 have been described previously.

Figure 3G:
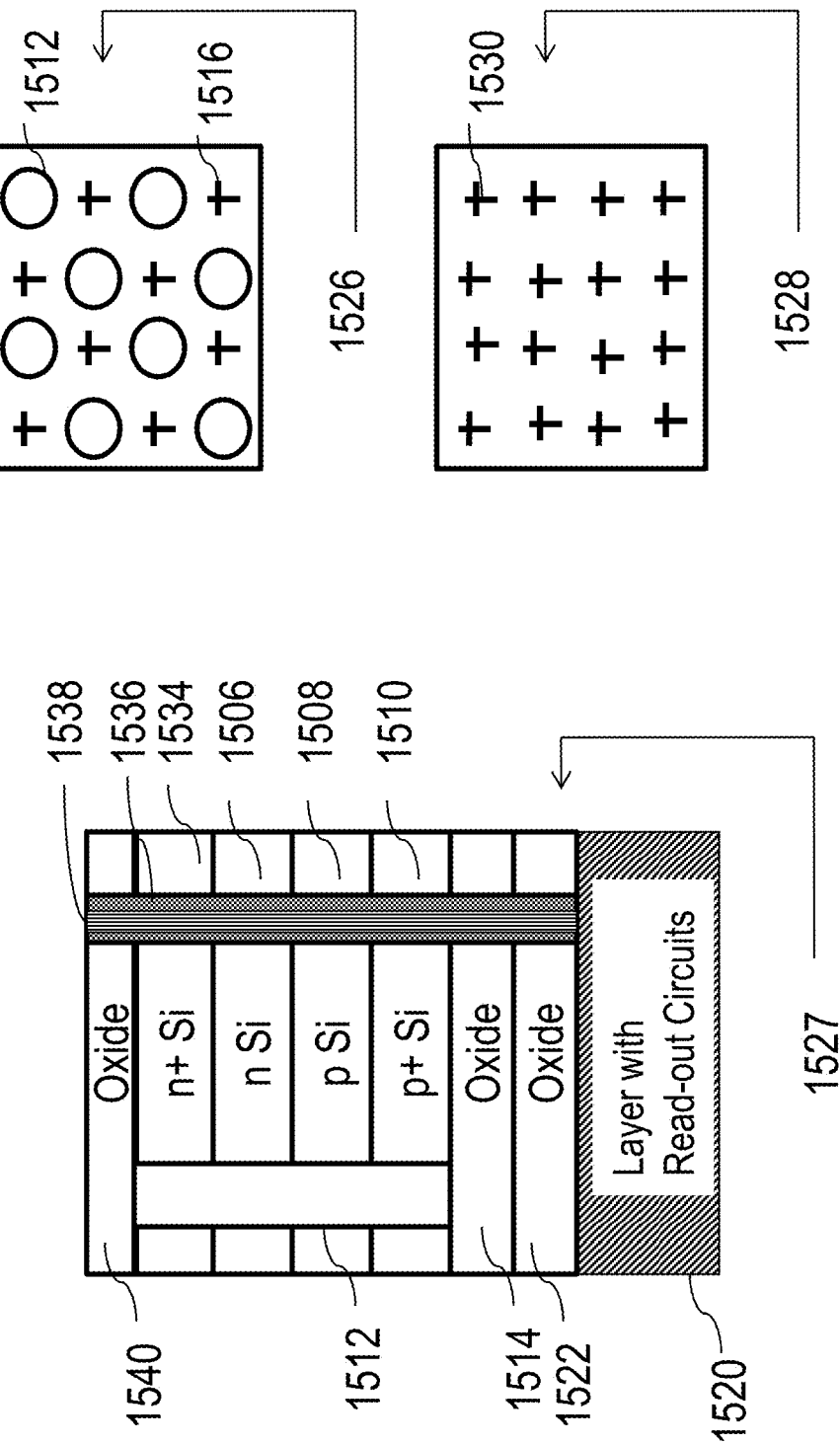

Step (G) is illustrated using FIG. 3G. Various elements in FIG. 3G such as 1506, 1508, 1510, 1512, 1514, 1516, 1518, 1520, 1526, 1524, 1530, 1528, 1534 and 1522 have been described previously. An oxide layer 1540 is deposited. Connections between the photodetector and read-out circuit wafers are formed with metal 1538 and an insulator covering 1536. These connections are formed well aligned to the read-out circuit layer 1520 by aligning to alignment marks 1530 on the read-out circuit layer 1520 through oxide vias 1512. 1527 depicts a cross-sectional view of the structure.

Figure 3H:
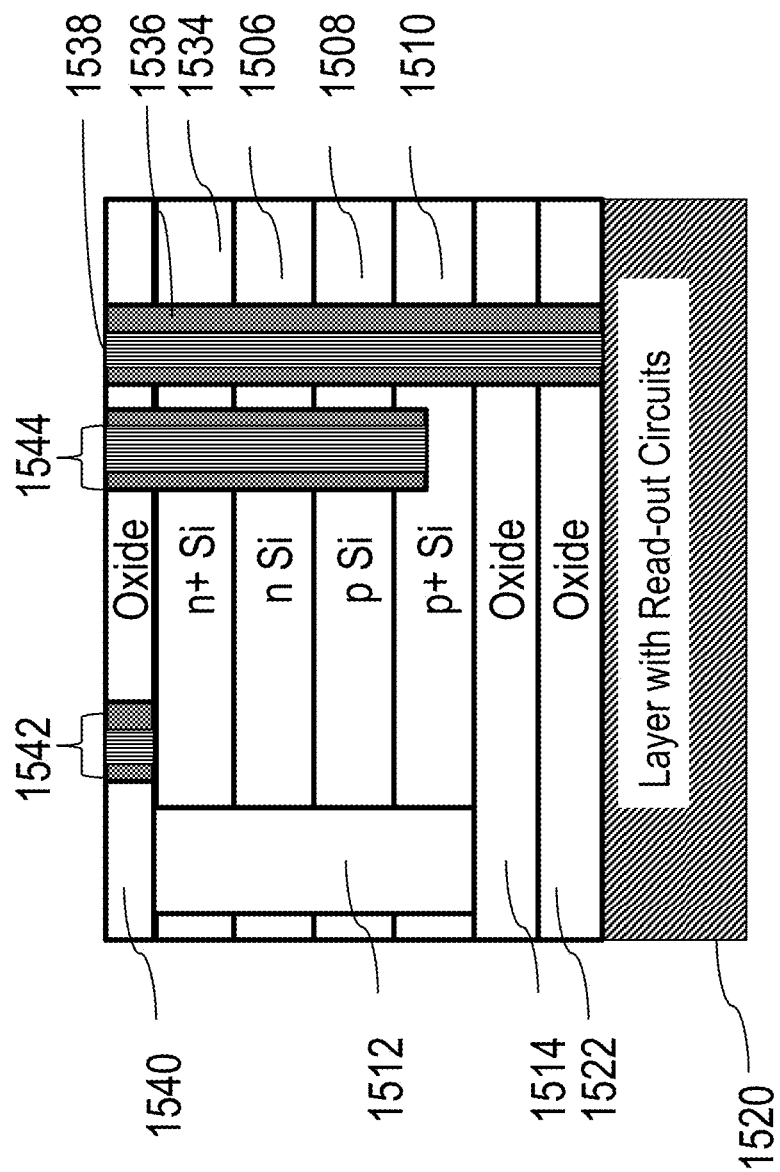
Figure 4:
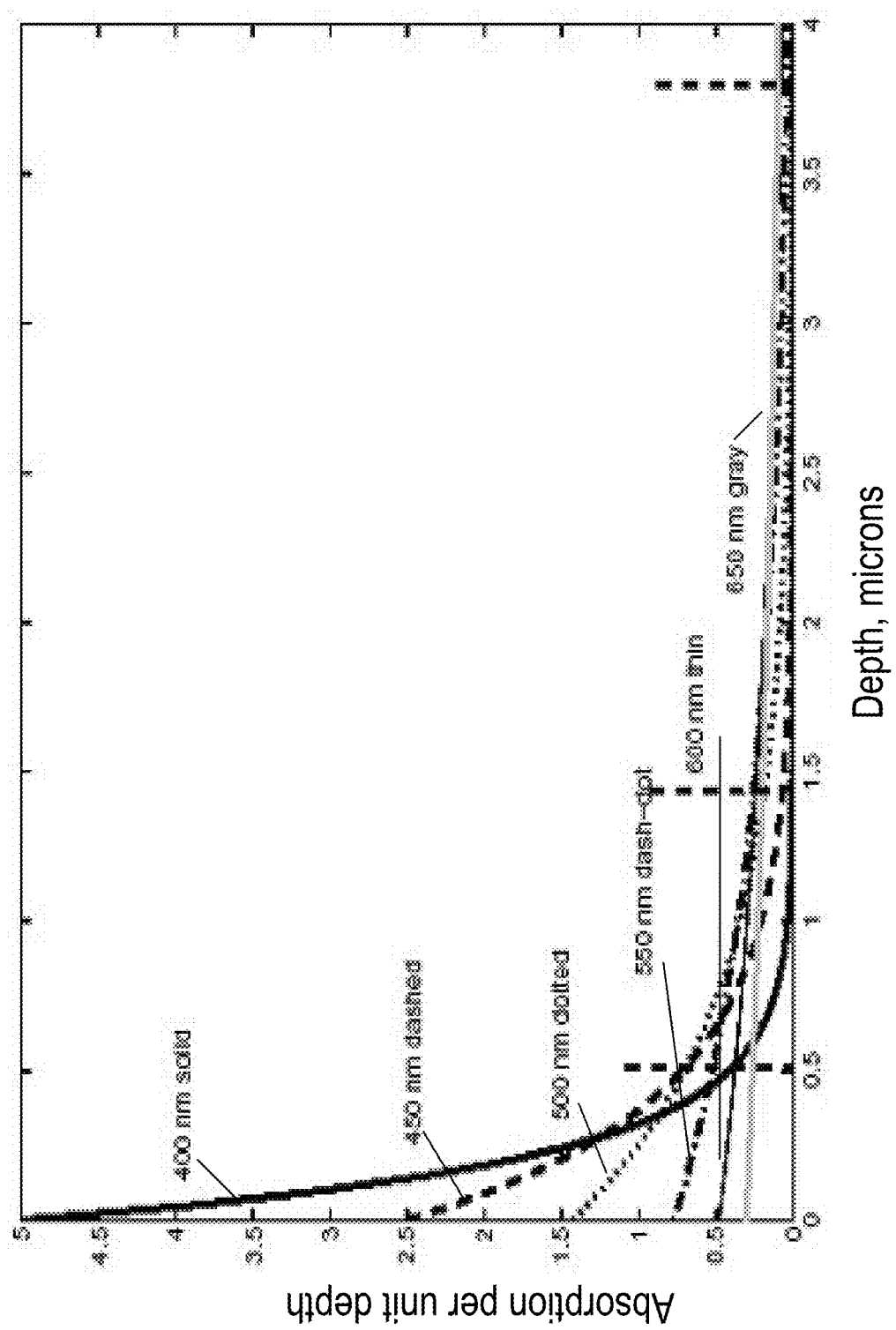
FIG. 4 illustrates the absorption process of different wavelengths of light at different depths in silicon image sensors.

Step (H) is illustrated in FIG. 3H. Connections are made to the terminals of the photodetector and are indicated as 1542 and 1544. Various elements of FIG. 3H such as 1520, 1522, 1512, 1514, 1510, 1508, 1506, 1534, 1536, 1538, 1540, 1542, and 1544 have been described previously. Contacts and interconnects for connecting terminals of the photodetector to read-out circuits are then done, following which a packaging process is conducted.

FIG. 3A-3G show a process where oxide vias may be used to look through photodetector layers to observe alignment marks on the read-out circuit wafer below it. However, if the thickness of the silicon on the photodetector layer is <100-400 nm, the silicon wafer is thin enough that one can look through it without requiring oxide vias. A process similar to FIG. 3A-G where the silicon thickness for the photodetector is <100-400 nm represents another embodiment of this invention. In that embodiment, oxide vias may not be constructed and one could look right through the photodetector layer to observe alignment marks of the read-out circuit layer. This may help making well-aligned through-silicon connections between various layers.

As mentioned previously, FIG. 3A-3G illustrate a process where oxide vias constructed before layer transfer are used to look through photodetector layers to observe alignment marks on the read-out circuit wafer below it. However, an alternative embodiment of this invention may involve constructing oxide vias after layer transfer. Essentially, after layer transfer of structures without oxide vias, oxide vias whose diameters are larger than the maximum misalignment of the bonding/alignment scheme are formed. This order of sequences may enable observation of alignment marks on the bottom read-out circuit wafer by looking through the photodetector wafer.

While Silicon has been suggested as the material for the photodetector layer of FIG. 3A-G, Germanium could be used in an alternative embodiment. The advantage of Germanium is that it is sensitive to infra-red wavelengths as well. However, Germanium also suffers from high dark current.

While FIG. 3A-G described a single p-n junction as the photodetector, it will be obvious to one skilled in the art based on the present disclosure that multiple p-n junctions can be formed one on top of each other, as described in "Color Separation in an Active Pixel Cell Imaging Array Using a Triple-Well Structure," U.S. Pat. No. 5,965,875, 1999 by R. Merrill and in "Trends in CMOS Image Sensor Technology and Design," International Electron Devices Meeting Digest of Technical Papers, 2002 by A. El-Gamal. This concept relies on the fact that different wavelengths of light penetrate to different thicknesses of silicon, as described in FIG. 4. It can be observed in FIG. 4 that near the surface 400 nm wavelength light has much higher absorption per unit depth than 450 nm-650 nm wavelength light. On the other hand, at a depth of 0.5 μm, 500 nm light has a higher absorption per unit depth than 400 nm light. An advantage of this approach is that one does not require separate filters (and area) for green, red and blue light; all these different colors/wavelengths of light can be detected with different p-n junctions stacked atop each other. So, the net area required for detecting three different colors of light is reduced, leading to an improvement of resolution.

Figure 5A:
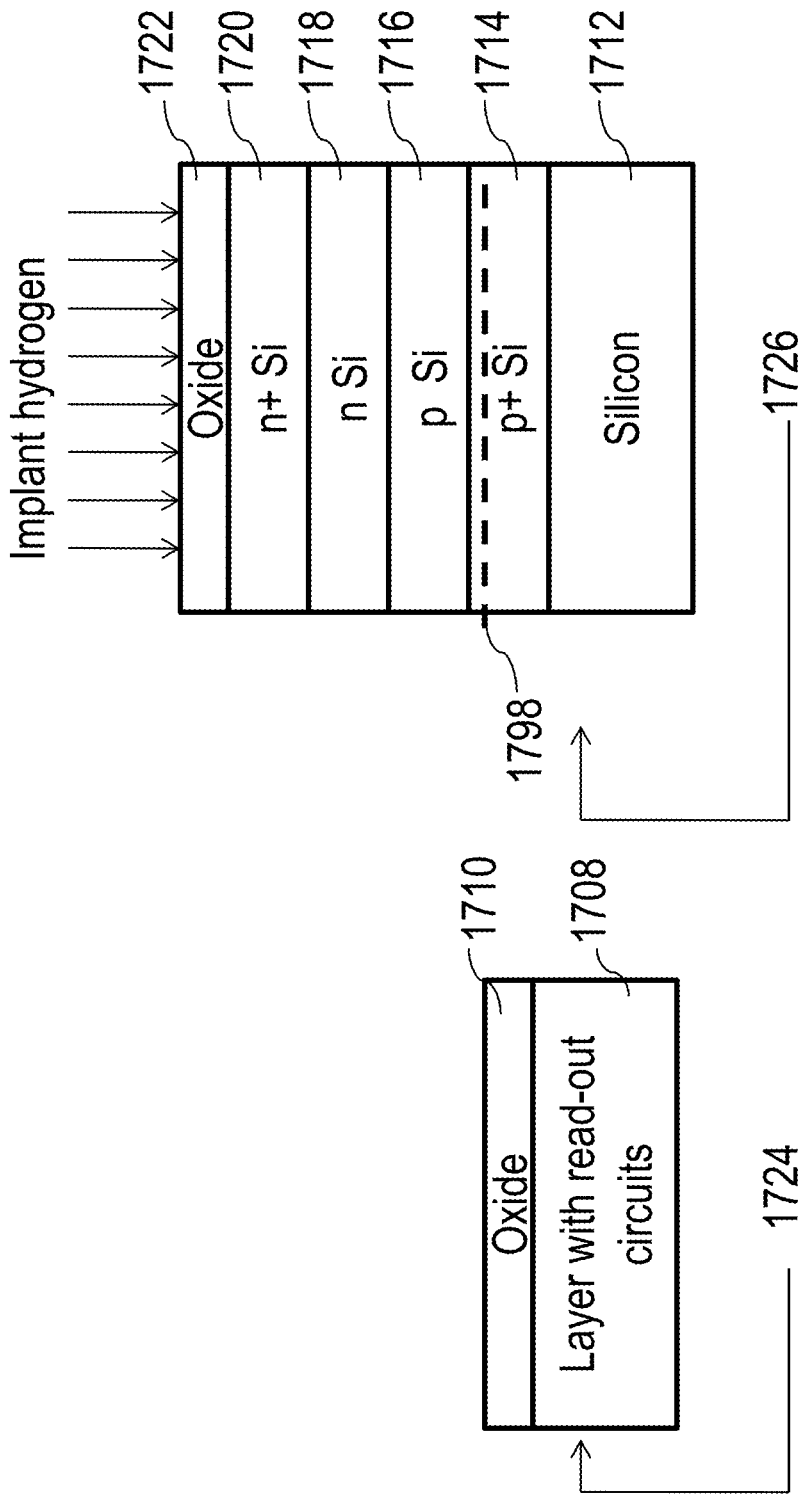
FIG. 5A-5B illustrate an embodiment of this invention, where red, green and blue photodetectors are stacked monolithically atop read-out circuits using ion-cut technology (for an image sensor)
Figure 5B:
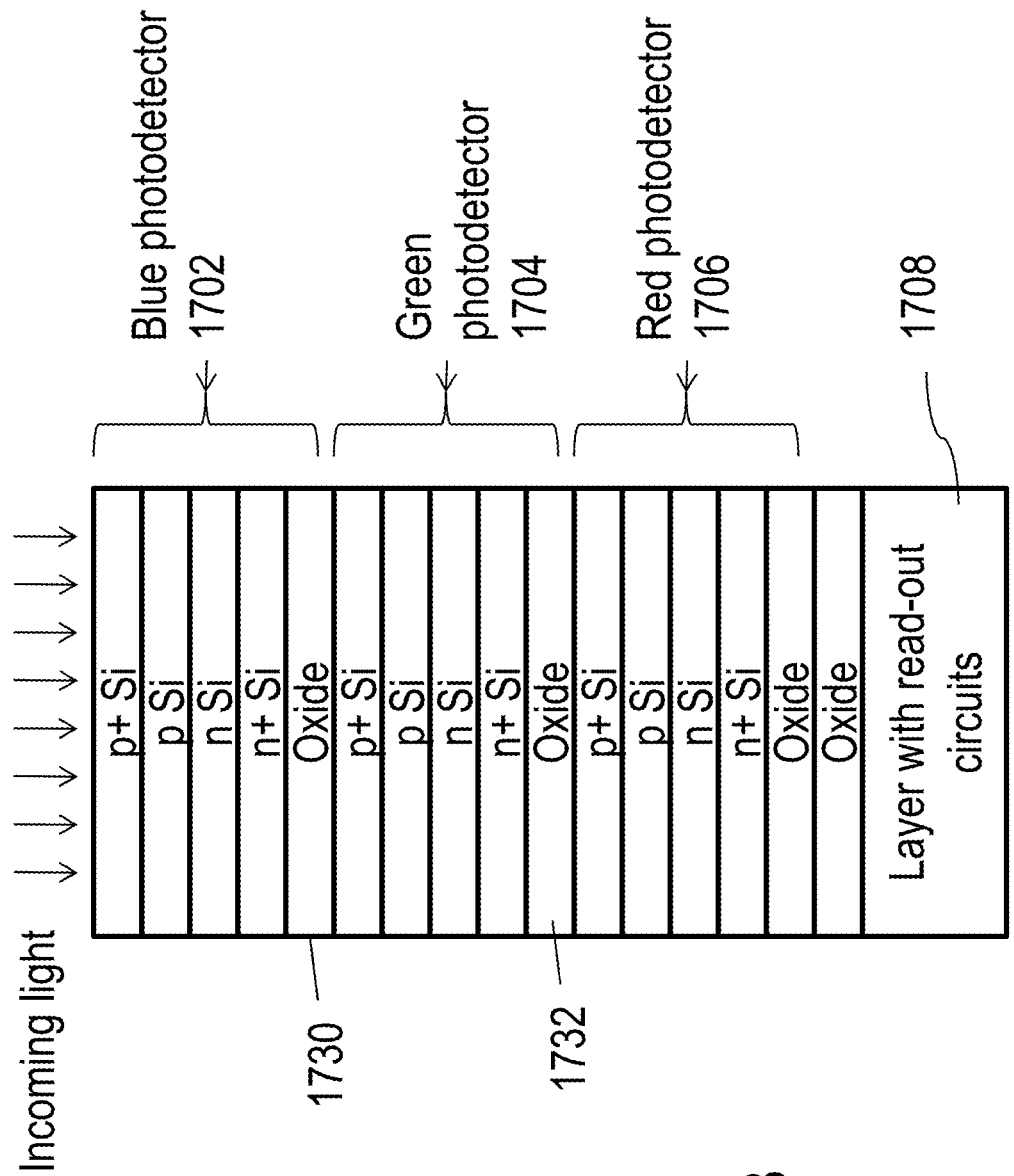

FIG. 5A-5B illustrate an embodiment of this invention, where red, green, and blue photodetectors are stacked monolithically atop read-out circuits using ion-cut technology (for an image sensor). Therefore, a smart layer transfer technique is utilized. FIG. 5A shows the first step for constructing this image sensor. 1724 shows a cross-sectional view of 1708, a silicon wafer with read-out circuits constructed on it, above which an oxide layer 1710 is deposited. 1726 shows the cross-sectional view of another wafer 1712 which has a p+ Silicon layer 1714, a p Silicon layer 1716, a n Silicon layer 1718, a n+ Silicon layer 1720, and an oxide layer 1722. These layers are formed using procedures similar to those described in FIG. 3A-G. An anneal is then performed to activate dopants in various layers. Hydrogen is implanted in the wafer at a certain depth depicted by 1798. FIG. 5B shows the structure of the image sensor before contact formation. Three layers of p+pnn+ silicon (each corresponding to a color band and similar to the one depicted in 1726 in FIG. 5A) are layer transferred sequentially atop the silicon wafer with read-out circuits (depicted by 1724 in FIG. 5A). Three different layer transfer steps may be used for this purpose. Procedures for layer transfer and alignment for forming the image sensor in FIG. 5B are similar to procedures used for constructing the image sensor shown in FIGS. 15A-G. Each of the three layers of p+pnn+ silicon senses a different wavelength of light. For example, blue light is detected by blue photodetector 1702, green light is detected by green photodetector 1704, and red light is detected by red photodetector 1706. Contacts, metallization, packaging and other steps are done to the structure shown in FIG. 5B to form an image sensor. The oxides 1730 and 1732 could be either transparent conducting oxides or silicon dioxide. Use of transparent conducting oxides could allow fewer contacts to be formed.

Figure 6A:
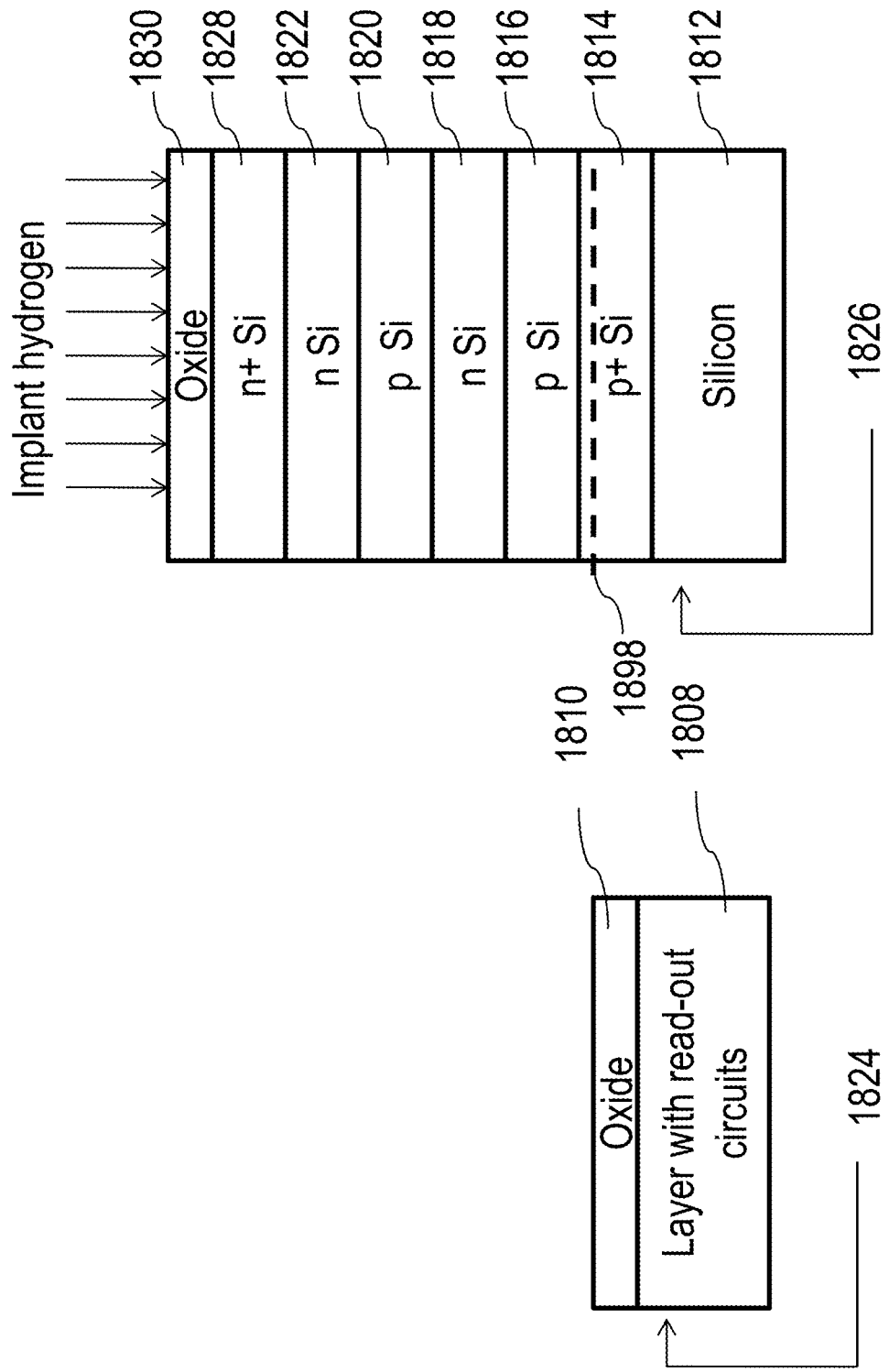
FIG. 6A-6B illustrate an embodiment of this invention, where red, green and blue photodetectors are stacked monolithically atop read-out circuits using ion-cut technology for a different configuration (for an image sensor)
Figure 6B:
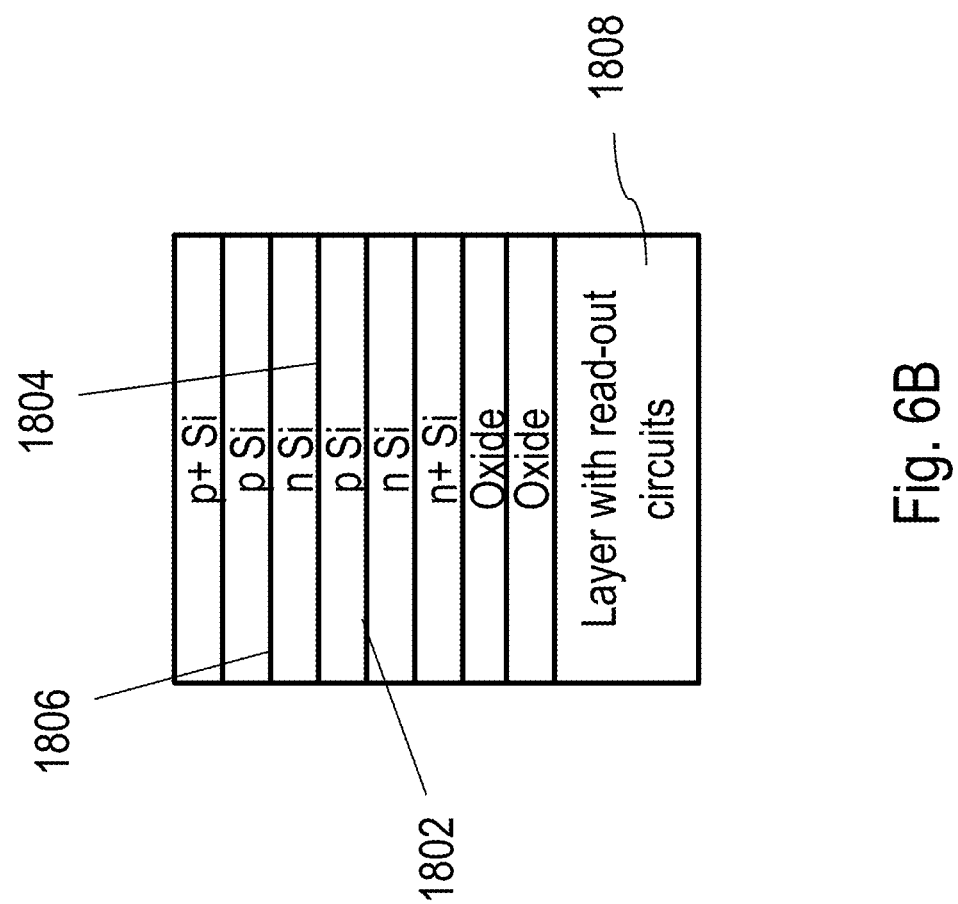

FIG. 6A-6B show another embodiment of this invention, where red, green and blue photodetectors are stacked monolithically atop read-out circuits using ion-cut technology (for an image sensor) using a different configuration. Therefore, a smart layer transfer technique is utilized. FIG. 6A shows the first step for constructing this image sensor. 1824 shows a cross-section of 1808, a silicon wafer with read-out circuits constructed on it, above which an oxide layer 1810 is deposited. 1826 shows the cross-sectional view of another wafer 1812 which has a p+ Silicon layer 1814, a p Silicon layer 1816, a n Silicon layer 1818, a p Silicon layer 1820, a n Silicon layer 1822, a n+ Silicon layer 1828 and an oxide layer 1830. These layers may be formed using procedures similar to those described in FIG. 3A-3G. An anneal is then performed to activate dopants in various layers. Hydrogen is implanted in the wafer at a certain depth depicted by 1898. FIG. 6B shows the structure of the image sensor before contact formation. A layer of p+pnpnn+ (similar to the one depicted in 1826 in FIG. 6A) is layer transferred sequentially atop the silicon wafer with read-out circuits (depicted by 1824 in FIG. 6A). Procedures for layer transfer and alignment for forming the image sensor in FIG. 6B are similar to procedures used for constructing the image sensor shown in FIG. 3A-3G. Contacts, metallization, packaging and other steps are done to the structure shown in FIG. 6B to form an image sensor. Three different pn junctions, denoted by 1802, 1804 and 1806 may be formed in the image sensor to detect different wavelengths of light.

Figure 7A:
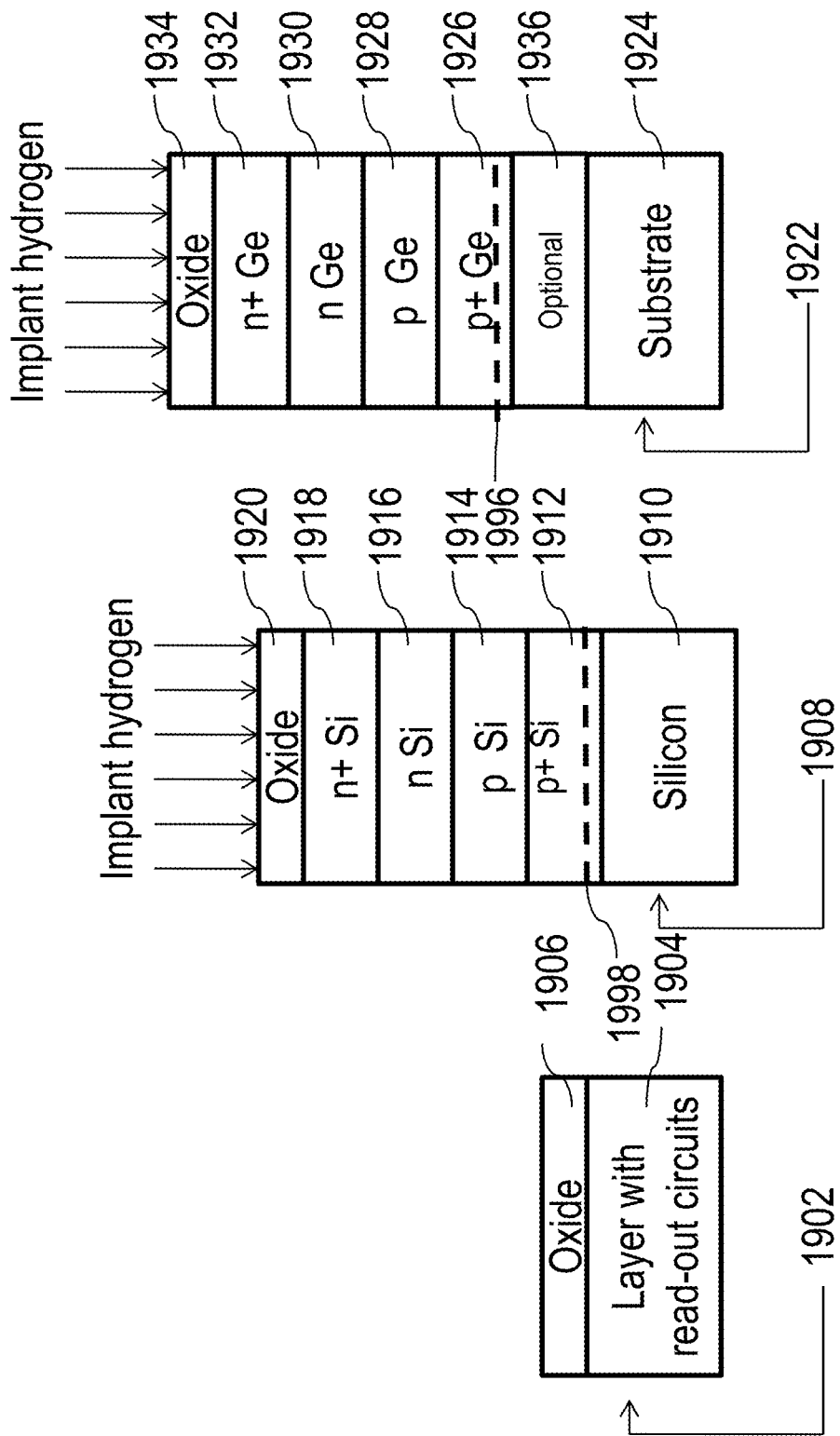

FIG. 7A-7B show another embodiment of this invention, where an image sensor that can detect both visible and infra-red light is depicted. Such image sensors could be useful for taking photographs in both day and night settings (without necessarily requiring a flash). This embodiment makes use of the fact that while silicon is not sensitive to infra-red light, other materials such as Germanium and Indium Gallium Arsenide are. A smart layer transfer technique is utilized for this embodiment. FIG. 7A shows the first step for constructing this image sensor. 1902 shows a cross-sectional view of 1904, a silicon wafer with read-out circuits constructed on it, above which an oxide layer 1906 is deposited. 1908 shows the cross-sectional view of another wafer 1910 which has a p+ Silicon layer 1912, a p Silicon layer 1914, a n Silicon layer 1916, a n+ Silicon layer 1918 and an oxide layer 1720. These layers may be formed using procedures similar to those described in FIG. 3A-3G. An anneal is then performed to activate dopants in various layers. Hydrogen is implanted in the wafer at a certain depth depicted by 1998. 1922 shows the cross-sectional view of another wafer which has a substrate 1924, an optional buffer layer 1936, a p+ Germanium layer 1926, a p Germanium layer 1928, a n Germanium layer 1932, a n+ Germanium layer 1932 and an oxide layer 1934. These layers are formed using procedures similar to those described in FIGS. 3A-3G. An anneal is then performed to activate dopants in various layers. Hydrogen is implanted in the wafer at a certain depth depicted by 1996. Examples of materials used for the structure 1922 include a Germanium substrate for 1924, no buffer layer and multiple Germanium layers. Alternatively, a Indium Phosphide substrate could be used for 1924 when the layers 1926, 1924, 1922 and 1920 are constructed of InGaAs instead of Germanium. FIG. 7B shows the structure of this embodiment of the invention before contacts and metallization are constructed. The p+pnn+ Germanium layers of structure 1922 of FIG. 7A are layer transferred atop the read-out circuit layer of structure 1902. This is done using smart layer transfer procedures similar to those described in respect to FIG. 3A-3G. Following this, multiple p+pnn+ layers similar to those used in structure 1908 are layer transferred atop the read-out circuit layer and Germanium photodetector layer (using three different layer transfer steps). This, again, is done using procedures similar to those described in FIG. 3A-3G. The structure shown in FIG. 7B therefore has a layer of read-out circuits 1904, above which an infra-red photodetector 1944, a red photodetector 1942, a green photodetector 1940 and a blue photodetector 1938 are present. Procedures for layer transfer and alignment for forming the image sensor in FIG. 7B are similar to procedures used for constructing the image sensor shown in FIG. 3A-3G. Each of the p+pnn+ layers senses a different wavelength of light. Contacts, metallization, packaging and other steps are done to the structure shown in FIG. 7B to form an image sensor. The oxides 1946, 1948, and 1950 could be either transparent conducting oxides or silicon dioxide. Use of transparent conducting oxides could allow fewer contacts to be formed.

Figure 8A:
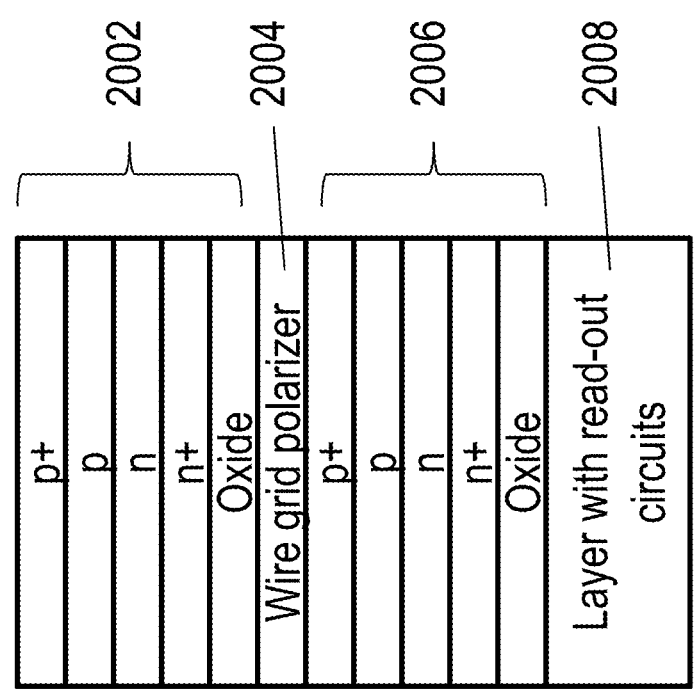
FIG. 8A illustrates an embodiment of this invention, where polarization of incoming light is detected.

FIG. 8A describes another embodiment of this invention, where polarization of incoming light can be detected. The p-n junction photodetector 2006 detects light that has passed through a wire grid polarizer 2004. Details of wire grid polarizers are described in "Fabrication of a 50 nm half-pitch wire grid polarizer using nanoimprint lithography." Nanotechnology 16 (9): 1874-1877, 2005 by Ahn, S. W.; K. D. Lee, J. S. Kim, S. H. Kim, J. D. Park, S. H. Lee, P. W. Yoon. The wire grid polarizer 2004 absorbs one plane of polarization of the incident light, and may enable detection of other planes of polarization by the p-n junction photodetector 2006. The p-n junction photodetector 2002 detects all planes of polarization for the incident light, while 2006 detects the planes of polarization that are not absorbed by the wire grid polarizer 2004. One can thereby determine polarization information from incoming light by combining results from photodetectors 2002 and 2006. The device described in FIG. 8A can be fabricated by first constructing a silicon wafer with transistor circuits 2008, following which the p-n junction photodetector 2006 can be constructed with the low-temperature layer transfer techniques described in FIG. 3A-3G. Following this construction of p-n junction photodetector 2006, the wire grid polarizer 2004 may be constructed using standard integrated circuit metallization methods. The photodetector 2002 can then be constructed by another low-temperature layer transfer process as described in FIG. 3A-3G. One skilled in the art, based on the present disclosure, can appreciate that low-temperature layer transfer techniques are critical to build this device, since semiconductor layers in 2002 are built atop metallization layers required for the wire grid polarizer 2004. Thickness of the photodetector layers 2002 and 2006 may be preferably less than 5 μm. An example with polarization detection where the photodetector has other pre-processed optical interaction layers (such as a wire grid polarizer) has been described herein. However, other devices for determining parameters of incoming light (such as phase) may be constructed with layer transfer techniques.

Figure 8B:
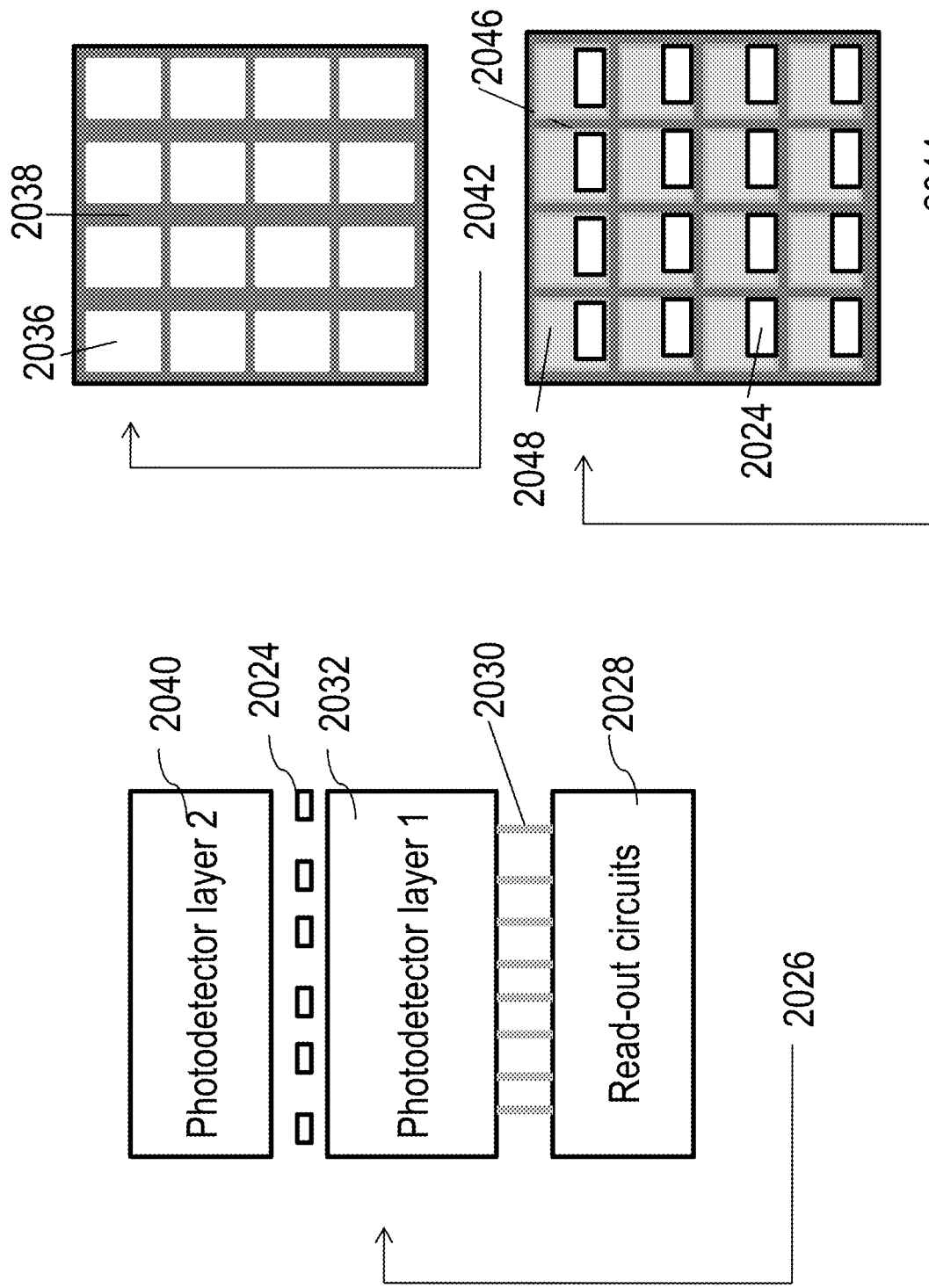
FIG. 8B illustrates another embodiment of this invention, where an image sensor with high dynamic range is constructed.

One of the common issues with taking photographs with image sensors is that in scenes with both bright and dark areas, while the exposure duration or shutter time could be set high enough to get enough photons in the dark areas to reduce noise, picture quality in bright areas degrades due to saturation of the photodetectors' characteristics. This issue is with the dynamic range of the image sensor, i.e. there is a tradeoff between picture quality in dark and bright areas. FIG. 8B shows an embodiment of this invention, where higher dynamic range can be reached. According the embodiment of FIG. 8B, two layers of photodetectors 2032 and 2040, could be stacked atop a read-out circuit layer 2028. 2026 is a schematic of the architecture. Connections 2030 run between the photodetector layers 2032 and 2040 and the read-out circuit layer 2028. 2024 are reflective metal lines that block light from reaching part of the bottom photodetector layer 2032. 2042 is a top view of the photodetector layer 2040. Photodetectors 2036 could be present, with isolation regions 2038 between them. 2044 is a top view of the photodetector layer 2032 and the metal lines 2024. Photodetectors 2048 are present, with isolation regions 2046 between them. A portion of the photodetectors 2048 can be seen to be blocked by metal lines 2024. Brighter portions of an image can be captured with photodetectors 2048, while darker portions of an image can be captured with photodetectors 2036. The metal lines 2024 positioned in the stack may substantially reduce the number of photons (from brighter portions of the image) reaching the bottom photodetectors 2048. This reduction in number of photons reaching the bottom photodetectors 2048 helps keep the dynamic range high. Read-out signals coming from both dark and bright portions of the photodetectors could be used to get the final picture from the image sensor.

Figure 9:
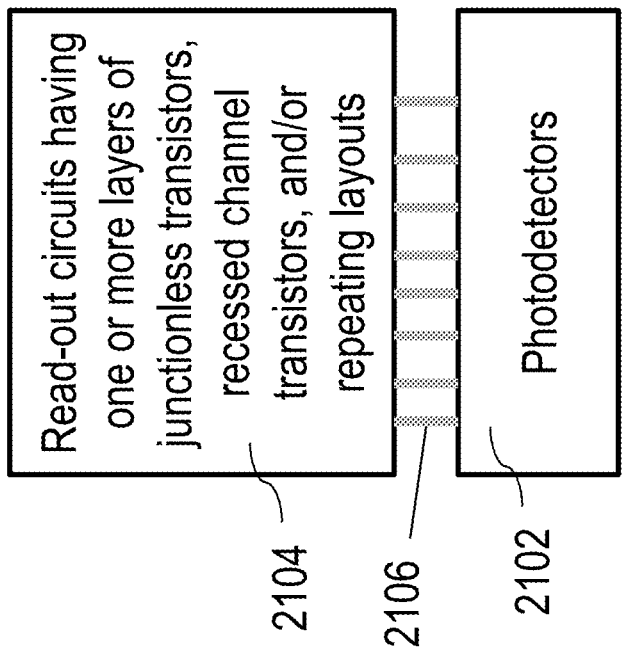
FIG. 9 illustrates an embodiment of this invention, where read-out circuits are constructed monolithically above photodetectors in an image sensor.

FIG. 9 illustrates another embodiment of this invention where a read-out circuit layer 2104 is monolithically stacked above the photodetector layer 2102 at a temperature approximately less than 400° C. Connections 2106 are formed between these two layers. Procedures for stacking high-quality monocrystalline transistor circuits and wires at temperatures approximately less than 400° C. using layer transfer are described in pending U.S. patent application Ser. No. 12/901,890, now U.S. Pat. No. 8,026,521, by the inventors of this patent application, the contents of which are incorporated by reference. The stacked layers could use junction-less transistors, recessed channel transistors, repeating layouts or other devices/techniques described in U.S. patent application Ser. No. 12/901,890 the content of which is incorporated by reference. The embodiments of this invention described in FIG. 2-FIG. 9 may share a few common features. They can have multiple stacked (or overlying) layers, use one or more photodetector layers (terms photodetector layers and image sensor layers are often used interchangeably), thickness of at least one of the stacked layers is less than 5 microns and construction can be done with smart layer transfer techniques and are stacking is done at temperatures approximately less than 450° C.

Confocal 3D Microscopy with Screen Made of Stacked Arrays of Modulators:

Confocal Microscopy is a method by which 3D image information from a specimen is preserved. Typically, confocal microscopy is used in conjunction with the technique of inducing florescence from the specimen by shining laser light upon it. The laser light is absorbed by the specimen which then re-emits the light at a lower energy level (longer wavelength). This secondary light or florescence is then imaged by the confocal microscopy system.

Figure 10A:
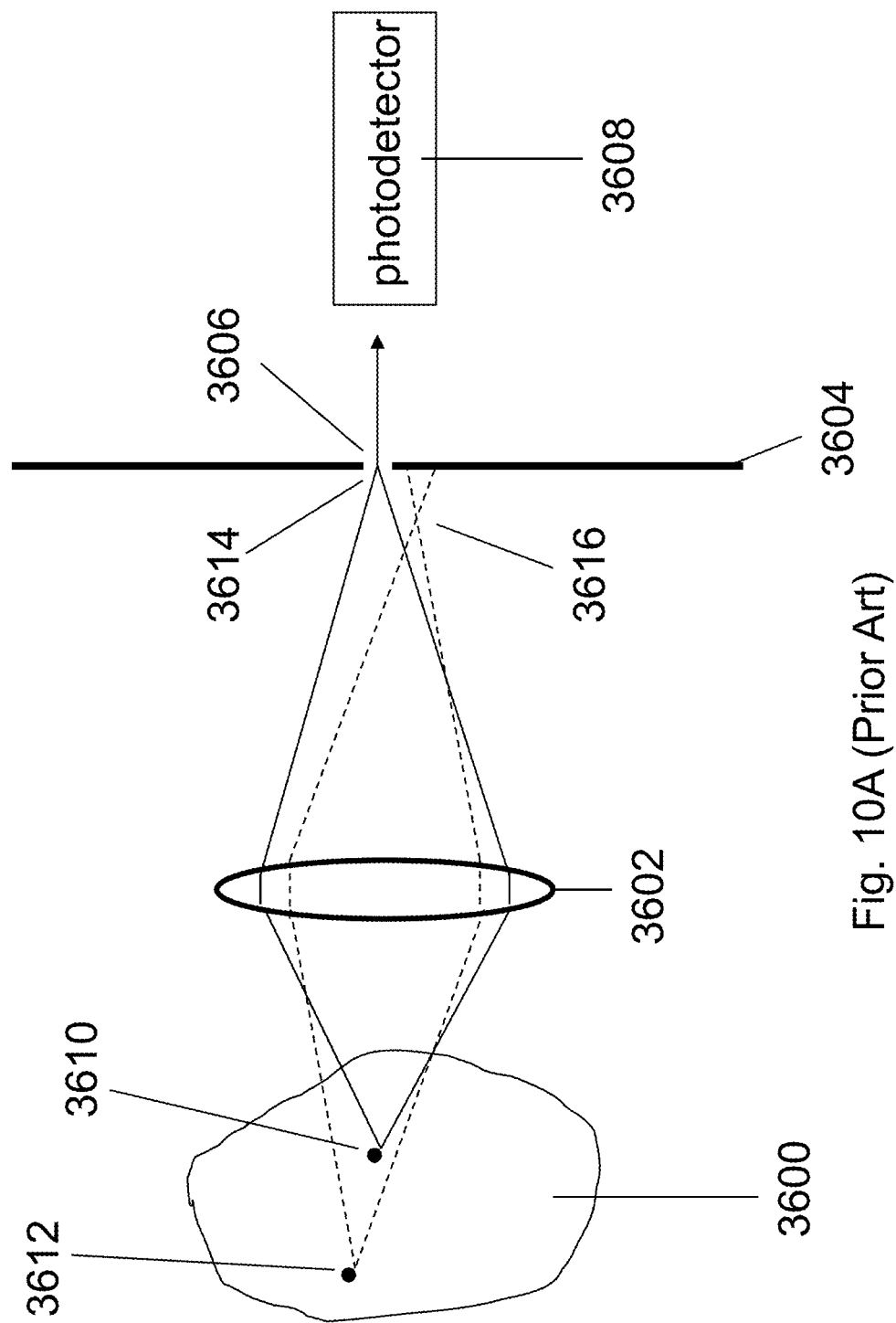
FIG. 10A-10B illustrate a comparison between a typical confocal microscopy technique (prior art) and another confocal microscopy technique with an electronic screen constructed with stacks of modulators.

FIG. 10A illustrates a side cross-sectional view of a typical microscopy system, wherein the specimen 3600 has been stimulated by laser light (not shown). A lens or lens system 3602 is placed between the specimen and a screen 3604 that has an aperture 3606. Behind the screen, a photo-detector 3608 detects light that has come through the aperture 3606. A point on the specimen 3610, will produce a reciprocal image at the point 3614, which converges at the aperture 3606. The light originally from 3610 then passes through the aperture 3606 and subsequently detected by the photo-detector 3608. Another point on the specimen 3612, will produce a reciprocal image at the point 3616, which converges away from the aperture 3606. Thus, the screen 3604 blocks the light originally from 3612 and so is not sensed by the photo-detector.

By moving the screen and its aperture up, down, left, right, forward, and backward, light from specific points of the specimen are detected and so a 3D image of the specimen can then be reconstructed. Conversely, one may also move the specimen in the same manner instead of the screen to achieve the same objective of scanning the specimen.

The issue with such a scanning scheme is that mechanical scanning is slow and requires more space to allow for the movements. An alternative is to replace the screen with a 3D array of optical modulators that control the passage of light, thus allowing much faster scanning through electronic control.

Figure 10B:
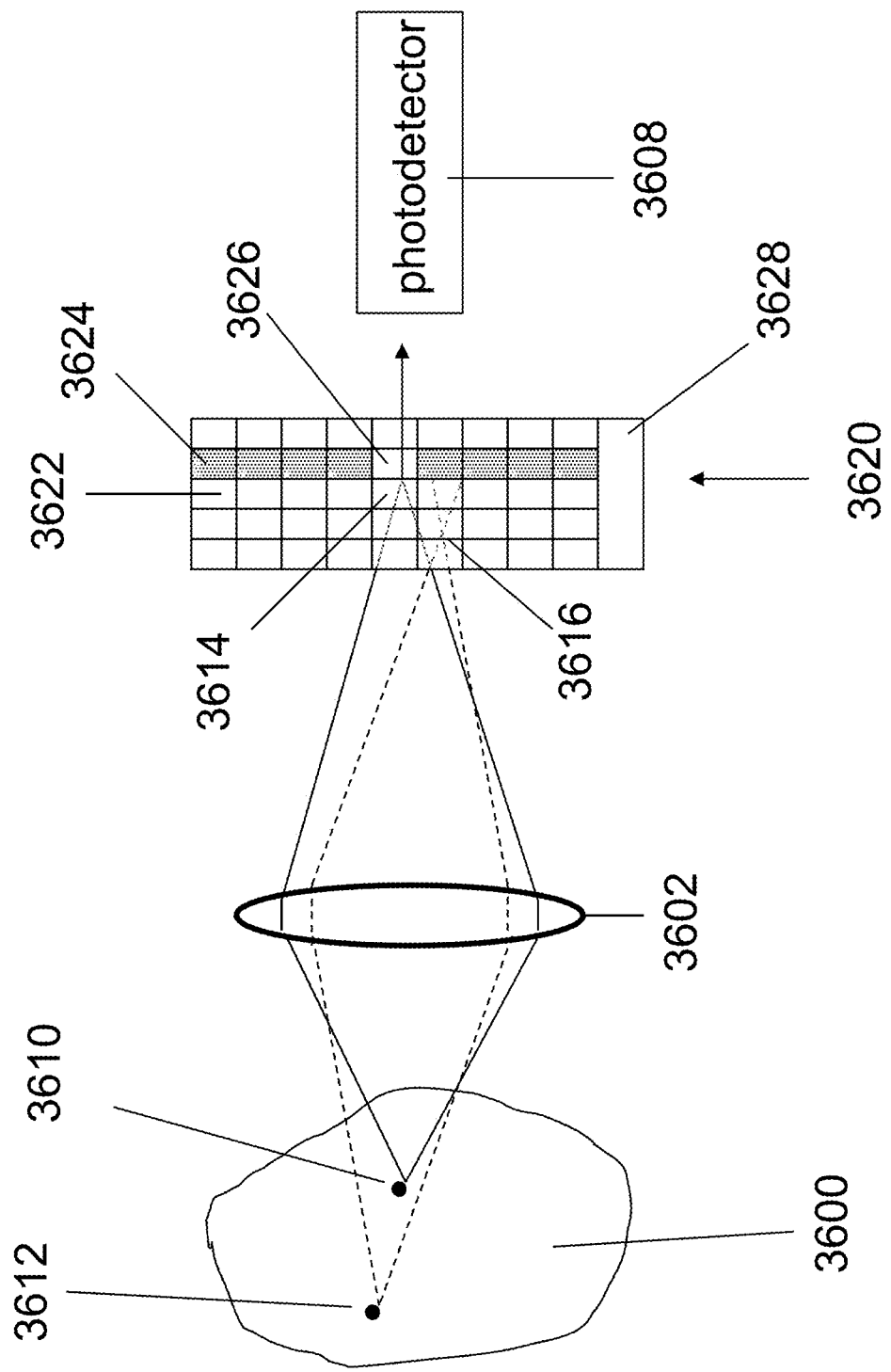

FIG. 10B illustrates confocal microscopy system implemented with a fixed 3D array of optical modulators 3620, where 3600, 3602, 3608, 3610, 3612, 3614, and 3616 are as previously described. The modulators are designed to block and pass the light at a particular wavelength range expected from the florescence of the specimen. By turning on certain arrays of modulators along a plane perpendicular to the lens, for example modulator 3624, which block the light, an effective screen is formed. By leaving the others off, for example modulator 3622, which let the light through, the position of the electronic screen with respect to the lens can be electronically controlled back and forth. The aperture 3626 is formed by leaving a single modulator on the modulator screen stack turned off to allow light through. The aperture 3626 can then be electronically controlled by the control circuits 3628 to scan through the area of the electronic screen by simple selective turning-off of a single modulator on the plane of the electronic screen.

In such manner, a 3D image can be scanned and reconstructed from the images detected by the electronic scanning of the aperture.

Layer transfer technology may be utilized for constructing the layers for a 3D optical modulator array system. A 3D optical modulator system may contain control circuits, and a stack of optical modulators.

FIGS. 36C-36G illustrate an embodiment of this invention, where the control circuit layer 3630, and optical modulator layers 3640 and 3660 are stacked monolithically with layer transfer processes. For purposes of illustration, two optical modulator layers are demonstrated here, but the invention is not limited to such, and may contain as many optical modulator layers as needed.

The process of forming the 3D optical modulator array may include several steps that occur in a sequence from Step A to Step E. Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 10C:
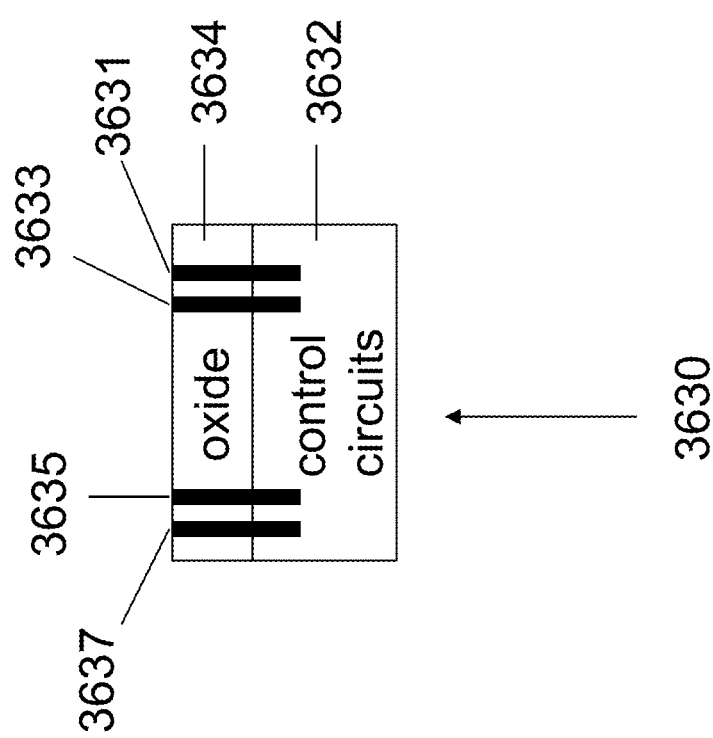
FIG. 10C-10G illustrate an embodiment of this invention where arrays of modulators are monolithically stacked using layer transfer processes.

Step (A): FIG. 10C illustrates the step for making contacts and interconnects (not shown) for connecting terminals of the optical modulators, such as p contacts 3635 and 3637 and n contacts 3631 and 3633, to control circuits 3632 in the silicon wafer substrate. Thus control circuit layer 3630 is formed.

Figure 10D:
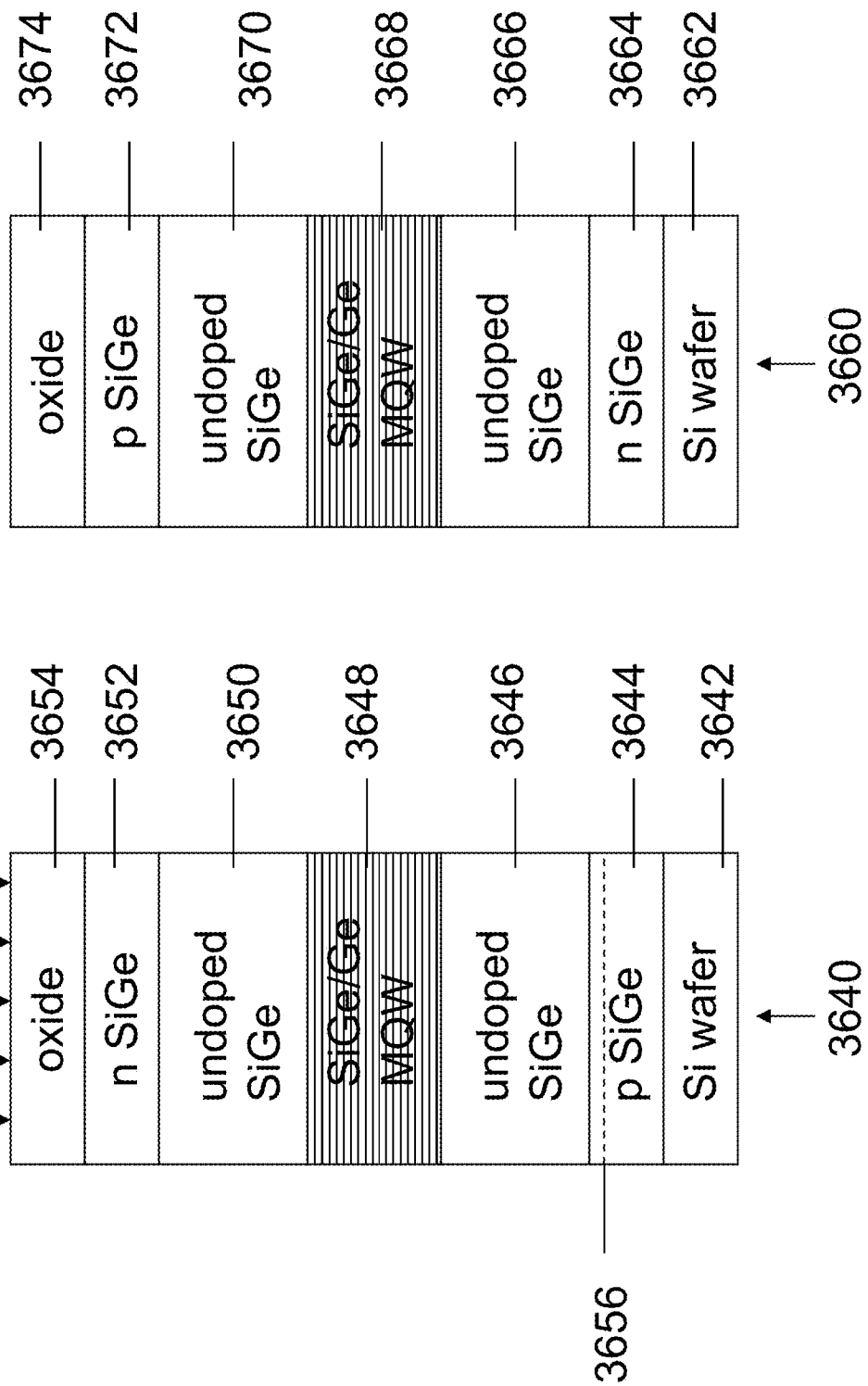

Step (B): FIG. 10D illustrates the cross-sectional views of silicon wafer 3642 and silicon wafer 3662 containing optical modulator 3640 and optical modulator 3660 respectively. The optical modulator 3640 may include silicon wafer 3642, a p-doped Silicon-Germanium (SiGe) layer 3644, an undoped SiGe layer 3646, a SiGe Multiple Quantum Well layer 3648, an undoped SiGe layer 3650, a n-doped SiGe layer 3652, and an oxide layer 3654. These layers may be formed using procedures similar to those described in FIG. 32C. An anneal may then be performed to activate dopants in various layers. Hydrogen may be implanted in the wafer at a certain depth depicted by dashed line 3656. The optical modulator 3660 may include silicon wafer 3662, a n-doped Silicon-Germanium (SiGe) layer 3664, an undoped SiGe layer 3666, a SiGe Multiple Quantum Well layer 3668, an undoped SiGe layer 3670, a p-doped SiGe layer 3672, and an oxide layer 3674. These layers may be formed using procedures similar to those described in FIG. 32C. An anneal may then be performed to activate dopants in various layers.

Figure 10E:
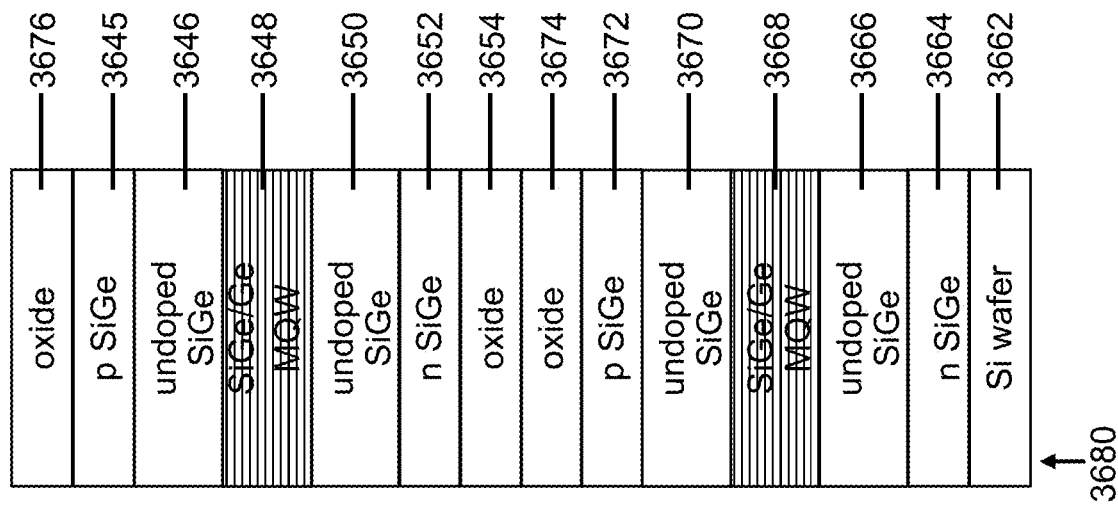

Step (C): FIG. 10E illustrates the two optical modulator layers formed by layer transfer. The optical modulator layer 3640 may be layer transferred atop the silicon wafer 3662 with optical modulator layer 3660 wherein oxide layer 3654 may be bonded to oxide layer 3674, and the p-SiGe layer 3645 may be a result of the cleave and polish operations. Procedures for layer transfer and alignment for forming the structure in FIG. 10E are similar to procedures used for constructing the optical modulator layer shown in FIG. 32C of parent Ser. No. 13/272,161, now U.S. Pat. No. 9,197,804. An oxide layer 3676 may be deposited on top of the p-SiGe layer 3645.

Figure 10F:
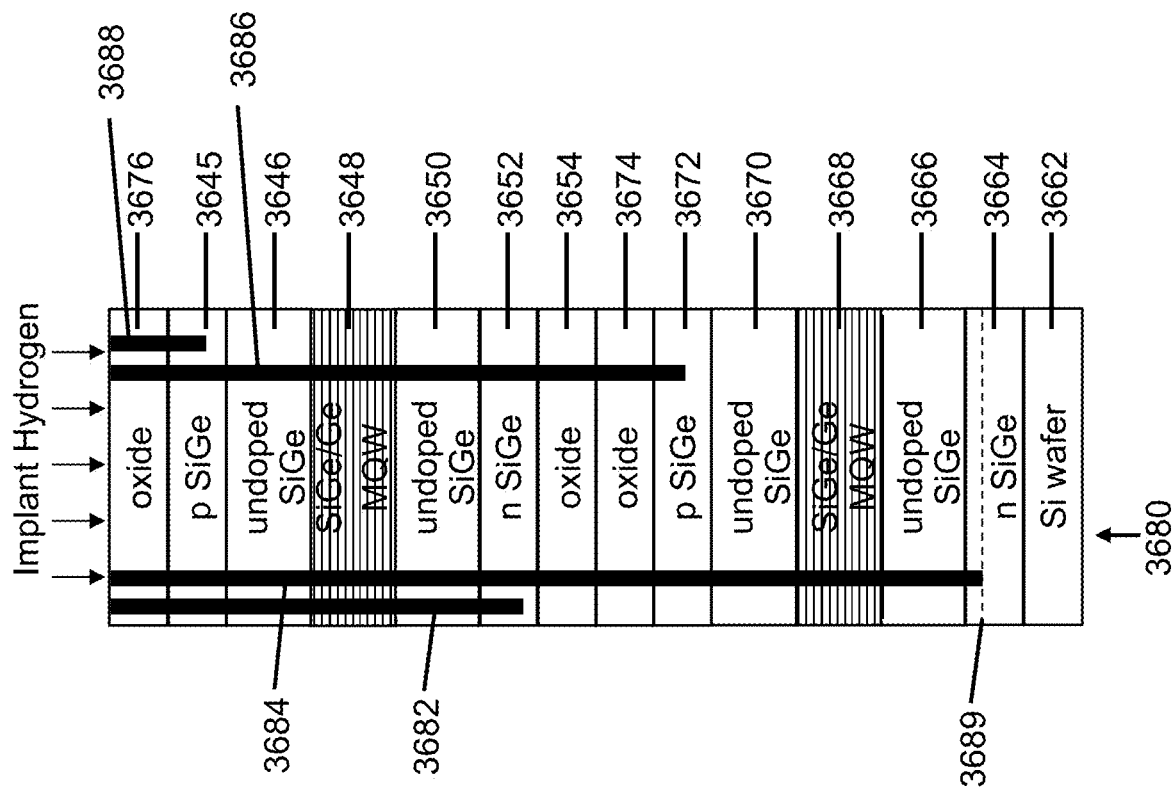

Step (D) is illustrated in FIG. 10F. Connections are made to the terminals of the optical modulators by lithographic, etch, and fill operations similar to those described in FIGS. 3A-3G and are indicated as p contacts 3682 and 3684, and n contacts 3686 and 3688. Various elements of FIG. 10F such as 3645, 3646, 3648, 3650, 3652, 3654, 3662, 3664, 3666, 3668, 3670, 3672, 3674, and 3676 have been described previously.

As described previously, FIGS. 3A-3G illustrate a process where oxide vias constructed before layer transfer may be used to look through one optical modulator layers to observe alignment marks on the other optical modulator wafer below it. However, an alternative embodiment of this invention may involve constructing oxide vias after layer transfer. Essentially, after layer transfer of structures without oxide vias, oxide vias whose diameters are larger than the maximum misalignment of the bonding/alignment scheme may be formed. This order of sequences may enable observation of alignment marks on the bottom control circuit wafer by looking through the optical modulator wafer.

Hydrogen may be implanted in the wafer at a certain depth depicted by dashed line 3689.

Steps (B)-(D) may be repeated as often as needed to stack as many optical modulator layers as necessary.

Figure 10G:
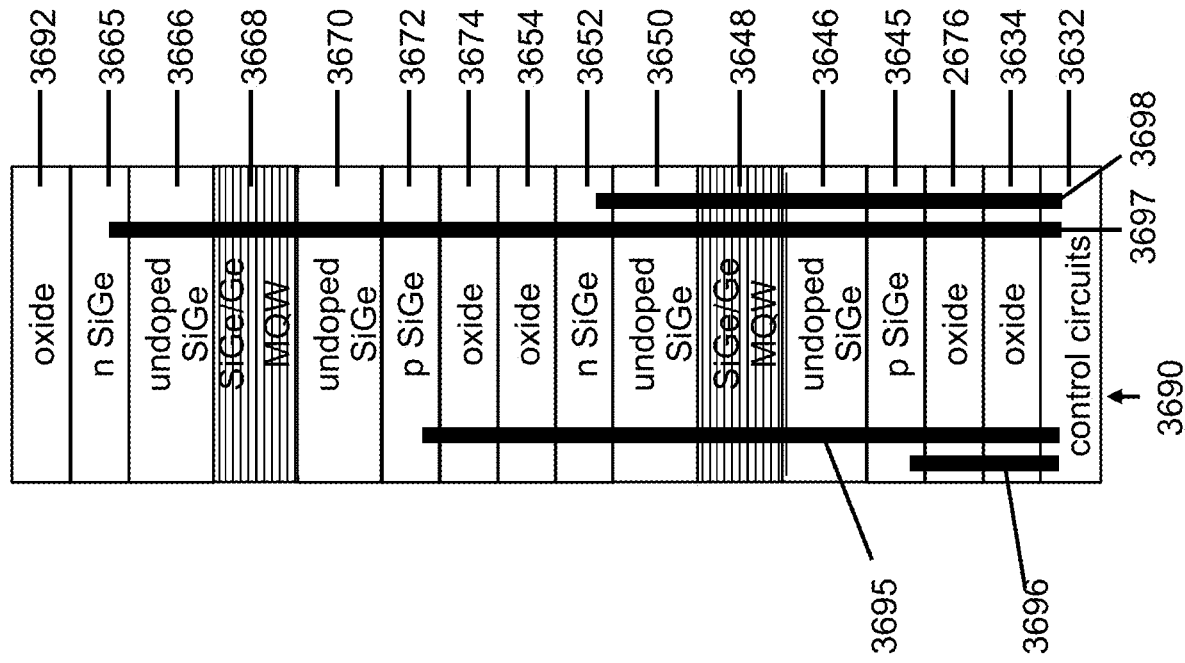

Step (E) is illustrated in FIG. 10G. The two-layer optical modulator stack 3680 may be layer transferred atop the silicon wafer with control circuit layer 3630 to form the structure 3690, wherein oxide layer 3634 may be bonded to oxide layer 3676, and the n-SiGe layer 3665 may be a result of the cleave and polish operations. Procedures for layer transfer and alignment for forming the structure in FIG. 10G are similar to procedures used for constructing the optical modulator layer shown in FIG. 32C of parent Ser. No. 13/272,161, now U.S. Pat. No. 9,197,804. An oxide layer 3692 may be deposited on top of the n-SiGe layer 3665. As previously in Step (C), alignments are made to the terminals of the optical modulators and control circuits to form the connections to the p contacts 3695 and 3696, and to the n contacts 3697 and 3698. The functionality of the optical modulators may be tested at this point.

Various elements of FIG. 10G such as 3632, 3634, 3645, 3646, 3648, 3650, 3652, 3654, 3665, 3666, 3668, 3670, 3672, 3674, and 3676 have been described previously.

Persons of ordinary skill in the art will appreciate that while Silicon and Germanium have been suggested as the material for the optical modulator layers of FIG. 10D, any other appropriate III-V semiconductor material like GaAs, InGaAsP could be utilized. Moreover, the optical modulator layer 3650 is denoted as a p-i-MQW-i-n layer; however, a single quantum well configuration could be used instead of a multiple quantum well configuration such as the shown multiple quantum well layers 3648 and 3668. Furthermore, the thickness of the optical modulator layer may be typically less than approximately 100 nm, but may also be greater. Thus the invention is to be limited only by the appended claims.

CCD Sensor with Parallel Readout Circuits

The main issue with CCD technology is the sequential shifting of image information from cell to cell is slow and limits the speed and cell density of CCD image sensors. A potential solution is to put the readout circuits directly under each CCD cell, so that the information is read in parallel rather than in time sequence, thus removing the shifting delay entirely.

Figure 11A:
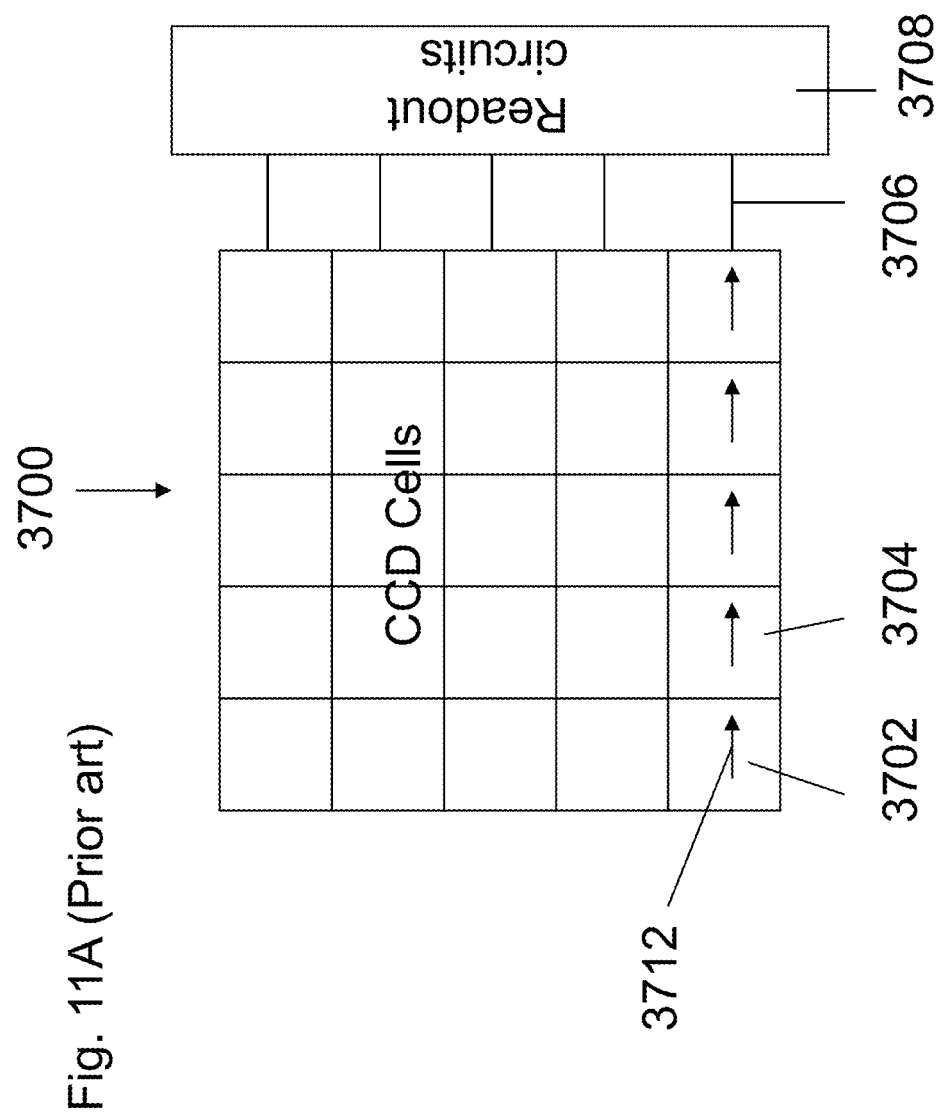
FIG. 11A-11B illustrate the operational processes behind using an array of CCDs as an image sensor (prior art)

FIG. 11A illustrates a typical CCD system; where there is a CCD array 3700 exposed to light, readout circuits 3708, and connections to the readout circuits 3706. The movement 3712 of the charges from CCD cell 3702 to CCD cell 3704 and so on is shown for instance.

Figure 11B:
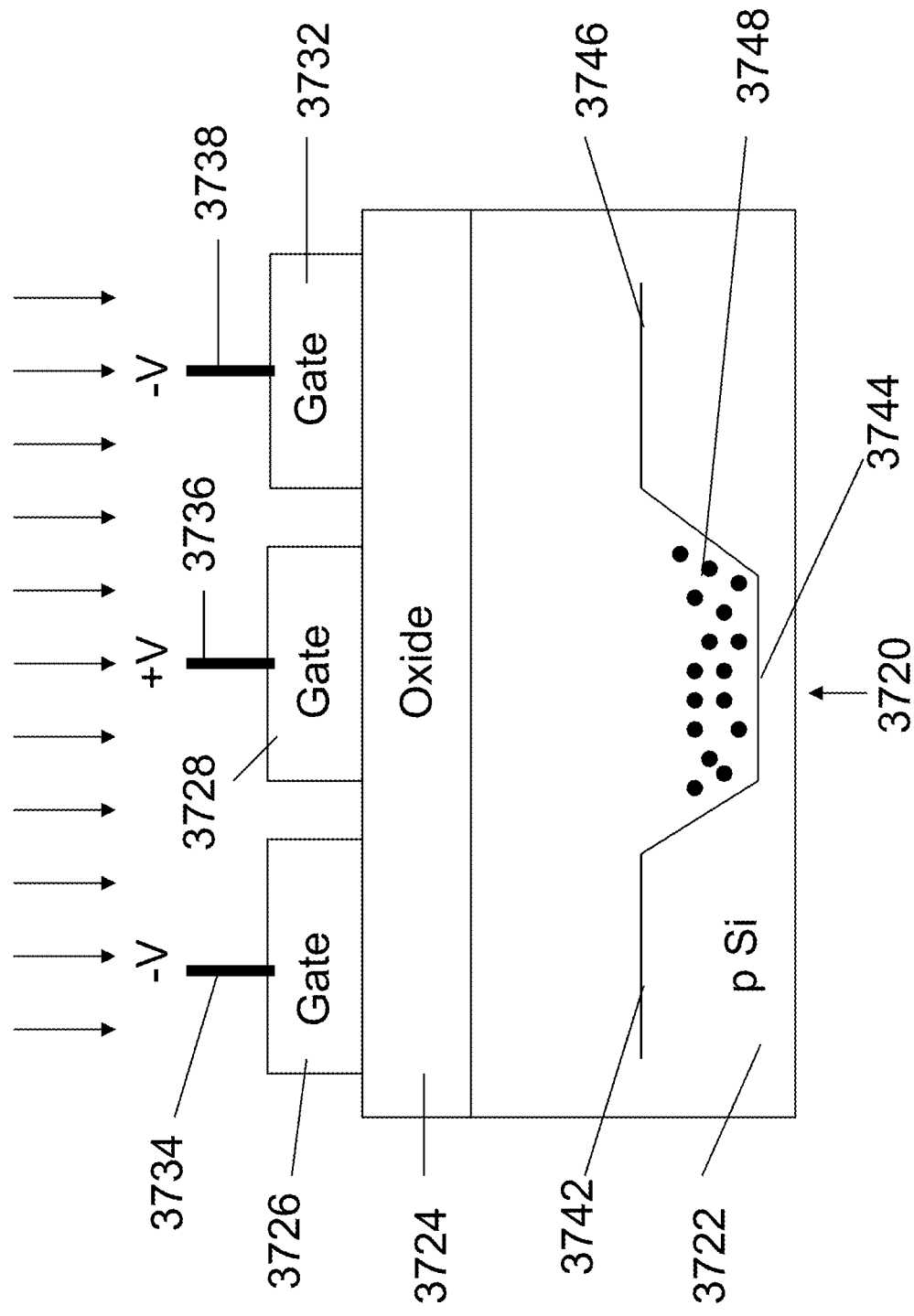

FIG. 11B illustrates a typical CCD structure 3720 shown here as a set of three adjacent MOS capacitor devices with corresponding gates 3726, 3728, and 3732. For this demonstration, electrons are chosen as the charges of operation, and so a p-type Si substrate 3722 is used. An incident light generates electron-hole pairs in the p-type Si substrate 3722. On top of the substrate is an oxide layer 3724, and above this are three separate gates 3726, 3728, 3732, with respective contacts 3734, 3736, 3738. In this demonstration, by applying negative voltage biases to contacts 3734 and 3738, electron potential barriers 3742 and 3746 are formed in the p-type Si substrate 3722 underneath gates 3726 and 3732. By applying positive voltage bias to contact 3736, an electron potential well 3744 is formed in the p-type Si substrate 3722 underneath gate 3728. Electrons 3748 can then be collected underneath gate 3728 under these bias conditions. By a time sequence of positive and negative voltage biases on gates 3726, 3728, and 3738, the existence or non-existence of charges under specific gates can be transmitted to adjacent gates by the method known as charge shifting.

Instead of shifting charges one-by-one, the data can be read in parallel by a readout circuit constructed underneath the CCD sensor. Layer transfer technology may be utilized for constructing the layers for a stacked CCD with underlying readout circuits.

FIGS. 11C-11F illustrate an embodiment of this invention, where the readout circuit layer 3750, and CCD layer 3760 are stacked monolithically with layer transfer.

The process of forming the CCD-control circuit stack may include several steps that occur in a sequence from Step A to Step D. Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A): FIG. 11C illustrates the step for making contacts, such as contact 3756, and interconnects (not shown) for connecting the p-type substrate 3762 of the CCD cell to the readout circuits 3752 in the silicon wafer substrate. Thus readout circuit layer 3750 is formed.

Figure 11D:
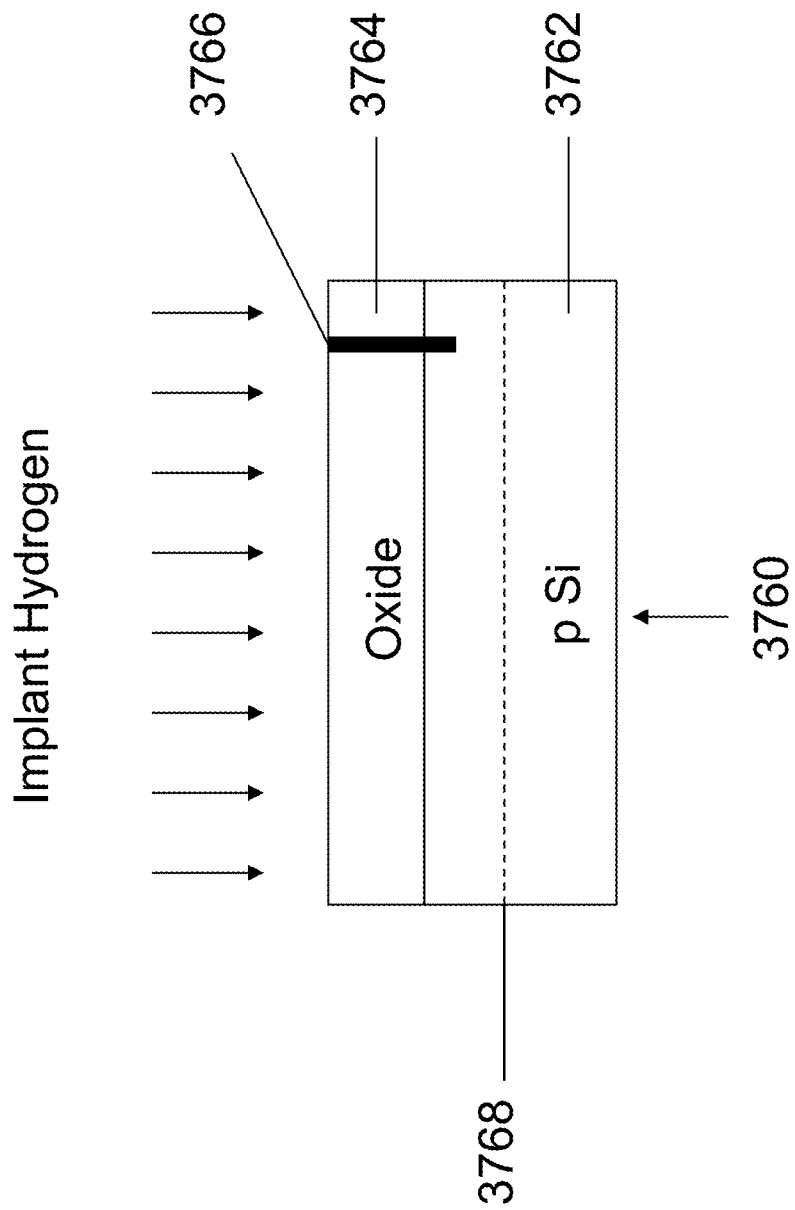

Step (B): FIG. 11D illustrates the cross-sectional view of a Silicon wafer with p-type substrate 3762 and oxide layer 3764. An implant and anneal process for CCD cell optimization may then be performed to deposit and activate dopants at various sites of the p-type Si substrate 3762. Hydrogen may be implanted in the wafer at a certain depth depicted by dashed line 3768.

A connections is made to the p-type Si substrate 3762 by lithographic, etch, and fill operations similar to those described in FIG. 3A-3G and is indicated here as 3766.

Figure 11E:
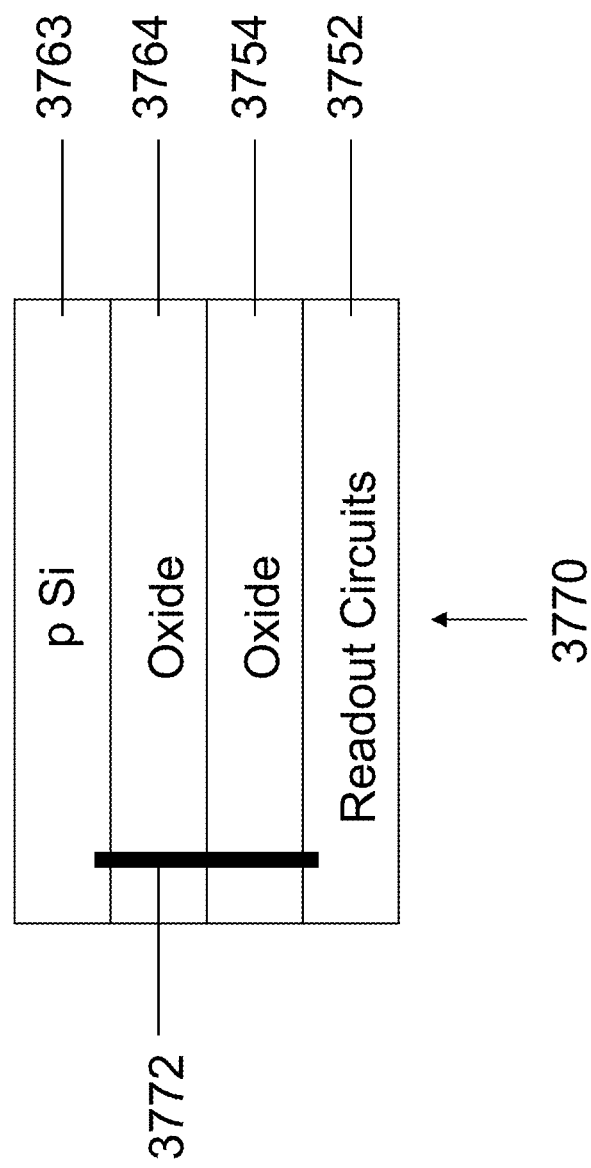

Step (C) is illustrated in FIG. 11E. The Si wafer 3760 may be layer transferred atop the silicon wafer with readout circuit layer 3750 to form the structure 3770, wherein oxide layer 3754 may be bonded to oxide layer 3764, and the p-Si layer 3763 may be a result of the cleave and polish operations. Alignments are made to the terminals of the p-Si layer 3763 and readout circuit layer 3752 to form the connection 3772 between the two layers.

As described previously, FIG. 3A-3G illustrate a process where oxide vias constructed before layer transfer may be used to look through one optical modulator layers to observe alignment marks on the other optical modulator wafer below it. However, an alternative embodiment of this invention may involve constructing oxide vias after layer transfer. Essentially, after layer transfer of structures without oxide vias, oxide vias whose diameters are larger than the maximum misalignment of the bonding/alignment scheme may be formed. This order of sequences may enable observation of alignment marks on the bottom control circuit wafer by looking through the optical modulator wafer.

Various elements of FIG. 11E such as 3752, 3754, and 3764 have been described previously.

Figure 11F:
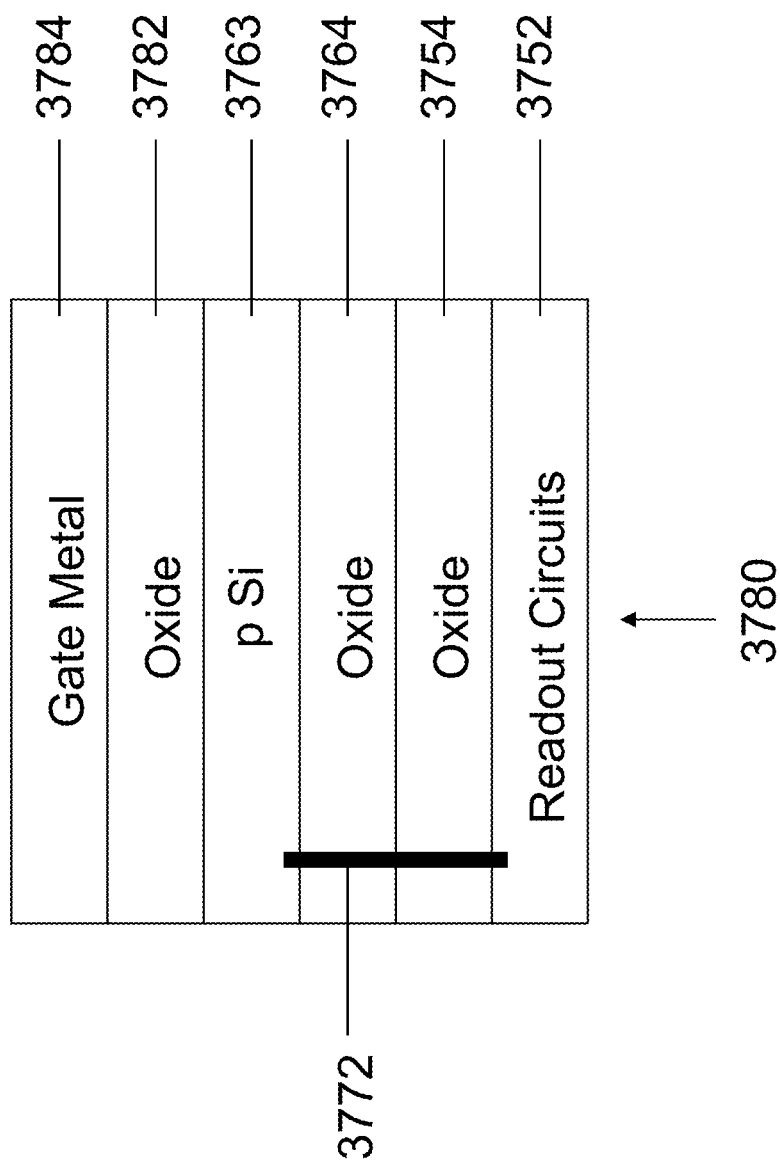

Step (D) is illustrated in FIG. 11F, where an oxide layer 3782 is grown on top of the previous stack 3770 to act as a gate dielectric, and gate metal layer 3784 is deposited by using a lithographic mask on the oxide layer 3782 to form the MOS gates of the CCD cells. Thus stacked CCD with underlying readout circuits 3780 may be formed. Various elements of FIG. 11F such as 3752, 3754, 3763, 3764, and 3772 have been described previously.

Persons of ordinary skill in the art will appreciate that while Silicon has been suggested as the material for the CCD substrate layers of FIG. 11D, any other appropriate semiconductor material like Ge, InGaAsP could be utilized. The doping of such material may also vary from p-type to n-type depending on whether the charges to be collected are electrons or holes respectively. Moreover, additional implants and structural modifications may be performed to optimize the charge collection within the substrate. Thus the invention is to be limited only by the appended claims.

Stacked High Dynamic Range (HDR) Sensor:

In digital cameras, the typical approach is to capture images using exposure bracketing, and then combining them into a single HDR image. The issue with this is that multiple exposures are performed over some period of time, and if there is movement of the camera or target during the time of the exposures, the final HDR image will reflect this by loss of sharpness. Moreover, multiple images may lead to large data in storage devices. Other methods may use software algorithms to extract HDR information from a single exposure, but as they can only process information that is recordable by the sensor, there is a permanent loss of some details.

A solution may be to use image sensors that have HDR capability. A single layer of photo-detectors within the image sensor is hard-pressed to achieve this. In the case where the light-collecting area is small, the photo-detector is capable of detecting minute amounts of photocurrent but may saturate quicker, whereas when the light-collecting area is large, the photo-detector is capable of handling large amounts of light, but may not be able to detect small photocurrents. Combining them by stacking allows a photo-detector cell to have the capability to detect both low and high luminosity without saturating.

Figure 12A:
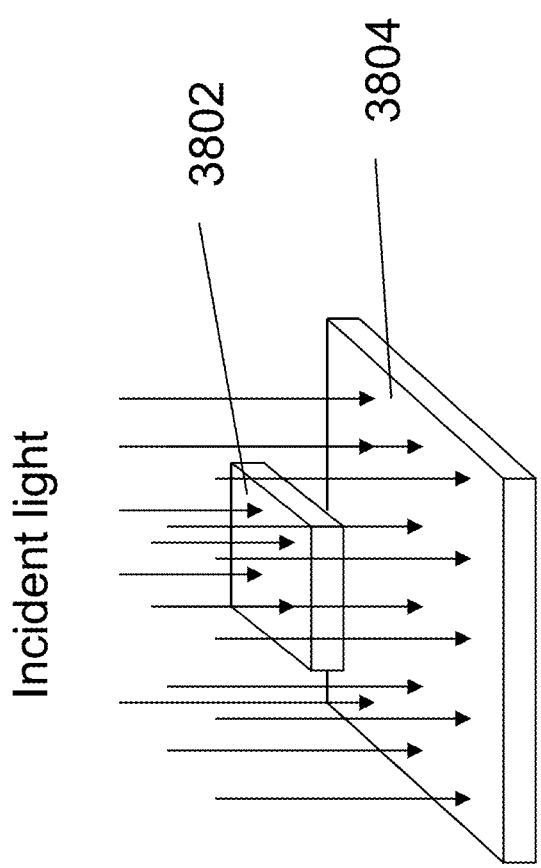
FIG. 12A-12D illustrate an embodiment of this invention where an image sensor with three layers is monolithically stacked, the first layer with photo-detectors of smaller light-sensitive region, the second layer with photo-detectors of larger light-sensitive region, and the third layer with readout circuits to collect sensor data.

FIG. 12A illustrates the of stacking smaller photo-detector 3802 which collects less light and is more sensitive than larger photo-detector 3804, on top of the larger photo-detector 3804 which collects more light and is less prone to saturation than the smaller photo-detector 3802.

Figure 12B:
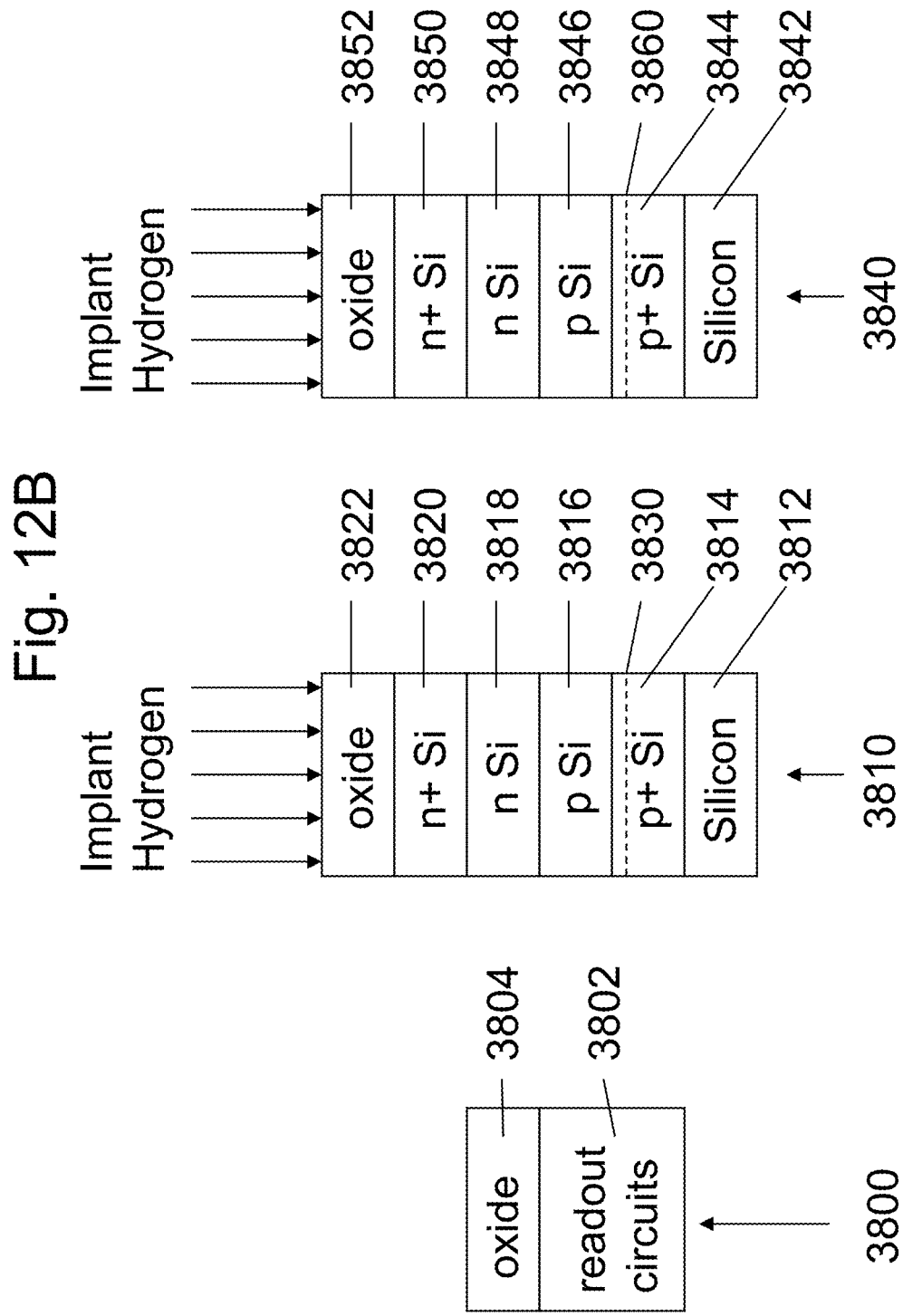
Figure 12C:
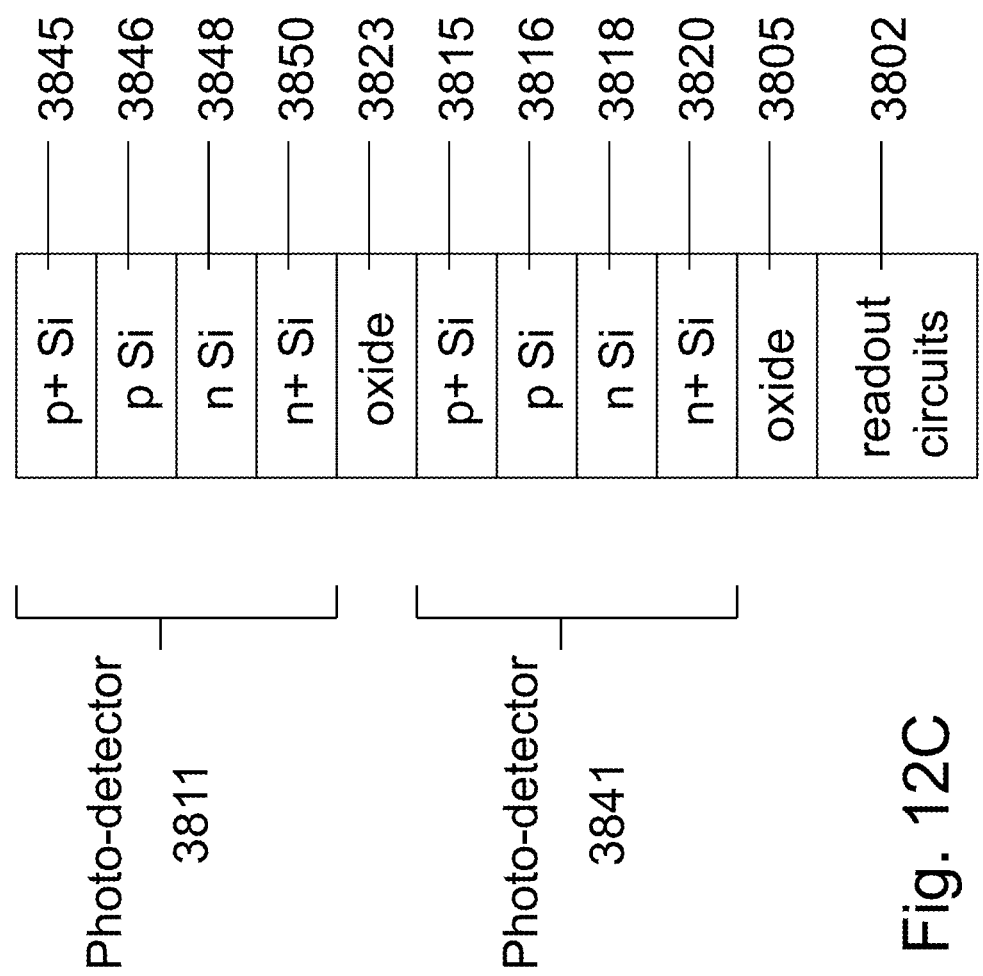
Figure 12D:
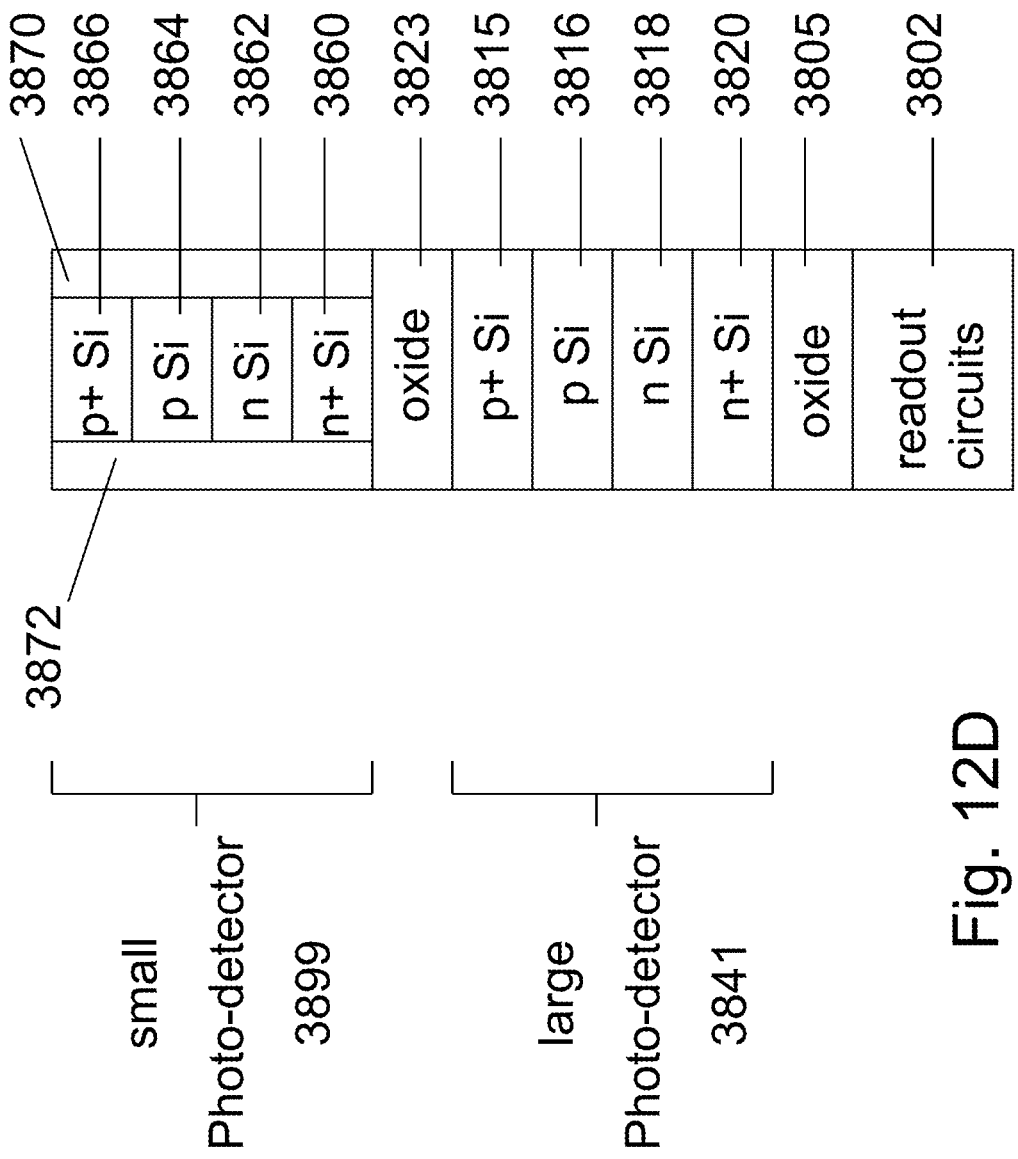

FIG. 12B-12D illustrate an embodiment of the invention, where layer transfer technology may be utilized for constructing the layers for an HDR image sensor with underlying readout circuits. The process of forming the HDR image sensor may include several steps that may occur in a sequence from Step A to Step C.

Step (A): FIG. 12B illustrates the first step for constructing this image sensor. Read out silicon wafer 3800 may include read-out circuits 3802 constructed on it, above which an oxide layer 3804 may be deposited. Silicon wafer structure 3810 may include substrate 3812, p+ Silicon layer 3814, p Silicon layer 3816, n Silicon layer 3818, n+ Silicon layer 3820 and oxide layer 3822. These layers may be formed using procedures similar to those described in FIGS. 15A-G. An anneal may then performed to activate dopants in the layers. Hydrogen may be implanted in the wafer at a certain depth depicted by dashed line 3830. Another Silicon wafer structure 3840 may include substrate 3842, p+ Silicon layer 3844, a p Silicon layer 3846, n Silicon layer 3848, n+ Silicon layer 3850 and oxide layer 3852. These layers may be formed using procedures similar to those described in FIG. 3A-3G. An anneal may then be performed to activate dopants in various layers. Hydrogen may be implanted in the wafer at a certain depth depicted by dashed line 3860.

Step (B): FIG. 12C illustrates the structure of this embodiment of the invention before contacts and metallization are constructed. The p+pnn+ Silicon layers of Silicon wafer structure 3810 of FIG. 12B may be layer transferred atop the read-out circuit layer of read out silicon wafer 3800. This may be done using ion-cut layer transfer procedures similar to those described in respect to FIG. 3A-G. Following this, the p+pnn+ silicon layers of another Silicon wafer structure 3840 may be layer transferred atop the Read out silicon wafer 3800 and he p+pnn+ Silicon layers of Silicon wafer structure 3810. This may be done using procedures similar to those described in FIG. 3A-3G. The structure shown in FIG. 12C therefore has a layer of read-out circuits 3802, above which a top photo-detector 3811, and another photo-detector 3841 are present. Procedures for layer transfer and alignment for forming the image sensor in FIG. 12C are similar to procedures used for constructing the image sensor shown in FIG. 3A-3G. Oxide layers 3805 and 3823 may be the results of oxide-to-oxide bonding. p+ Si layers 3815 and 3845 may be results of the cleave and polish operations from the ion-cut layer transfer processes. Various elements of FIG. 12C such as 3802, 3816, 3818, 3820, 3846, 3848, and 3850 have been described previously.

Step (C): FIG. 12D illustrates the process performed on the top photo-detector 3811 to reduce its effective image sensor cell area. The edges of top photo-detector 3811 may be lithographically defined, etched, then filled with oxide, which is transparent to visible light. n+ Si layer 3860, n Si layer 3862, p Si layer 3864, p+ Si layer 3866, and oxide layers 3870 and 3872 may be results of this processing, thus forming small photo-detector 3899. Various elements of FIG. 12D such as 3802, 3805, 3815, 3816, 3818, 3820, and 3823 have been described previously. Contacts, metallization, packaging and other steps (not shown) as described elsewhere herein may done to the structure shown in FIG. 12D to form the HDR image sensor. The three mono-crystalline silicon layers, small photo-detector 3899, large photo-detector 3899, and read-out circuits 3802, may be electrically connected by conducting vias that may have a radius less than about 400 nm due to the thin layers being layer transferred. This may be accomplished with processing described herein and in US patent application 2011/0121366.

Persons of ordinary skill in the art will appreciate that while Silicon has been suggested as the material for the HDR photo-detector layers of FIG. 12D, any other appropriate semiconductor material like Ge, could be utilized. Moreover, additional implants and structural modifications may be performed to optimize the charge collection within the photo-detectors. Thus the invention is to be limited only by the appended claims.

Figure 13A:
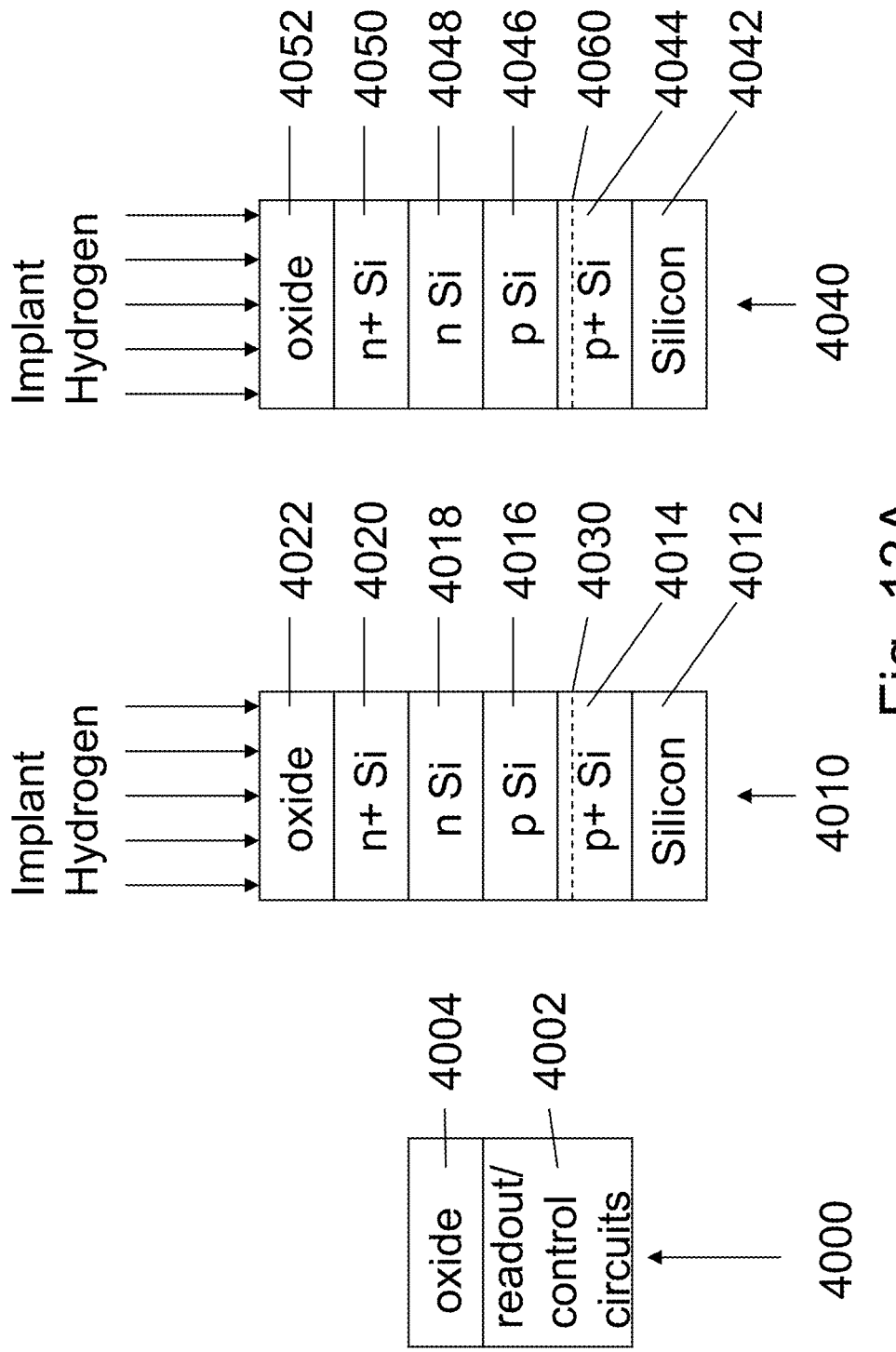
FIG. 13A-13C illustrate an embodiment of this invention, where two image sensor arrays are monolithically stacked on top of each other with an insulating layer between them using layer transfer processes.
Figure 13B:
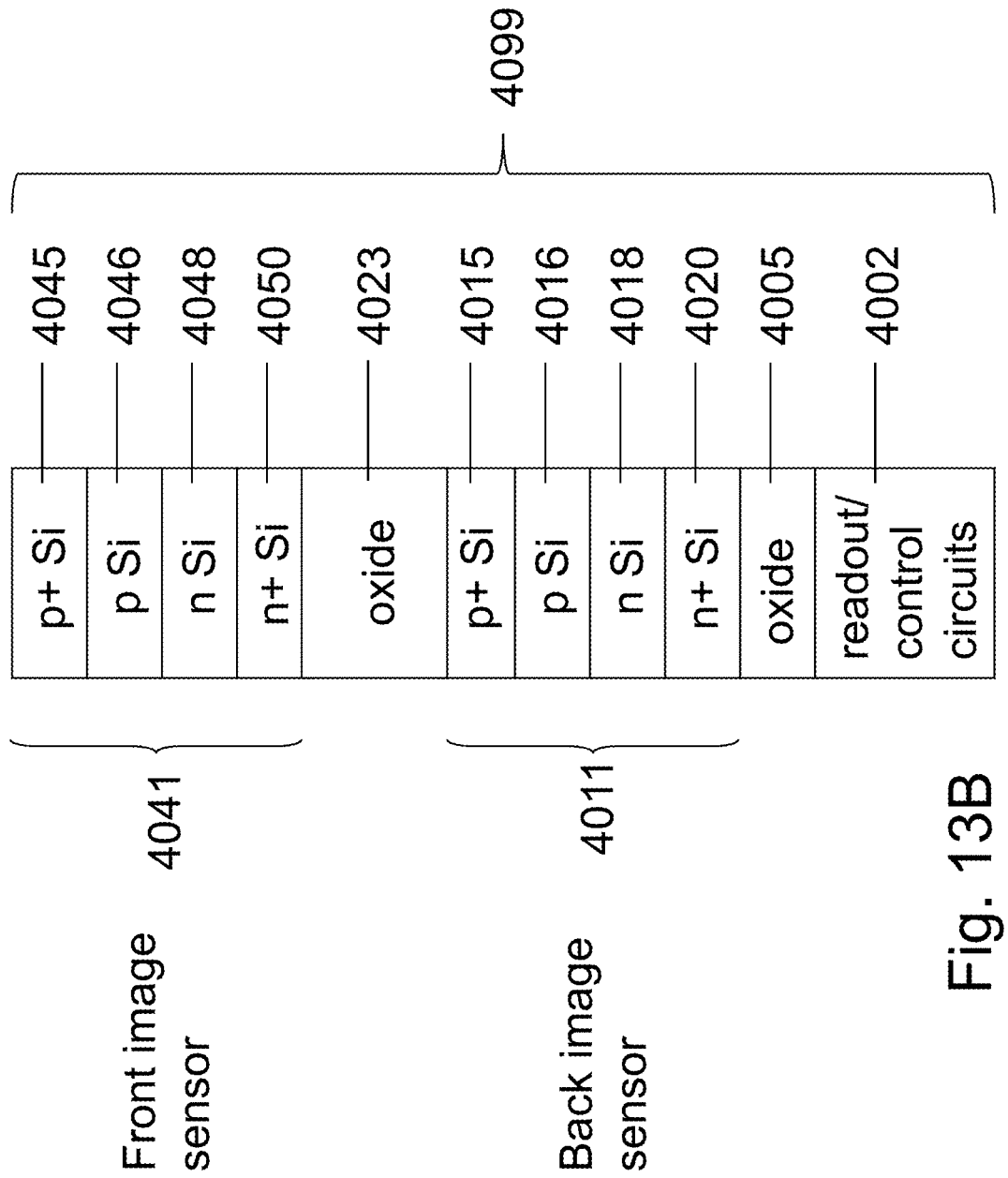

2-Sensor Camera System:

FIG. 13A-13B illustrate an embodiment of the invention, where layer transfer technology may be utilized for constructing the layers for an image sensor chip that may include two image sensor arrays in parallel planes to each other with an isolation layer between each of the two image sensor arrays, and between the two image sensor arrays and the underlying readout/control circuits. The process of forming the two-image sensor chip may include several steps that may occur in a sequence from Step A to Step B.

Step (A): FIG. 13A illustrates the first step for constructing the image sensor chip. Read-out circuit layer structure 4000 may include a mono-crystalline silicon wafer with readout/control circuits 4002 constructed on it, above which an oxide layer 4004 may be deposited.

Structure 4010 may include another mono-crystalline silicon wafer with substrate 4012, p+ Silicon layer 4014, p Silicon layer 4016, n Silicon layer 4018, n+ Silicon layer 4020 and oxide layer 4022. These layers may be formed using procedures similar to those described in FIG. 3A-3G. An anneal may be performed to activate dopants. Hydrogen may be implanted into p+ Silicon layer 4014 at a certain depth depicted by dashed line 4030. Layer structure 4040 may include another mono-crystalline silicon wafer with substrate 4042, p+ Silicon layer 4044, a p Silicon layer 4046, n Silicon layer 4048, n+ Silicon layer 4050 and oxide layer 4052. These layers may be formed using procedures similar to those described in FIG. 3A-3G. An anneal may be performed to activate dopants. Hydrogen may be implanted in p+ Silicon layer 4044 at a certain depth depicted by dashed line 4060.

Step (B): FIG. 13B illustrates the structure of the embodiment of the invention before contacts and metallization are constructed. The p+pnn+ Silicon layers of structure 4010 of FIG. 13B may be layer transferred atop the read-out circuit layer structure 4000. This may be done using smart layer transfer procedures similar to those described in respect to FIG. 3A-3G. Following this, the p+pnn+ silicon layers of layer structure 4040 may be layer transferred atop the read-out circuit layer structure 4000 layer and the p+pnn+ Silicon layers of structure 4010. This may be done using procedures similar to those described in FIGS. 15A-G. The structure shown in FIG. 13B therefore has a layer of read-out circuits 4002, above which a photo-detector back image sensor 4011, and another photo-detector front image sensor 4041 may be present. Procedures for layer transfer and alignment for forming the image sensor in FIG. 13B are similar to procedures used for constructing the image sensor shown in FIG. 3A-3G. Oxide layers 4005 and 4023 may be the results of oxide-to-oxide bonding and the ion-cut processing. In addition, oxide layer 4023 may form the isolation layer separating back image sensor 4011 and front image sensor 4041 and may require careful calibration of its thickness, which may range from about 10 micro-meters to about 400 micro-meters. The material for the isolation layer may be chosen such that it has a large enough bandgap that will let substantially all wavelengths of visible light through to the back image sensor 4011. p+ Si layers 4015 and 4045 may be results of the cleave and polish operations from the layer transfer processes. Various elements of FIG. 13C such as 4002, 4016, 4018, 4020, 4046, 4048, and 4050 have been described previously. Thus image sensor chip 4099 is formed. Back image sensor 4011 and front image sensor 4041 may each have thicknesses of less than about 2 microns, less than about 1 micron, less than about 400 nm and/or less than about 200 nm. Front image sensor 4041 may typically be thinner than back image sensor 4011. Base wafer substrate 4012 and substrate 4042 may be reused to create portions of another or additional image sensor chip.

Figure 13C:
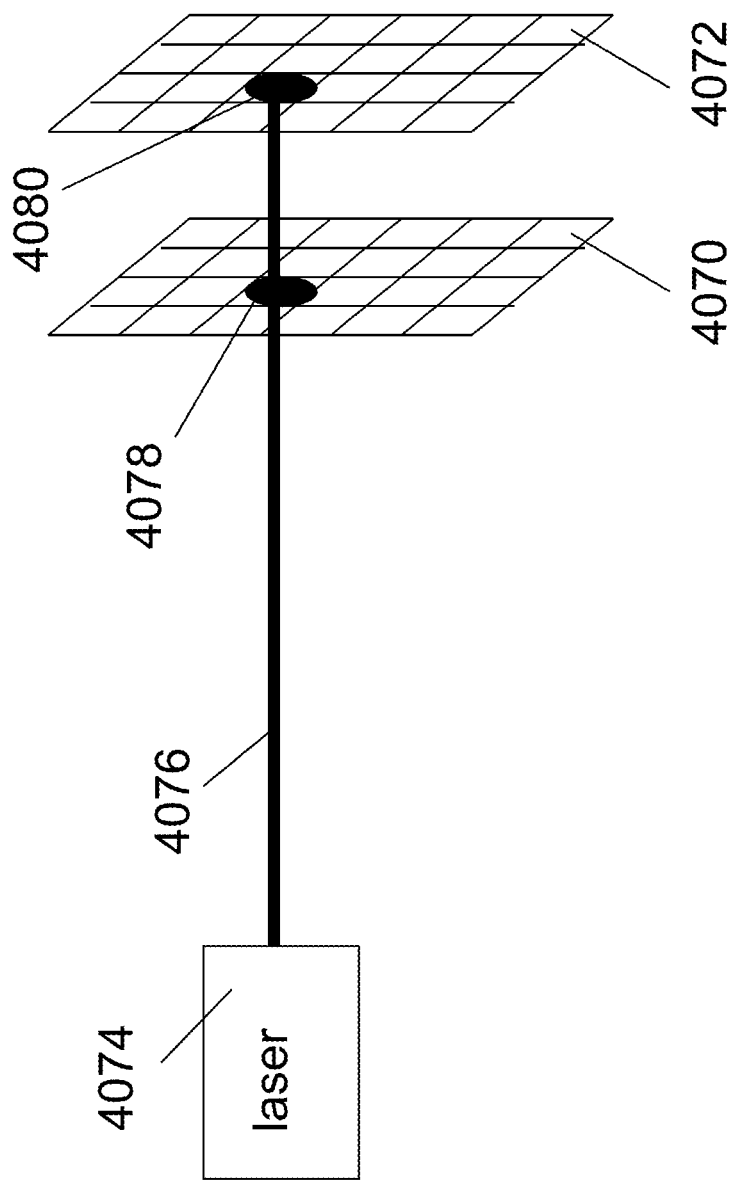

FIG. 13C illustrates a method by which pixel alignment between the two sensor arrays may be checked. A laser device 4074 projects a laser beam 4076 with a diameter smaller than the size of the pixel elements of front image sensor 4070 and back image sensor 4072. The laser beam 4076 may be of a wavelength that is detectable by that of the front image sensor 4070 and back image sensor 4072, and may be in a direction perpendicular to the two sensors. A particular photo-detector 4078 on front image sensor 4070 detects the laser beam 4076. As only part of the laser beam 4076 may be absorbed, the remainder will continue onto photo-detector 4080 on back image sensor 4072 which detects the attenuated laser beam 4076. If the location of photo-detector 4078 on front image sensor 4070 corresponds to the location of photo-detector 4080 on back image sensor 4072, they are determined to be in alignment. Otherwise, adjustments on one of the image sensors may be performed to achieve alignment. The process may be repeated for a sampling of more photo-detector sites throughout the image sensors 4070 and 4072 where the chosen sites may be near the edges of the front image sensor 4070 and back image sensor 4072, and may form the vertices of a triangle, square or other polygons as to ensure that alignment is guaranteed throughout front image sensor 4070 and back image sensor 4072. The alignment process may also be used to determine an accurate measure of the distance between the two sensors by timing the arrival of the laser light, which may be pulsed, onto each of the sensors.

Persons of ordinary skill in the art will appreciate that while Silicon has been suggested as the material for the photo-detector layers of FIG. 13A-13B, any other appropriate semiconductor material such as, for example, Ge, could be utilized. For example, materials with different bandgaps could be used for each of the image sensor arrays so as to have sensitivities to different optical spectra or optical spectrum. Furthermore, the geometric structure of the photo-detectors may also be altered independently so as to allow each one to have different optical intensity saturation levels. Moreover, additional implants and structural modifications may be performed to optimize the charge collection within the photo-detectors. Further, adjustments in the alignment of the photo-detectors may be performed virtually, as part of a software program and memory with offsets. Thus the invention is to be limited only by the appended claims.

FIG. 14A illustrates an embodiment of the invention, where an imaging system 4110 may include a lens 4112 with focal length f and aperture of size R, a front image sensor 4113 set at distance z2 from the lens 4112 on its image side (the location of which corresponds to the image focal plane of another plane 4117 at distance d2 from the lens 4112 on its real side), a back image sensor 4114 set at a distance z1 from the lens 4112 on its image side (the location of which corresponds to the image focal plane of another plane 4116 at distance d1 from the lens 4112 on its real side). The real workspace on the real side of the lens 4112 may be bounded by the plane 4116 and plane 4117 at distances d1 and d2 respectively from the lens 4112 on the real side. The images collected from front image sensor 4113 and back image sensor 4114 may be processed and stored by an integrated image processor and memory system 4106, which may be connected to the image sensor arrays front image sensor 4113 and back image sensor 4114. For example, a plane or slice 4111 of a scene in the workspace bounded by plane 4117 and plane 4116 may have a corresponding image focal plane 4115 on the image side of lens 4112, which may lie between front image sensor 4113 and back image sensor 4114. Front image sensor 4113 and back image sensor 4114 may be parallel with respect to each other. The term imaging system may also be referred to as a camera system, or an optical imaging system, herein.

For reconstructing images on planes on either side of the lens 4112, image mapping may be performed using algorithms from Fourier optics utilizing the Fourier transform, available through commercial packages such as the MATLAB Image Processing Toolbox. It will be useful to recall here the Lens-maker's equation which states that for an object on a plane at a distance o from a lens of focal length f where f<<o, the focal image plane of the object will lie at a distance i on the opposite side of the lens according to the equation: $1/o + 1/i = 1/f$.

For the image reconstruction algorithms discussed herein, the following notations will be used:
d:=distance from lens on real side
d0:=initial distance from lens on real side
z:=distance from lens on image side
s: =space step interval
f(s):=nonlinear step interval e.g. $f(s)=s^n$
t:=time
t0:=starting time
ts:=time step interval
S1(i,j):=matrix data of image detected on front image sensor 4113
S2(i,j):=matrix data of image detected on back image sensor 4114
O(i,j):=reconstructed image from S1 and S2
OS(i,j):=stored reconstructed data O(i,j)
S1(i,j,t):=stored matrix data of image detected on front image sensor 4113 at time t
S2(i,j,t):=stored matrix data of image detected on back image sensor 4114 at time t FIM(O, d, z):=forward image mapping (FIM) operation from an image O on the real side of the lens 4312 at distance d from lens 4312 to the image side of the lens 4312 at a distance z from lens 4312

BIM(O, d, z):=backward image mapping (BIM) operation from an image O on the image side of the lens 4312 at distance z from lens 4312 to the real side of the lens 4312 at a distance d from lens 4312

I1(i,j,d,z1):=FIM operation of object matrix upon S1(*ij*) at specified d, and z=z1

I2(i,j,d,z2):=FIM operation of object matrix upon S2(*ij*) at specified d, and z=z2

IS1(i,j):=stored I1 data

IS2(i,j):=stored I2 data

O1(i,j,d,z1):=BIM operation on S1(i,j) at specified d, z=z1

O2(i,j,d,z2):=BIM operation on S2(i,j) at specified d, and z=z2

Odiff(i,j):=O1(i,j,d,z)−O2(i,j,d,z) for every i, j

Odiff(i,j,k):=O1(i,j,d,z)−O2(i,j,d,z) for every i, j with k as the iteration variable if values are to be stored ABS[a]:=absolute value operation on a scalar a NORM[A]:=A matrix norm operation (for example, a 2-norm)

GET_SHARP[A]:=extract object within image data that exhibits the most contrast compared to its surroundings.

T:=error tolerance between the corresponding elements of 2 matrices

E:=error tolerance of any scalar comparison

FFT(M):=fast fourier transform operation on a matrix M

IFFT(M):=inverse fast fourier transform operation on a matrix M

OF(i,j):=O(i,j) in Fourier space

OF1(i,j):=O1(i,j) in Fourier space

OF2(i,j):=O2(i,j) in Fourier space

OFdiff(i,j):=OF1(i,j,d,z)−OF2(i,j,d,z) for every i, j

Figure 14B:
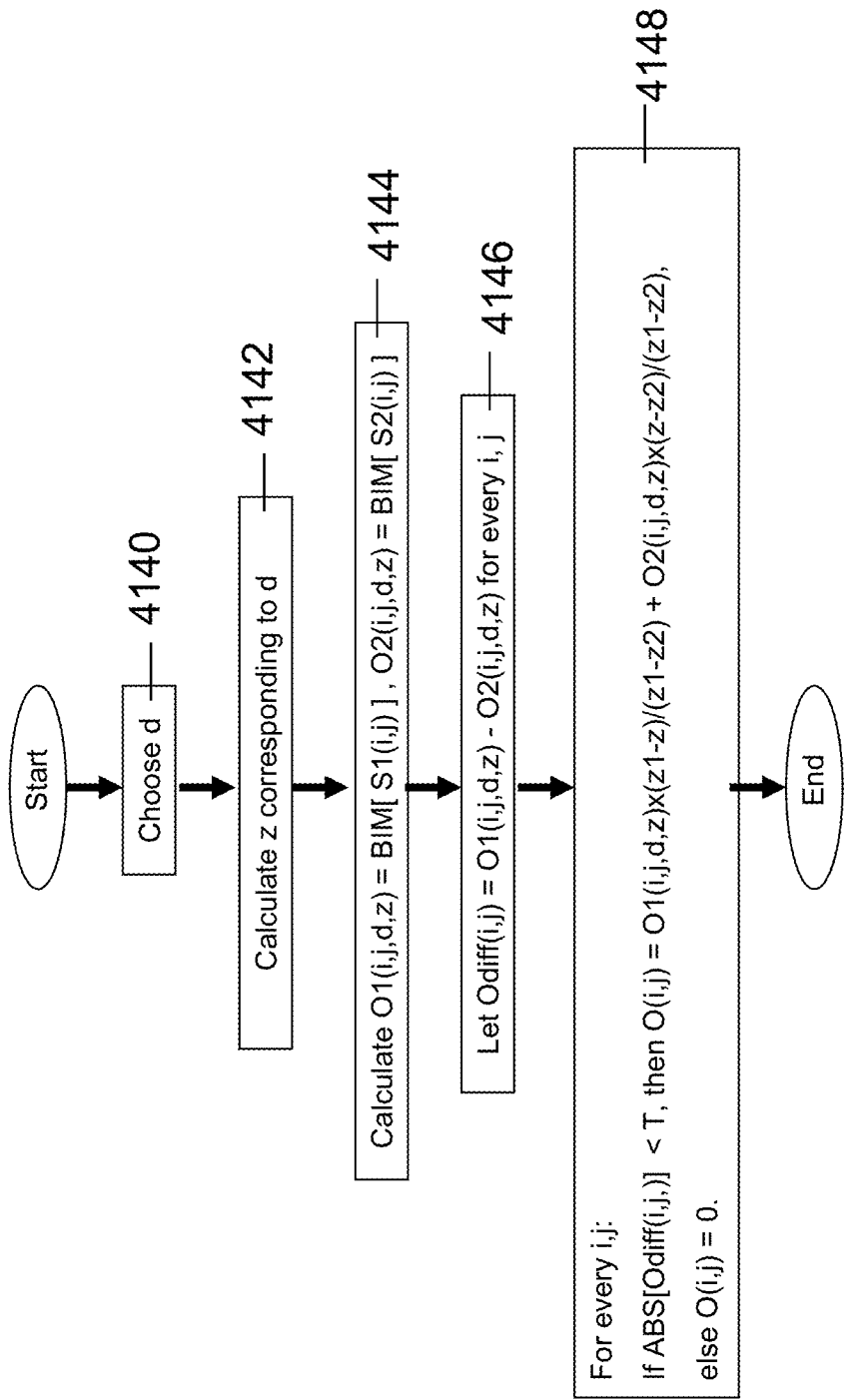

FIG. 14B illustrates an algorithm by which a plane of distance d from the lens 4112 is chosen by the viewer and the image on that plane may be reconstructed and is outlined here as Algorithm 41A:

Step A (4140): choose d≫f, d1<=d<=d2

Step B (4142): calculate z from d using the lens-maker's formula

Step C (4144): O1 and O2 are calculated by BIM operations on S1 and S2 respectively Step D (4146): Calculate Odiff:=O1−O2 for every element in the matrices O1 and O2

Step E (4148): Calculate the linear distance weighted estimate of the reconstructed object O(i,j) as expressed by:

For every i,j:

(*F*) If ABS[Odiff(*i,j*)]<*T*, then $$O(i,j)=O1(i,j,d,z)\times(z1-z)/(z1-z2)+O2(i,j,d,z)\times(z-z2)/(z1-z2),$$

(*G*) else $O(i,j)=0$.

Figure 14C:
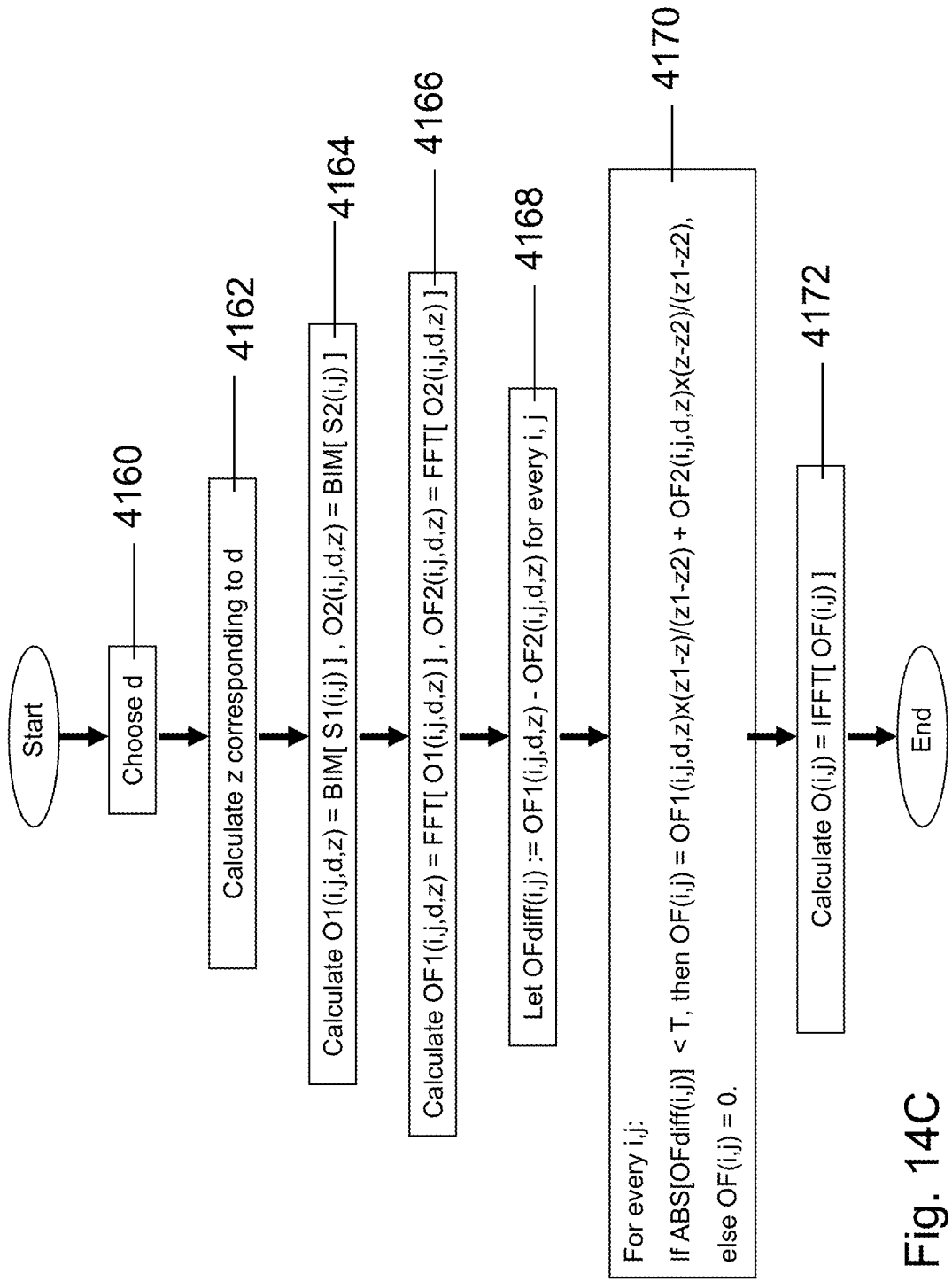

FIG. 14C illustrates another algorithm by which a plane of distance d from the lens 4112 is chosen by the viewer and the image on that plane may be transformed in Fourier space, reconstructed, then transformed back in real space, and is outlined here as Algorithm 41B:

Step A (4160): choose d≫f, d1<=d<=d2

Step B (4162): calculate z from d using the lens-maker's formula

Step C (4164): O1 and O2 are calculated by BIM operations on S1 and S2 respectively Step D (4166): OF1 and OF2 are calculated by FFT operations on O1 and O2 respectively Step E (4168): OFdiff:=OF1−OF2 is calculated for every element in the matrices OF1 and OF2

Step F (4170): Calculate the linear distance weighted estimate of the reconstructed object OF(i,j) in Fourier space as expressed by:

For every i,j:

(*H*) If ABS[OFdiff(*i,j*)]<*T*, then $$OF(i,j)=OF1(i,j,d,z)\times(z1-z)/(z1-z2)+OF2(i,j,d,z)\times(z-z2)/(z1-z2),$$

(*I*) else $OF(i,j)=0$.

Step G (4172): O(i,j) is extracted in real space by performing the IFFT operation on OF(i,j)

Figure 14D:
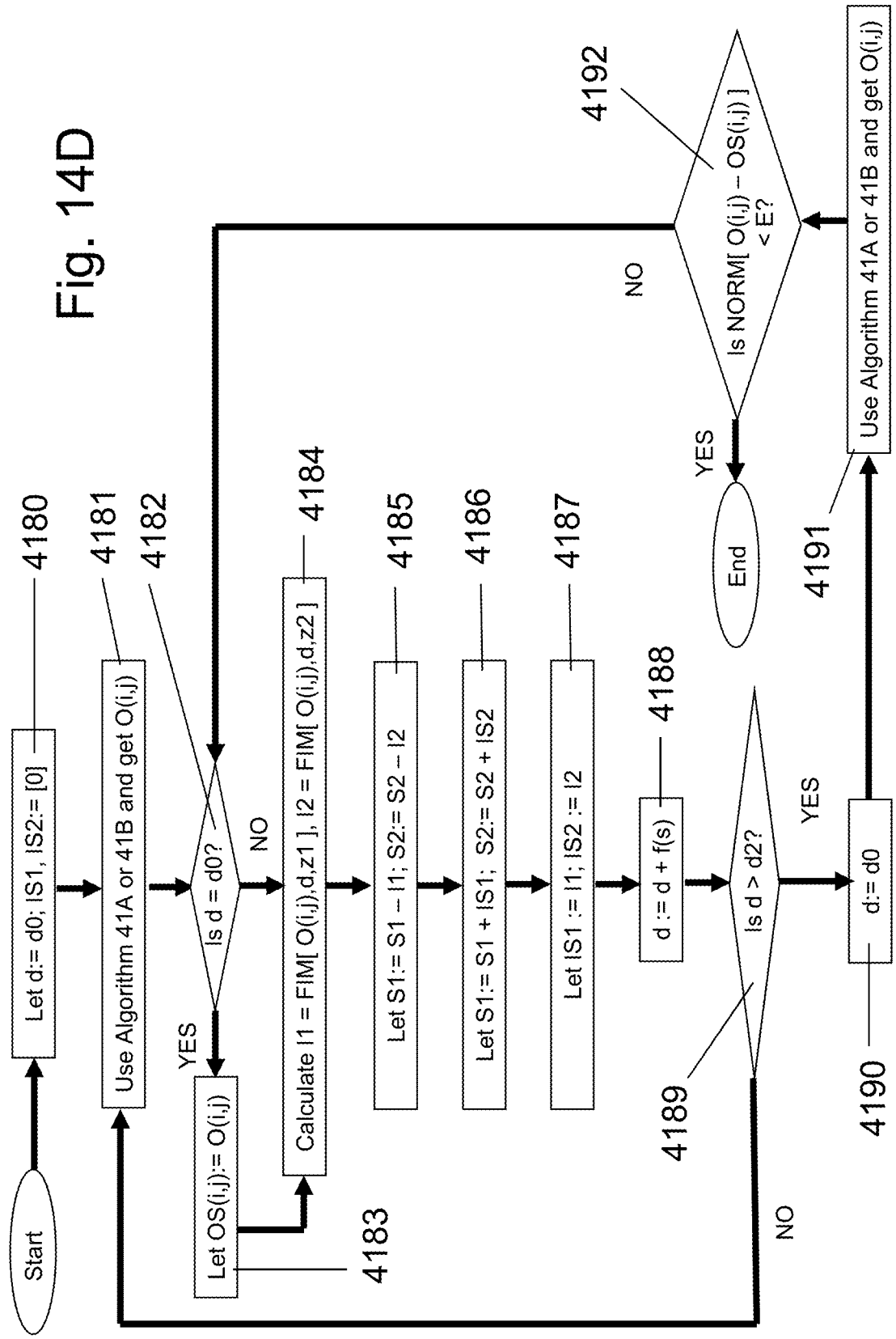

FIG. 14D illustrates an iterative algorithm by which the workspace may be reconstructed using planes at intervals of the distance d from the lens 4112 between d1 and d2. A stepping algorithm may be performed wherein d marches from d1 towards d2 which may use nonlinear intervals such as a geometric relationship. Upon completion, the cycle may be repeated and the reconstructed image of a plane at a particular d is compared to the image of the same plane from the previous cycle. If the difference between these two images is within some error tolerance, then the set of images from that particular cycle may be accepted as the reconstruction of the workspace. Otherwise, the cycle may continue through another iteration. The algorithm is outlined here as Algorithm 41C:

Step A (4180): Start with d=d0, d1<=d0<=d2, initialize IS1, IS2 as zero matrices Step B (4181): Use Algorithm 41A or Algorithm 41B to calculate O(i,j)

Step C (4182): Check if d=d0, if yes go to Step D otherwise continue to Step E Step D (4183): Store O(i,j) into OS(i,j)

Step E (4184): Calculate I1 and I2 by FIM operations on O(i,j)

Step F (4185): Take I1 and I2 out from sensor data S1 and S2 respectively.

Step G (4186): Add stored data IS1 and IS2 (I1 and I2 from previous step) to sensor data S1 and S2 respectively.

Step H (4187): Store current I1 and I2 into IS1 and IS2 respectively.

Step I (4188): Increment d by some interval function such as a geometric relationship.

Step J (4189): If d has not exceeded d2, loop back to Step B (4181) and continue from there Step K (4190): If d has exceeded d2, reset d=d0

Step L (4191): Use Algorithm 41A or Algorithm 41B to calculate O(i,j)

Step M (4192): Compare O(i,j) with OS(i,j) using a matrix norm operation, and if within error tolerance, algorithm ends. Else algorithm loops back to Step C (4182) and continues on.

FIG. 15A illustrates an embodiment of the invention, where an imaging system 4210 may include a lens 4212 with focal length f and aperture of size R, a front image sensor 4213 set at distance z2 from the lens 4212 on its image side (the location of which corresponds to the image focal plane of another plane 4217 at distance d2 from the lens 4212 on its real side), a back image sensor 4214 set at distance z1 from the lens 4212 on its image side (the location of which corresponds to the image focal plane of another plane 4216 at distance d1 from the lens 4212 on its real side). The real workspace on the real side of the lens 4212 may be bounded by plane 4216 and plane 4217 at distances d1 and d2 respectively from the lens 4212 on the real side. A distinct object 4211 lies on a plane at an unknown distance d from the lens 4212, and assuming a general situation where d is neither equal to d1 nor d2, the images of the object 4211 on front image sensor 4213 and back image sensor 4214 will not be in sharp focus (blurred), and the object's image focal plane 4215 will lie between the sensor planes, front image sensor 4213 and back image sensor 4214. The images may be processed and stored by an integrated image processor and memory system 4206 connected to the image sensor arrays front image sensor 4213 and back image sensor 4214. Front image sensor 4213 and back image sensor 4214 may be parallel with respect to each other.

Figure 15B:
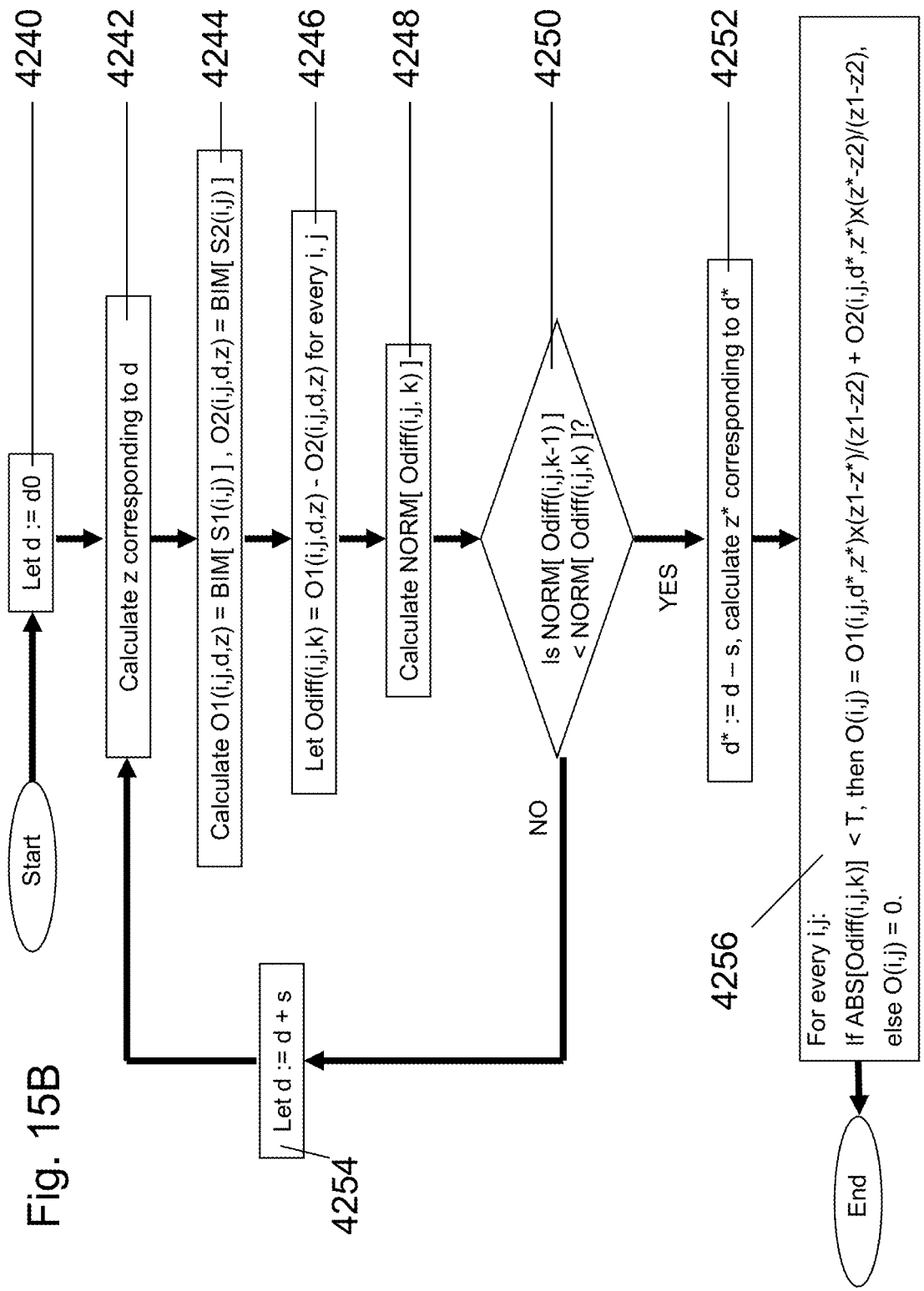

FIG. 15B illustrates an algorithm by which a single distinct object of unknown distance d from the lens 4212 is present and its image may be reconstructed. Determination of distance d of the object 4211 may be achieved through a marching algorithm searching for the minimum of $Odiff(i,j)$ indicating best match, and is outlined here as Algorithm 42A:

Step A (4240): starting d=d0 is chosen, d1<=d0<=d2

Step B (4242): calculate z from d using the lens-maker's formula

Step C (4244): O1 and O2 are calculated by BIM operations on S1 and S2 respectively Step D (4246): Odiff:=O1-O2 is calculated for every element in the matrices O1 and O2

Step E (4248): NORM operation is performed on Odiff

Step F (4250): If the result of the NORM operation reveals a minimum, then

Step G (4252): d* is found and z* is calculated, else

Step H (4254): d is incremented by s and the steps B-F are repeated.

Step I (4256): Calculate the linear distance weighted estimate of the reconstructed object $O(i,j)$ as expressed by:
For every i,j:

(J) If $ABS[Odiff(i,j)]<T$, then $$O(i,j)=O1(i,j,d,z)\times(z1-z)/(z1-z2)+O2(i,j,d,z)\times(z-z2)/(z1-z2),$$

(K) else $O(i,j)=0$.

Figure 15C:
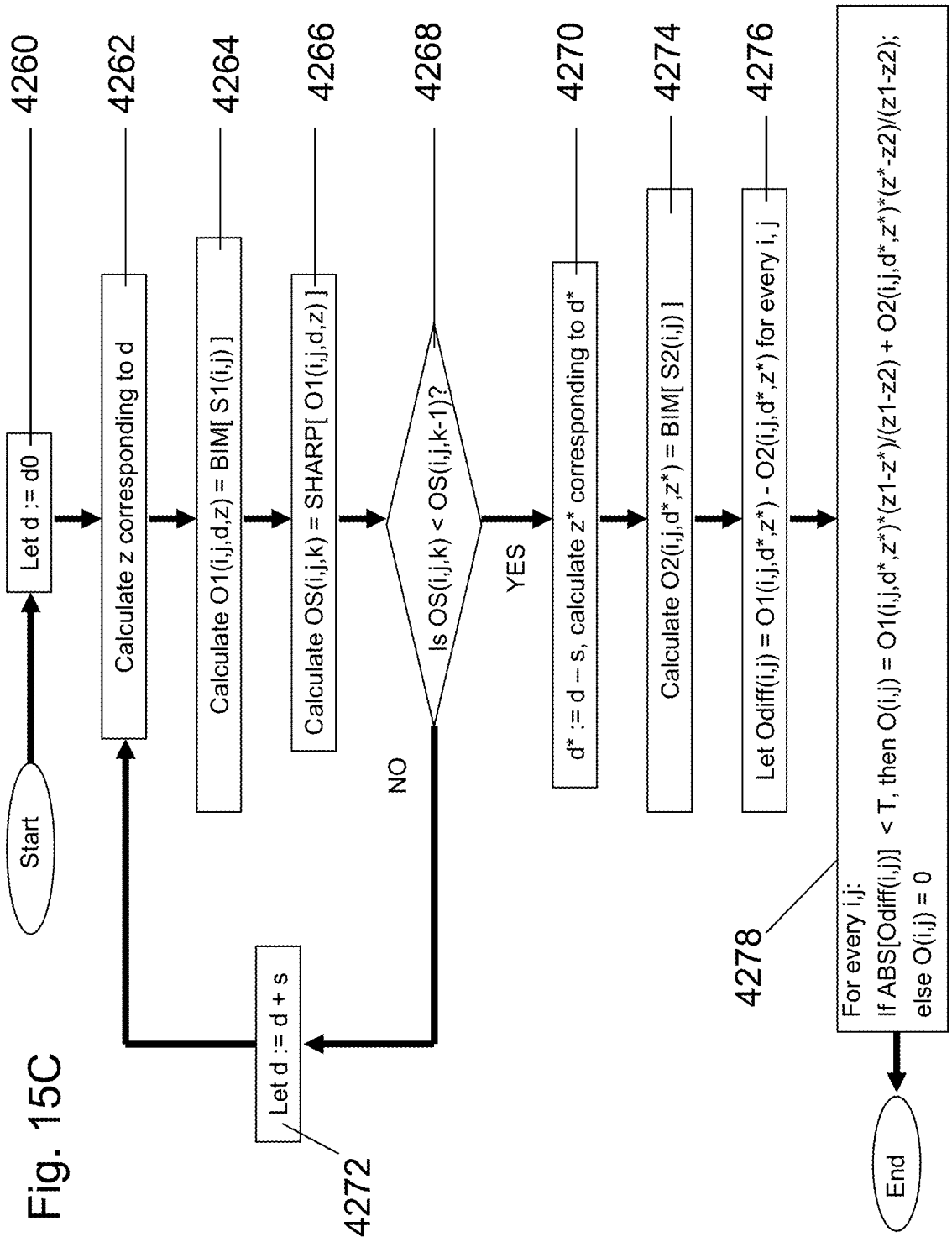

FIG. 15C illustrates another algorithm by which a single distinct object of unknown distance d from the lens 4212 is present and its image may be reconstructed. Determination of distance d of the object 4211 may be achieved through a marching algorithm searching for the maximum sharpness of $O1(i,j)$ indicating best match. Sharpness may be calculated by any of known methods such as contrast and high-frequency content calculations. The algorithm is outlined here as Algorithm 42B:

Step A (4260): starting d=d0 is chosen, d1<=d0<=d2

Step B (4262): calculate z from d using the lens-maker's formula

Step C (4264): O1 is calculated by BIM operation on S1

Step D (4266): Sharpness value of O1 is calculated and stored in OS

Step E (4268): If a sharpness maximum is found, then

Step F (4270): d* is determined and z* is calculated else

Step G (4272): d is incremented by s and steps B-E are repeated.

Step H (4274): O2 is calculated using BIM operation on S2 with d* and z*

Step I (4276): Odiff:=O1-O2 is calculated for every element in the matrices O1 and O2

Step J (4278): Calculate the linear distance weighted estimate of the reconstructed object $O(i,j)$ as expressed by:
For every i,j:

(L) If $ABS[Odiff(i,j)]<T$, then $$O(i,j)=O1(ij,d,z)\times(z1-z)/(z1-z2)+O2(ij,d,z)\times(z-z2)/(z1-z2),$$

(M) else $O(i,j)=0$.

Figure 16A:
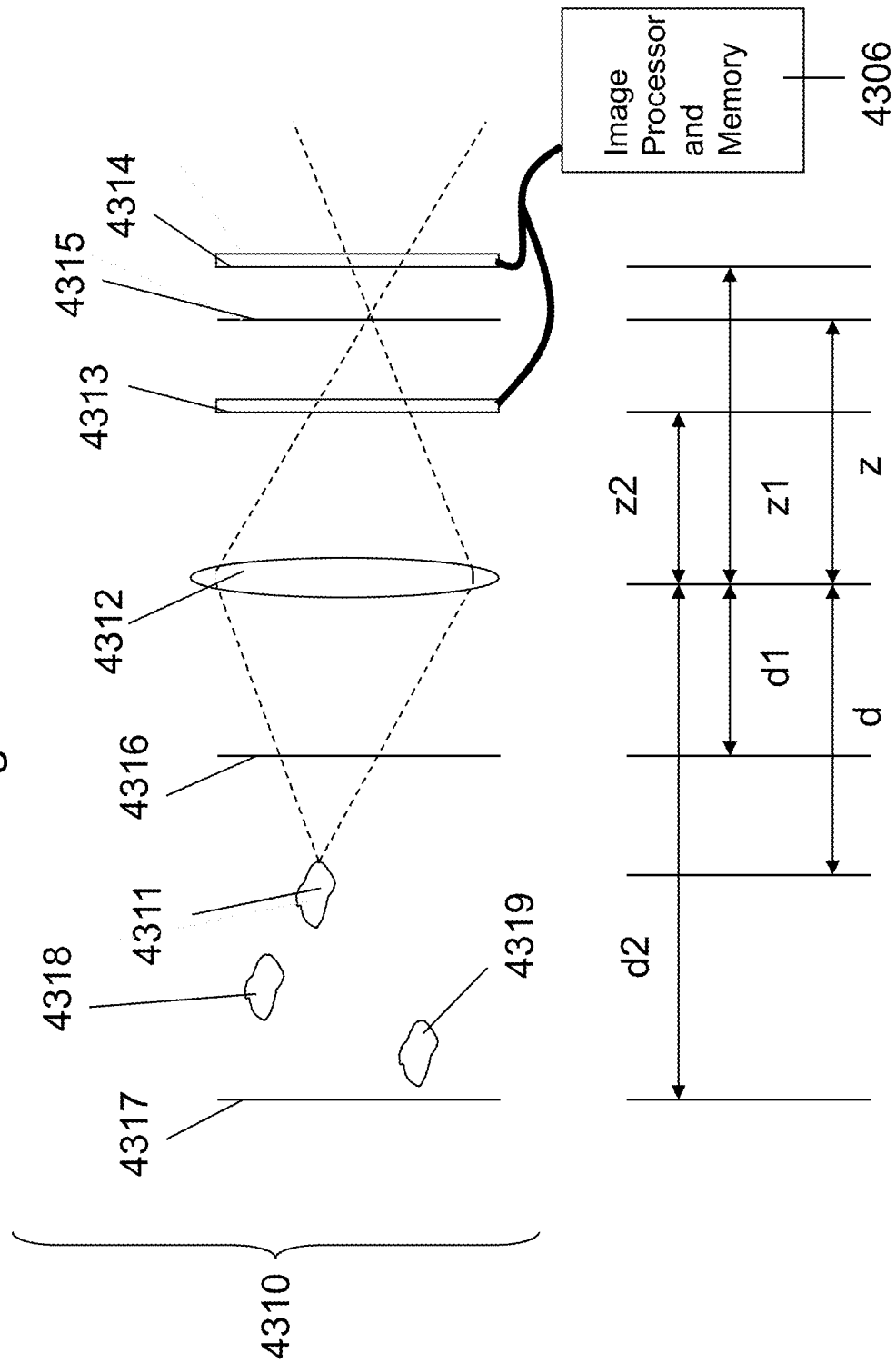
FIG. 16A-16B illustrate an embodiment of this invention, where an algorithm is described to reconstruct multiple objects of unknown distances from the lens imaged by a camera system that includes a lens and two image sensor arrays parallel to each other and to the lens, wherein each sensor array is of distinct distance from the lens.

FIG. 16A illustrates an embodiment of the invention, where an imaging system 4310 may include a lens 4312 with focal length f and aperture of size R, a front image sensor 4313 set at distance z2 from the lens 4312 on its image side (the location of which corresponds to the image focal plane of another plane 4317 at distance d2 from the lens 4312 on its real side), a back image sensor 4314 set at distance z1 from the lens 4312 on its image side (the location of which corresponds to the image focal plane of another plane 4316 at distance d1 from the lens 4312 on its real side). The real workspace on the real side of the lens 4312 may be bounded by plane 4316 and plane 4317 at distances d1 and d2 respectively from the lens 4312 on the real side. Multiple distinct objects 4311, 4318, 4319 lie on a plane at unknown distances d, d4, d5 from the lens 4312. For example, distinct object 4311 in the workspace bounded by plane 4317 and plane 4316 may have a corresponding image focal plane 4315 on the image side of lens 4312, which may lie between front image sensor 4313 and back image sensor 4314. The images may be processed and stored by an integrated image processor and memory system 4306 connected to the image sensor arrays front image sensor 4313 and back image sensor 4314. Front image sensor 4313 and back image sensor 4314 may be parallel with respect to each other.

Figure 16B:
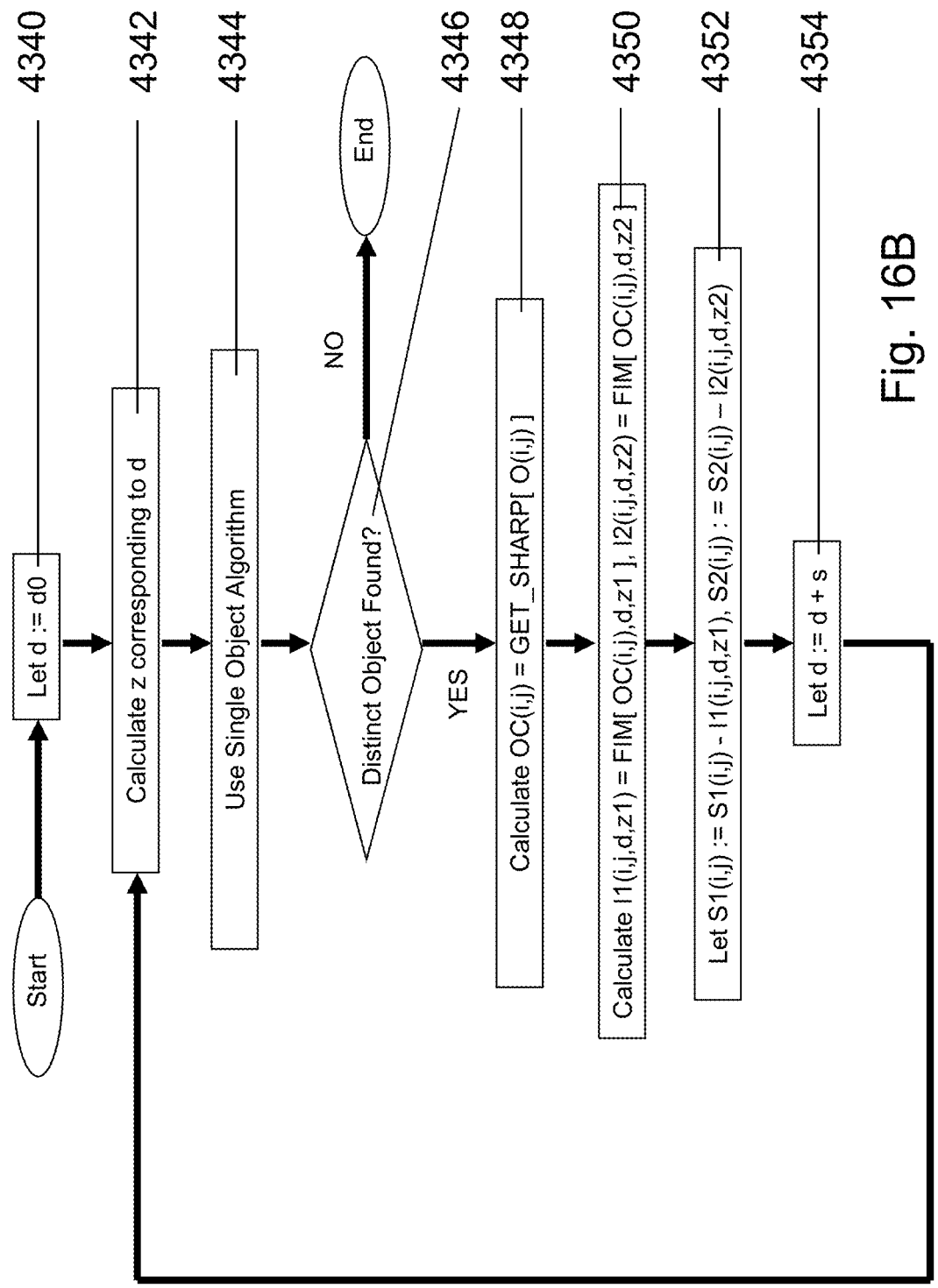

FIG. 16B illustrates an algorithm by which multiple distinct objects of unknown distances d, d4, d5 from the lens 4312 are present and their images may be successively reconstructed. Reconstruction of the objects may be achieved through a marching algorithm searching for each object from near to far from the lens in succession and performing an image subtraction operation after each object is found. The algorithm is outlined here as Algorithm 43A:

Step A (4340): starting d=d0 is chosen

Step B (4342): calculate z from d using the lens-maker's formula

Step C (4344): Use algorithms 41A, 42A or 42B to find nearest object.

Step D (4346): If no object is found, algorithm stops.

Step E (4348): If object is found, the GET SHARP operation is performed to extract image of only the object OC from O Step F (4350): I1 and I2 are calculated by FIM operations on OC upon front image sensor 4313 and back image sensor 4314 respectively: I1=FIM(OC, d, z1), I2=FIM(OC, d, z2)

Step G (4352): The sensor image data S1 and S2 are updated by subtracting I1 and I2 respectively.

Step H (4354): d is incremented to look for the next object.

Figure 17:
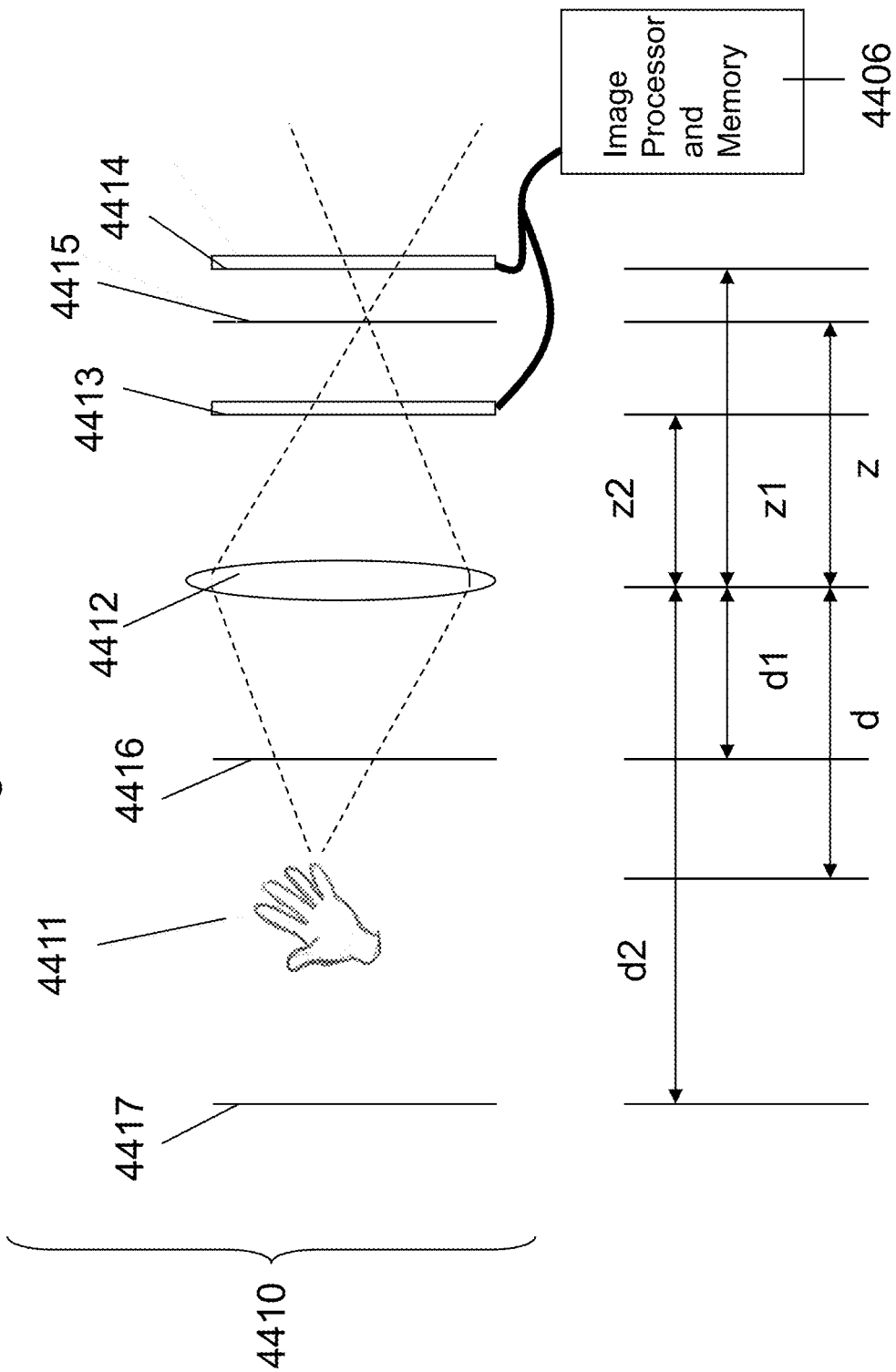
FIG. 17 illustrates an embodiment of this invention, where a remote control system uses hand gestures which are reconstructed by a camera system that includes a lens and two image sensor arrays parallel to each other and to the lens, where each sensor array is of distinct distance from the lens.

FIG. 17 illustrates an embodiment of the invention, where an imaging system 4410 may be set up as a gesture control system including a lens 4412 with focal length f and aperture of size R, a front image sensor 4413 set at distance z2 from the lens 4412 on its image side (the location of which corresponds to the image focal plane of another plane 4417 at distance d2 from the lens 4412 on its real side), a back image sensor 4414 set at distance z1 from the lens 4412 on its image side (the location of which corresponds to the image focal plane of another plane 4416 at distance d1 from the lens 4412 on its real side). The real workspace on the real side of the lens 4412 may be bounded by plane 4416 and plane 4417 at distances d1 and d2 respectively from the lens 4412 on the real side. An isolated hand 4411 or similar such object may be placed within the real workspace, and may be isolated from other objects within the real space by, for example, a technique using a glove over the hand with a specific color and using a filter gel over the lens with the same color as the glove. Isolated hand 4411 may have a corresponding image focal plane 4415 on the image side of lens 4412, which may lie between front image sensor 4413 and back image sensor 4414. At a fixed time t, isolated hand 4411 will then practically lie on the plane at some unknown distance d from the lens, and Algorithm 42A or Algorithm 42B may be used to reconstruct and image of the isolated hand 4411. An image recognition program may be used to recognize the gesture of the isolated hand 4411 at this point in time and a specific action that may be remote to the position of the isolated hand may be controlled accordingly. Time-stepping through multiple images of the isolated hand 4411 may allow a series of remote commands to be relayed or a combining of multiple gestures to relay a more complicated remote command. The images may be processed and stored by an integrated image processor and memory system 4406 connected to the image sensor arrays front image sensor 4413 and back image sensor 4414. Front image sensor 4413 and back image sensor 4414 may be parallel with respect to each other.

FIG. 18A illustrates an embodiment of the invention where a system similar to imaging system 4210 in FIG. 15A may be used in a surveillance camera system wherein by time-stepping through the image data recorded by the front image sensor 4213 and back image sensor 4214, static objects may be removed from the data and dynamic objects may be isolated and tracked. Algorithm 42A or Algorithm 42B may then be used at each time-step to reconstruct the image of the moving object. The desired time-step may typically be determined as the inverse of the frame rate of the camera recording. For example, Scene 1 4510 on front image sensor 4213 may show at time t=t0 static objects building 4512 and tree 4514. Scene 2 4520 on front image sensor 4213 shows at time t=t0+ts (the next time step ts after t0) static objects building 4512 and tree 4514, and new object, person 4516. The data S1 from the front image sensor 4213 that will be used for image reconstruction may then be updated by subtracting the difference between Scene 2 4520 and Scene 1 4510 to form differential scene 4530, thus removing static objects building 4512 and tree 4514, and leaving just dynamic object person 4516. Similar steps may be applied to back image sensor 4214.

Algorithm 42A or Algorithm 42B may then be applied to differential scene 4530 to reconstruct the image. If multiple dynamic objects are present in the scene, Algorithm 43A may be used to track and reconstruct the objects.

Figure 18B:
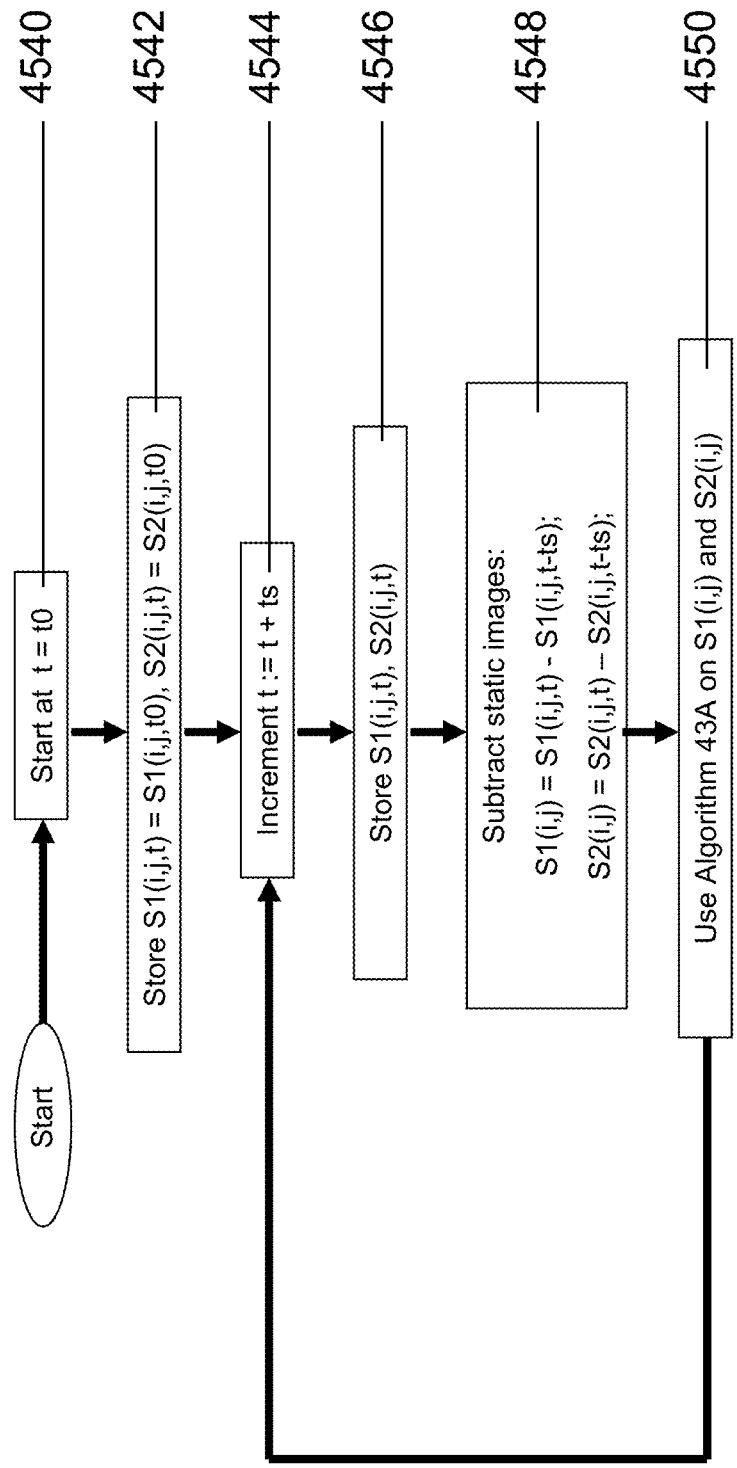

FIG. 18B illustrates an algorithm by which a surveillance camera system through time-stepping may track and reconstruct multiple distinct dynamic objects of unknown distances from the lens. The algorithm is outlined here as Algorithm 45A:

Step A (4540): Start at t=t0
Step B (4542): Store sensor data S1 and S2 at t=t0
Step C (4544): Increment time by time-step ts: t:=t+ts
Step D (4546): Store sensor data S1 and S2 at new time t
Step E (4548): Calculate differential sensor data by subtracting sensor data S1 and S2 of previous time-step from sensor data S1 and S2 of current time-step, eliminating images of static objects.
Step F (4550): Perform Algorithm 43A with differential sensor data as inputs S1 and S2
Step G: Go back to Step C (4544) and continue until desired.

FIG. 19A illustrates another embodiment of the invention where a system similar to imaging system 4210 in FIG. 15A may be achieved with the use of a beam-splitter to split the image between the two image sensors. The imaging system 4610 may include a lens 4612 with focal length f and aperture of size R, a beam-splitter 4618 whose center is of distance zb from lens 4612 on its image side, a perpendicular image sensor 4613 (perpendicular in relation to the lens 4612) set at distance z2* from the center of the beam-splitter 4618, and whose effective distance from the lens, z2=zb+z2*, corresponds to the image focal plane of another plane 4617 at distance d2 from the lens 4612 on its real side, a parallel image sensor 4614 (parallel in relation to the lens 4612) set at distance z1 from the lens 4612 on its image side which corresponds to the image focal plane of another plane 4616 at distance d1 from the lens 4612 on its real side. The real workspace on the real side of the lens 4612 may be bounded by plane 4616 and plane 4617 at distances d1 and d2 respectively from the lens 4612. The images may be processed and stored by an integrated image processor and memory system 4606 connected to the image sensor arrays perpendicular image sensor 4613 and parallel image sensor 4614.

Pixel alignment of the perpendicular image sensor 4613 and parallel image sensor 4614 may be achieved using the method described by FIG. 13C. Image reconstruction algorithms described in FIG. 14-18 are applicable to the imaging system described in FIG. 19A.

Figure 19B:
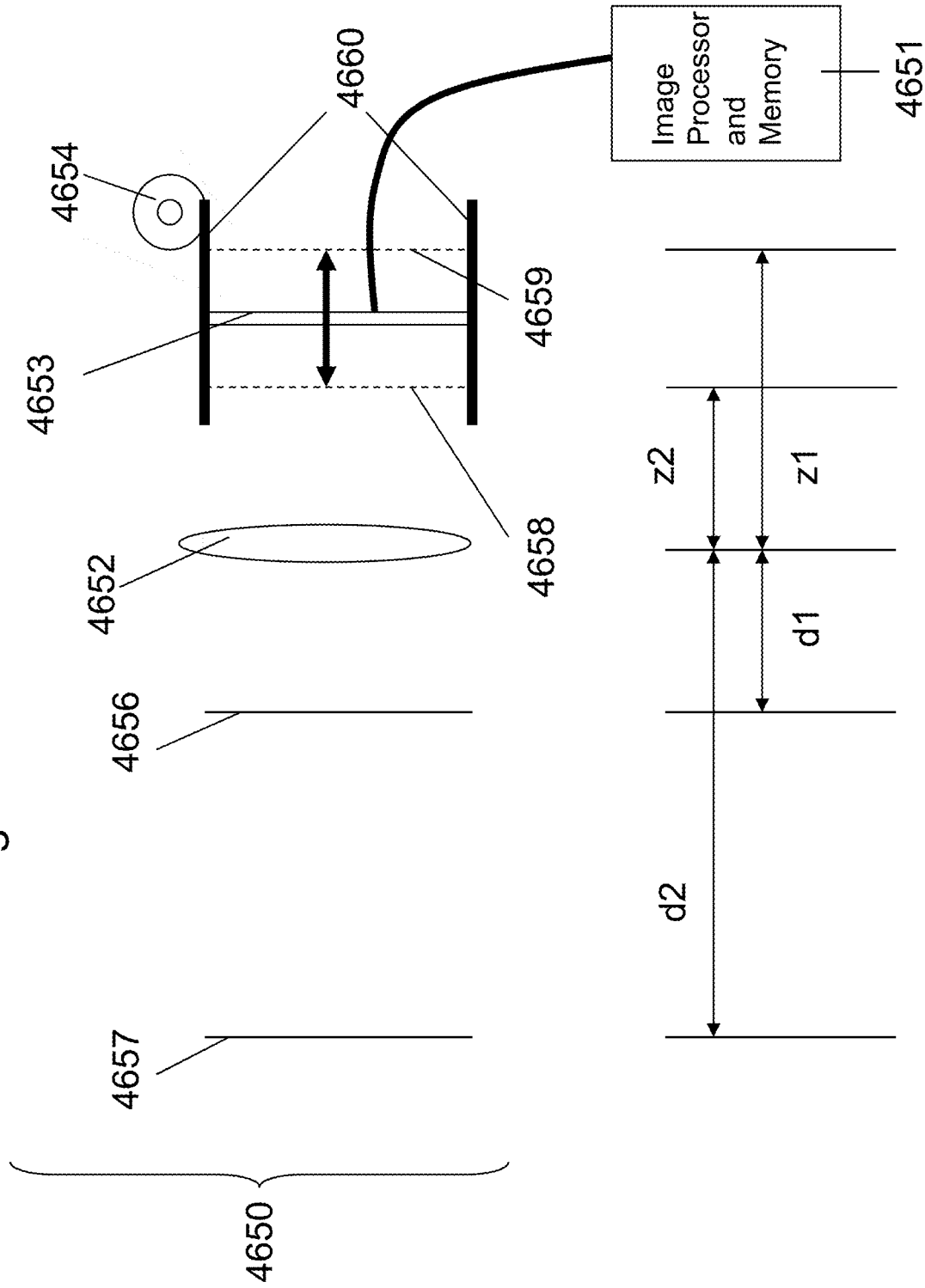
FIG. 19B illustrates an embodiment of this invention, where a camera system includes a lens, a fast motor and one image sensor array wherein images in front of the lens are detected by the image sensor while it is at two distinct positions relative to the lens within the time duration of interest. The image sensor is actuated back and forth with respect to the lens by the fast motor.

FIG. 19B illustrates another embodiment of this invention where a system similar to imaging system 4210 in FIG. 15A may be achieved with the use of a single image sensor that may be actuated back-and-forth from the lens by a fast motor. The single image sensor imaging system 4650 may include a lens 4652 with focal length f and aperture of size R, an image sensor 4653 parallel in relation to the lens 4612 set on rails 4660 on the image side of the lens 4652, and an actuation motor 4654 that drives the lens along the rails 4660 with respect to the lens 4652.

The image sensor 4653 may be actuated between two positions of distances z1 and z2 from the lens 4652. z1 is the location of image focal plane 4659 which corresponds to another plane 4656 at distance d1 from the lens 4652 on its real side, while z2 is the location of image focal plane 4658 which corresponds to another plane 4657 at distance d2 from the lens 4652 on its real side. The real workspace on the real side of the lens 4652 is bounded by plane 4656 and plane 4657 at distances d1 and d2 respectively from the lens 4652. The image sensor 4653 stores images of scenes within the real workspace when it is at locations z1 and z2 from the lens 4652. In this manner, it is behaving like two independent image sensors located at distances z1 and z2 from the lens 4652, similar to the imaging system 4110, and may have the advantage of not attenuating any of the light coming from the scene. The actuation motor 4654 may be a type of piezoelectric drive which typically has maximum linear speeds of 800,000 microns per second and precision of a few nanometers. For example, with a real workspace defined by the space from 1 to 10 meters from the lens of typical focal length about 5 mm, the distance between z1 and z2 with air in between will be about 22.5 microns, which allows the image sensor 4653 to move back and forth between the positions z1 and z2 at a rate of more than 15,000 times per second. Typically, this will be enough for a camera system to collect the two images where the frame rate is about 30 frames per second, even accounting for shutter speed and shutter delay. The collected images from image sensor array 4653 may be processed and stored by an integrated image processor and memory system 4151 connected to the image sensor array 4653.

Pixel alignment of the image sensor 4653 along the rails 4660 specifically at positions z1 and z2 may be achieved using the method described by FIG. 13C where in this case the location of the photo-detector that detects the laser beam is inspected at positions z1 and z2, and adjustments are made in the event of discrepancies. Image reconstruction algorithms described in FIG. 14-18 are applicable to the imaging system described in FIG. 19A.

Several material systems have been illustrated as examples for various embodiments of this invention in this patent application. It will be clear to one skilled in the art based on the present disclosure that various other material systems and configurations can also be used without violating the concepts described. It will also be appreciated by persons of ordinary skill in the art that the present invention is not limited to what has been particularly shown and described hereinabove. Rather, the scope of the invention includes both combinations and sub-combinations of the various features described herein above as well as modifications and variations which would occur to such skilled persons upon reading the foregoing description. Thus the invention is to be limited only by the appended claims.

We claim:

1. An integrated device, the device comprising:
a first level comprising a first mono-crystal layer, said first mono-crystal layer comprising a plurality of single crystal transistors and alignment marks;
an overlaying oxide on top of said first level;
a second level comprising a second mono-crystal layer, said second level overlaying said oxide,
wherein said second mono-crystal layer comprises a plurality of first image sensors; and
a third level overlaying said second level,
wherein said third level comprises a plurality of second image sensors,
wherein said second level is aligned to said alignment marks,
wherein said second level is bonded to said first level, and
wherein said bonded comprises an oxide to oxide bond.

2. The integrated device according to claim 1,
wherein said second mono-crystal layer is less than 5 microns thick.

3. The integrated device according to claim 1,
wherein said first level comprises a plurality of landing pads.

4. The integrated device according to claim 1,
wherein a portion of said plurality of single crystal transistors form a plurality of pixel control circuits.

5. The integrated device according to claim 1,
wherein at least one of said image sensors is directly connected to at least one of said single crystal transistors.

6. The integrated device according to claim 1,
wherein said first image sensor is sensitive to a first set of light wavelengths and said second image sensor is sensitive to a second set of light wavelengths, and
wherein said first set of light wavelengths is significantly different than said second set of light wavelengths.

7. The integrated device according to claim 1,
wherein said second level comprises an array of image sensor pixels,
wherein said first level comprises a plurality of pixel control circuits, and
wherein each of said image sensors pixels is directly connected to said pixel control circuits.

8. An integrated device, the device comprising:
a first level comprising a first mono-crystal layer, said first mono-crystal layer comprising a plurality of single crystal transistors and alignment marks;
an overlaying oxide on top of said first level;
a second level comprising a second mono-crystal layer, said second level overlaying said oxide,
wherein said second mono-crystal layer comprises a plurality of first image sensors; and
a third level overlaying said second level,
wherein said third level comprises a plurality of second image sensors, and
wherein said second level is bonded to said first level.

9. The integrated device according to claim 8,
wherein said second mono-crystal layer is less than 5 microns thick.

10. The integrated device according to claim 8,
wherein said first level comprises a plurality of landing pads.

11. The integrated device according to claim 8,
wherein a portion of said plurality of single crystal transistors form a plurality of pixel control circuits.

12. The integrated device according to claim 8,
wherein said bonded comprises oxide to oxide bonds.

13. The integrated device according to claim 8,
wherein said first image sensor is sensitive to a first set of light wavelengths,
wherein said second image sensor is sensitive to a second set of light wavelengths, and
wherein said set of first light wavelengths is significantly different than said set of second light wavelengths.

14. The integrated device according to claim 8,
wherein said second level comprises an array of image sensor pixels,
wherein said first level comprises a plurality of pixel control circuits, and
wherein each of said image sensor pixels is directly connected to said plurality of pixel control circuits.

15. An integrated device, the device comprising:
a first level comprising a first mono-crystal layer, said first mono-crystal layer comprising a plurality of single crystal transistors and alignment marks;
an overlaying oxide on top of said first level;
a second level comprising a second mono-crystal layer, said second level overlaying said oxide,
wherein said second mono-crystal layer comprises a plurality of first image sensors; and
a third level overlaying said second level,
wherein said third level comprises a plurality of second image sensors, and
wherein said second level is bonded to said first level.

16. An integrated device according to claim 15,
wherein said second level is aligned to said alignment marks, and wherein said aligned comprises a less than 1 micron alignment error.

17. The integrated device according to claim 15, wherein said first level comprises a plurality of landing pads.

18. The integrated device according to claim 15, wherein said single crystal transistors form a plurality of pixel control circuits.

19. The integrated device according to claim 15, wherein said bonded comprises oxide to oxide bonds.

20. The integrated device according to claim 15, wherein said first image sensor is sensitive to a first set of light wavelengths,
wherein said second image sensor is sensitive to a second set of light wavelengths, and
wherein said first set of light wavelengths is significantly different than said second set of light wavelengths.

* * * * *